United States Patent [19]

Mick et al.

[11] Patent Number: 5,751,638

[45] Date of Patent: May 12, 1998

[54] MAIL-BOX DESIGN FOR NON-BLOCKING COMMUNICATION ACROSS PORTS OF A MULTI-PORT DEVICE

[75] Inventors: John Mick, San Jose; Michael Miller, Saratoga; Jeff Smith, Gilroy; Mark Baumann, San Jose, all of Calif.

[73] Assignee: Integrated Device Technology, Inc., Santa Clara, Calif.

[21] Appl. No.: 786,401

[22] Filed: Jan. 17, 1997

[51] Int. Cl.$^6$ .................................................. G11C 13/00
[52] U.S. Cl. ........................... 365/189.04; 365/230.05
[58] Field of Search ........................ 365/189.01, 189.04, 365/189.03, 189.05, 230.05

[56] References Cited

U.S. PATENT DOCUMENTS

| | | |
|---|---|---|
| 4,435,765 | 3/1984 | Uchida et al. ............... 365/189.01 |
| 5,293,591 | 3/1994 | Dettmer . |
| 5,313,638 | 5/1994 | Ogle et al. . |
| 5,339,443 | 8/1994 | Lockwood . |
| 5,349,667 | 9/1994 | Kaneko . |
| 5,522,059 | 5/1996 | Marushima et al. . |

OTHER PUBLICATIONS

Article entitled: "QS75836 High–Speed CMOS 8K×36 Block–Allocated Shared–Port RAM with Flexi–Burst," *Quality Semiconductor, Inc.*, (MDSF–00011–08) pp. 1–18 (Jan. 9, 1996).

*Primary Examiner*—Terrell W. Fears
*Attorney, Agent, or Firm*—Majestic, Parsons, Siebert & Hsue

[57] ABSTRACT

A memory device (201) having left (203) and right (204) ports for communicating with left (205) and right (206) electronic devices, includes memory banks (401-0~401-7), semaphore logic (302), and port coupling circuitry (403, 404, 405-0~405-7, 406-0~406-7, 407-0~407-7). The semaphore logic generates bank access grant signals (313, 314) on a first received basis in response to bank access requests from the left and right electronic devices, and the port coupling circuitry couples selected memory banks to the left and right ports in response to the bank access grant signals. Also included in the memory device are mail-box registers (2500-0L~2500-3L, 2500-0R~2500-3R), interrupt generating circuitry (2514-0L~2514-3L, 2514-0R~2514-3R, 2900, 3000, 307, 308), and interrupt status and cause registers (3101L~3102L, 3101R~3102R, 3301L~3302L, 3301R~3302R). The left and right electronic devices use the mail-box registers to send messages to each other without waiting. The interrupt generating circuitry generates interrupts to notify the left and right electronic devices when their bank access requests have been granted, and when a message has been written into one of the mail-box registers for them. The interrupt status and cause registers provide information as to which memory banks the left and right electronic devices have been granted access to, and which mail-box registers contain messages for them.

20 Claims, 29 Drawing Sheets

100
MAIL-BOX DESIGN FOR NON-BLOCKING COMMUNICATION ACROSS PORTS OF A MULTI-PORT DEVICE

FIELD OF THE INVENTION

This invention relates in general to multi-port devices and in particular, to a mail-box structure for non-blocking communication across ports of a multi-port device.

BACKGROUND OF THE INVENTION

Memory devices are often shared by multiple electronic devices in a computer system to reduce the number and overall costs of system components, as well as facilitate communication between the resource sharing electronic devices. Arbiter circuits are generally included in such systems to prevent collisions between multiple electronic devices simultaneously attempting to access the memory device. If the memory device is a single-port memory device, only one resource sharing device can access the memory device at a time. Therefore, arbiter circuits in systems employing such single-port memory devices, arbitrate contention by allowing only a contention winning electronic device temporary, sole access to the entire memory device. For a dual-port memory device, on the other hand, two electronic devices can concurrently read access the same location and write access different locations of the memory device, thus providing nearly twice the bandwidth of a single-port device. Access is only restricted when the electronic devices simultaneously attempt to write access the same location. Therefore, arbiter circuits in systems employing such dual-port memory devices, arbitrate contention by allowing only a contention winning electronic device temporary sole write access to the simultaneously requested location.

FIG. 1 illustrates, as an example, a block diagram of a computer system 100 including a conventional dual-port static random-access memory (SRAM) 101 with selected characteristics simplistically depicted in bubble blow-ups, 110 and 112, for descriptive purposes, and left and right electronic devices, 105 and 106, respectively coupled to the dual-port SRAM 101 by left and right ports, 103 and 104. As simplistically depicted in bubble blow-up 110, one characteristic and significant drawback of the conventional dual-port SRAM 101 is the large size of its individual memory cells (e.g., 114), which may be as large as eight or six transistors, for example, to accommodate its dual porting to both left and right ports, 103 and 104, through lines 121 and 122. Also, as simplistically depicted in bubble blow-up 112, another characteristic and significant drawback of the conventional dual-port SRAM 101 is that its arbiter logic arbitrates at the individual memory cell level, which can add to access times.

An additional drawback of the conventional dual-port SRAM 101 is that it fails to accommodate urgent communications between the right and left resource sharing devices, 105 and 106. In particular, if the electronic device trying to transmit an urgent communication attempts to store the communication in a location that is being accessed by the recipient electronic device, then the transmitting electronic device must either wait to transmit the communication until the location frees up, or attempt to store the communication in another location. In either case, undue delay is disadvantageously incurred in transmitting the urgent communication.

OBJECTS AND SUMMARY OF THE INVENTION

Accordingly, one object of the present invention is to provide a non-blocking communication structure in a shared resource electronic device that does not unnecessarily delay transmission of urgent communications between resource sharing devices coupled to the shared resource electronic device.

Another object is to provide a shared resource memory device having faster read and write access times than conventional dual-port memory devices, while providing the same or higher bandwidth.

Still another object is to provide a shared resource memory device which minimizes the required interface control activities of electronic devices sharing the shared resource memory device.

These and additional objects are accomplished by the various aspects of the present invention, wherein briefly stated, one aspect is a shared resource electronic device having first and second ports for communicating respectively with first and second resource sharing electronic devices, comprising: at least one first mail box register which can be written to only through the first port, and read from at least through the second port; and at least one second mail box register which can be written to only through the second port, and read from at least through the first port.

In another aspect, a shared resource electronic device having first and second ports for communicating respectively with first and second resource sharing electronic devices, comprises: at least one mail box register which can be written to only through the first port, and read from at least through the second port; and a status register having at least one bit indicative of a written to status of the at least one mail box register, and readable through the second port.

In yet another aspect, a shared resource memory device having first and second ports for communicating respectively with first and second resource sharing electronic devices, comprises: a memory area accessible to the first and second ports; arbitration means for arbitrating access to the memory area between access requests simultaneously received through the first and second ports; and at least one mail box register which can be written to independent of the arbitration means through only the first port, and read from at least through the second port.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENTS

Figure 1:
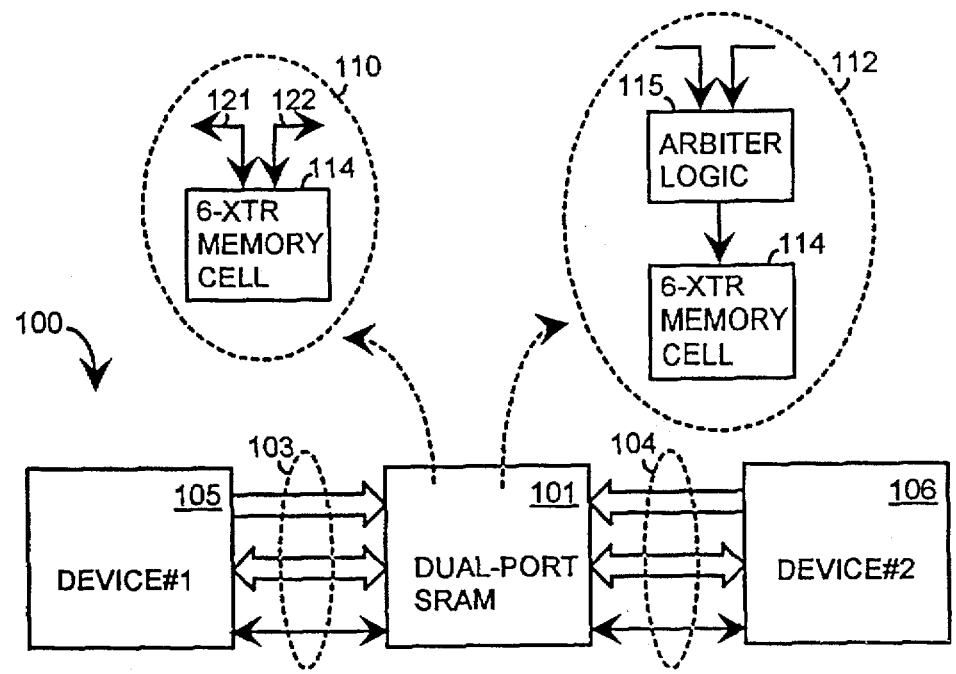
FIG. 1 illustrates, as an example, a block diagram of a system including a conventional dual-port static RAM with selected characteristics simplistically depicted in bubble blow-ups for descriptive purposes.
Figure 2:
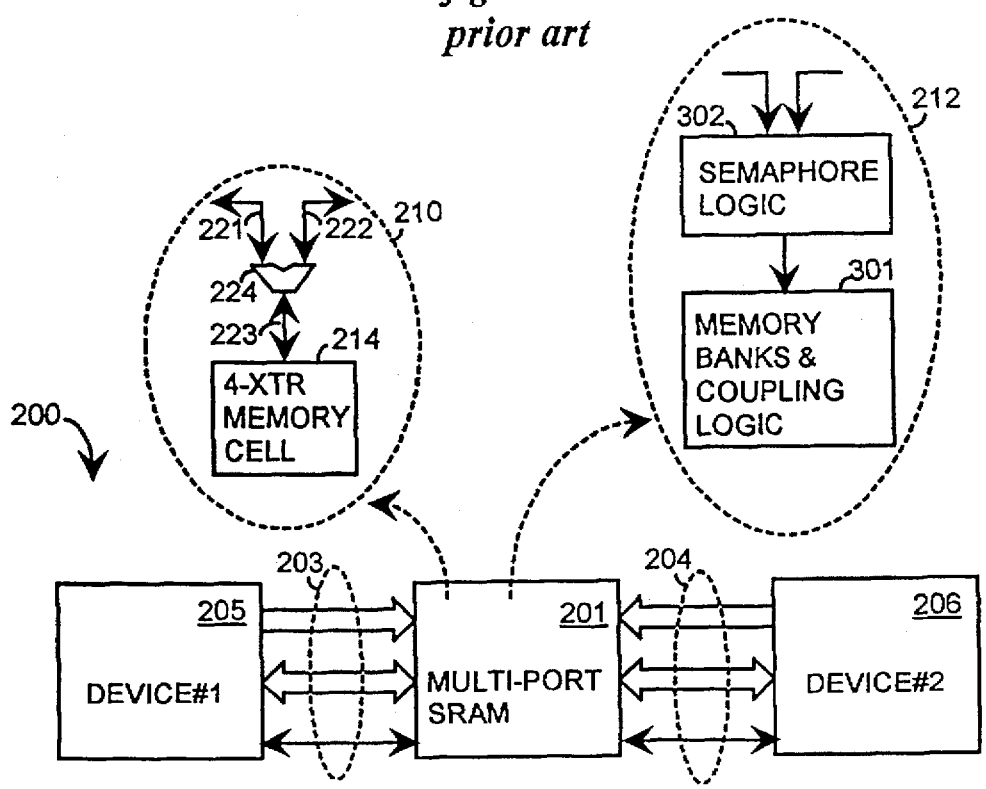
FIG. 2 illustrates, as an example, a block diagram of a system including a mux-port memory device utilizing aspects of the present invention, with selected characteristics simplistically depicted in bubble blow-ups for descriptive purposes.

FIG. 2 illustrates, as an example, a block diagram of a system 200 including a multi-port SRAM 201 with selected characteristics simplistically depicted in bubble blow-ups, 210 and 212, for descriptive purposes, and left and right resource sharing electronic devices, 205 and 206, respectively coupled to the multi-port SRAM 201 through left and right ports, 203 and 204. As depicted in bubble blow-up 210, one significant characteristic and advantage of the multi-port SRAM 201 is the relatively small size of its individual memory cells (e.g., 214), which may be typically four transistors in one implementation, to accommodate its single port which is multiplexed between left and right ports, 203 and 204, through, for example, lines 221 and 222. As depicted in bubble blow-up 212, another significant characteristic and advantage of the multi-port SRAM 201 is its semaphore logic circuit 302 which arbitrates on a first received basis between access requests from the left and right electronic devices, 205 and 206, at the memory bank level, rather than the individual cell level, and further, causes the access granted memory banks to be automatically coupled to the contention winning electronic devices without requiring action on the part of the left and right electronic devices, 205 and 206.

Accordingly, employment of the multi-port SRAM 201 having such characteristics as simplistically depicted in bubble blow-ups, 210 and 212, among other features, provides a number of advantages in advanced computer and other systems, relative to conventional single-port and dual-port SRAMs. For example, the multi-port SRAM 201 compares favorably against conventional single-port SRAMs since it can be concurrently accessed by two resource sharing devices, thereby providing twice the bandwidth of conventional single-ported SRAMs, with minimal penalty in terms of increased die size or read and write access speeds. The multi-port SRAM 201 also compares favorably against conventional dual-port SRAMs since its memory cells are substantially smaller than their dual-port counterparts, thereby resulting in a much smaller die size and consequently, lower manufacturing costs. Additionally, the multi-port SRAM 201 also generally provides faster access speeds than conventional dual-port SRAMs since read/write operations to an access granted memory bank avoid operation of the semaphore logic 302.

Although the bubble blow-ups, 210 and 212, of FIG. 2 are useful for highlighting certain advantages of the multi-port SRAM 201, a detailed and more accurate description of the multi-port SRAM 201 follows. For convenience, the designations x:y and x~y as used herein, generally indicate a sequence of signals or items from x to y. Except for address and data buses, wherein the designation Y:X conventionally indicates bus lines from X to Y with X being the bus line for the least-significant-bit and Y being the bus line for the most-significant-bit. Additionally, where left and right components are constructed and operate as mirror-images of one another, identical reference numbers are generally used with left and right designators at the end (e.g., 501L and 501R).

Memory Banks and Semaphore Logic

Figure 3:
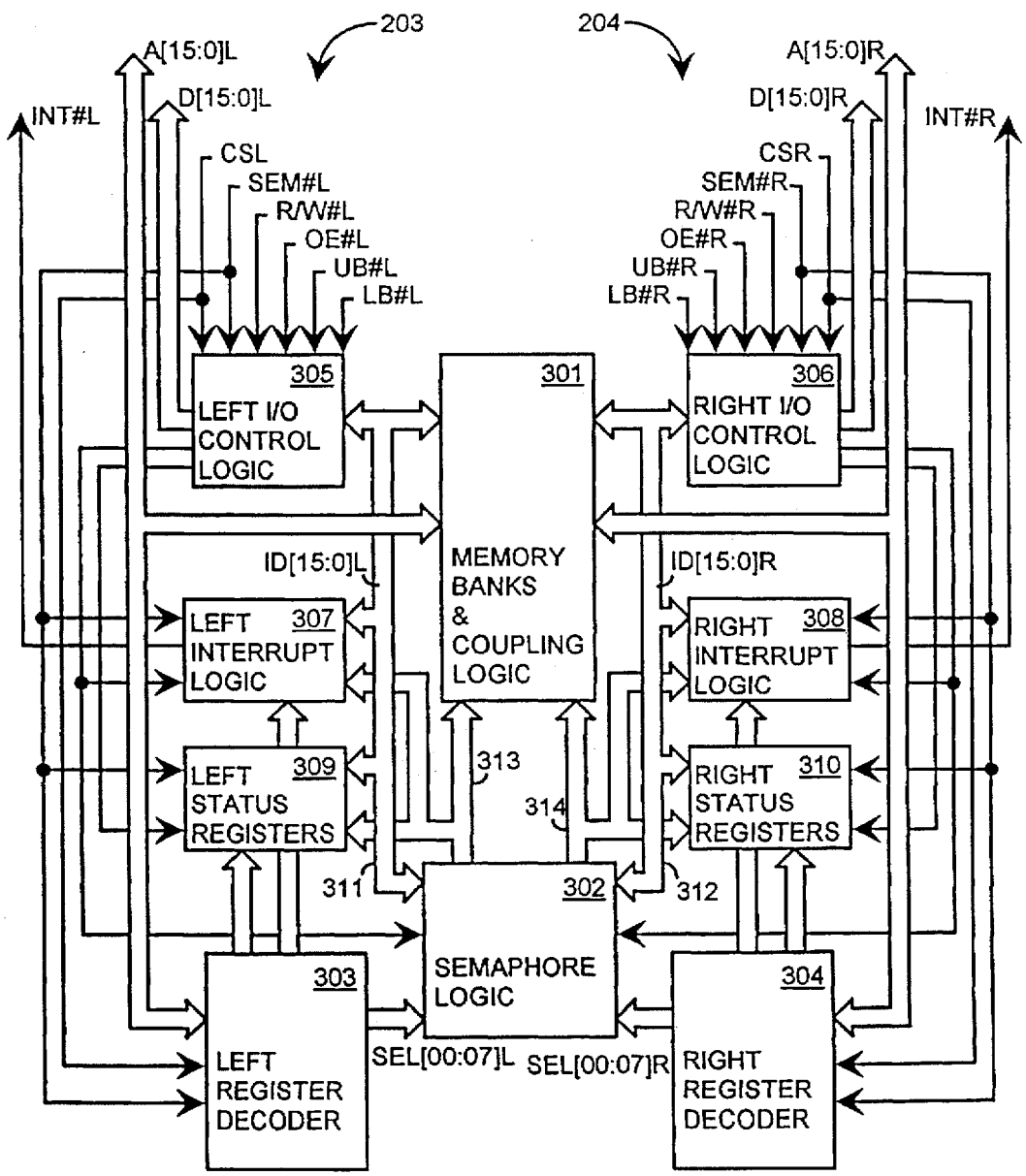
FIG. 3 illustrates, as an example, a block diagram of portions of the memory device of FIG. 2, including its memory banks, port coupling circuitry, semaphore logic circuitry, and other related circuitry providing controlled access to the memory banks, utilizing aspects of the present invention.

FIG. 3 illustrates, as an example, a block diagram of a portion of the memory device 201 including memory banks and port coupling logic combined as block 301, and a semaphore logic circuit 302 providing control signals in the form of left and right-side bank access grant signals, SEMG [0:7]L and SEMG[0:7]R, respectively via lines 313 and 314, to the coupling logic of block 301. Also included in the memory device 201 are left and right ports, 203 and 204, for communicating with the left and right resource sharing devices, 205 and 206; left and right input/output (I/O) control logic circuits, 305 and 306, for controlling the flow of data between corresponding external data buses, D[15:0]L and D[15:0]R, of the left and right ports, 203 and 204, and internal data buses, ID[15:0]L and ID[15:0]R, respectively depicted as lines 311 and 312; left and right register decoder circuits, 303 and 304, for decoding addresses, for example, corresponding to registers in the memory device 201 to generate enable signals for the registers; left and right interrupt logic circuits, 307 and 308, for generating interrupt signals in response to the bank access grant signals generated by the semaphore logic circuit 302; and a number of left and right status registers cumulatively depicted respectively as blocks 309 and 310. Since the left and right ports and circuitry generally mirror each other in construction and operation, detailed descriptions of the left ports and circuitry are provided herein, while descriptions of their corresponding right ports and circuitry are minimized to avoid unnecessary duplication.

The left port 203 includes a left sixteen-bit address bus A[15:0]L, a left sixteen-bit external data bus D[15:0]L, and various control signal lines including left chip select CSL, left semaphore mode enable SEM#L, left read/write R/W#L, left output enable OE#L, left upper data byte enable UB#L, left lower data byte enable LB#L, and left interrupt INT#L control signal lines, wherein the pound character "#" indicates control signal lines which are active LOW. Although the chip select control signal line CSL is described herein as being provided through the left port 203, in practice, a chip enable control signal line CE#L is generally provided through the left port 203 and the chip select control signal line CSL is generated within the memory device 201 by inverting the chip enable signal CE#L. The right port 204 similarly includes a right sixteen-bit address bus A[15:0]R, a right sixteen-bit external data bus D[15:0]R, and control signal lines CSR, SEM#R, R/W#R, OE#R, UB#R, RB#R, and INT#R, which are employed and generated in the same manner as their left-side counterparts.

To facilitate orderly access to the memory banks of the memory device 201, the left and right resource sharing devices, 205 and 206, follow a procedure of requesting access to a memory bank, determining that access to the requested memory bank has been granted, accessing the granted memory bank, and after completing its access of the granted memory bank, releasing the memory bank. In performing these steps, an access requesting device enters two modes of operation. The access requesting device enters a special mode referred to herein as a "semaphore mode" when requesting access to a memory bank, determining that access to the requested memory bank has been granted, and releasing the memory bank after completing its access. To actually access a granted memory bank, on the other hand, the access requesting device enters a conventional mode referred to herein as a "memory bank accessing mode".

To enter their semaphore modes, the left resource sharing device 205 activates its semaphore mode enable line SEM#L (e.g., active LOW), while not activating its chip select line CSL (e.g., inactive LOW), and the right resource sharing device 206 activates its semaphore mode enable line SEM#R, while not activating its chip select line CSR. On the other hand, to enter their memory bank accessing modes, the left resource sharing device 205 activates its chip select line CSL (e.g., active HIGH), while not activating its semaphore mode enable line SEM#L (e.g., inactive HIGH), and the right resource sharing device 206 activates its chip select line CSR, while not activating its semaphore mode enable line SEM#R.

Figure 7:
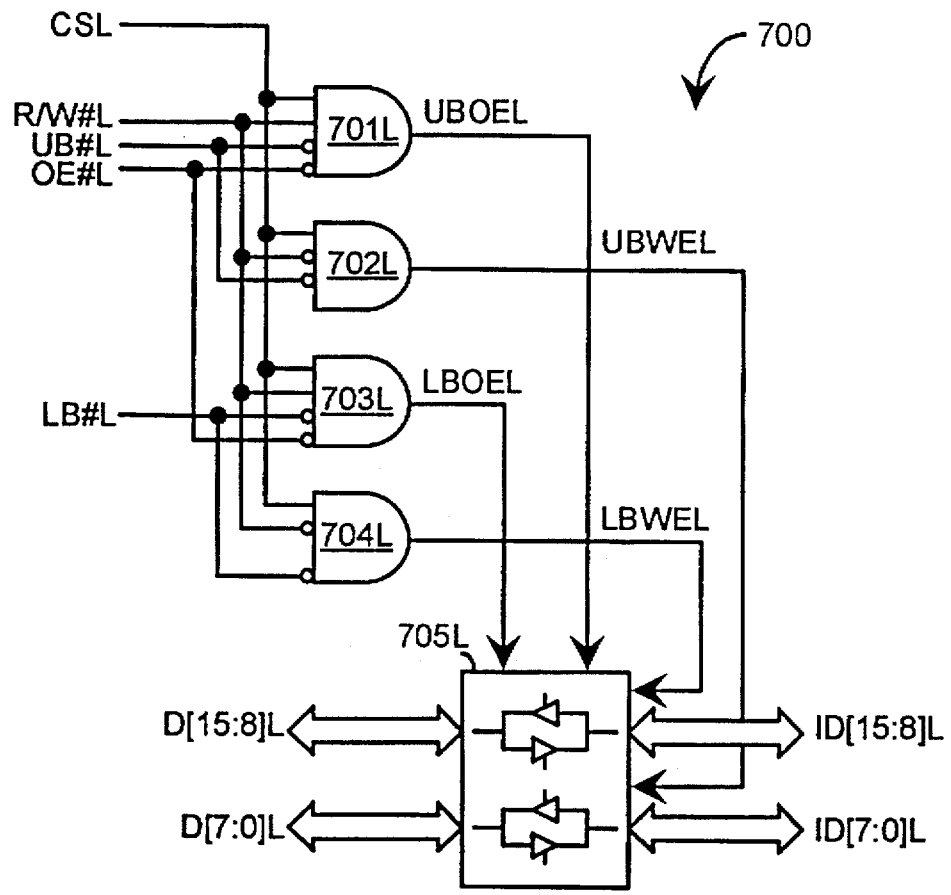
FIGS. 7 and 8 respectively illustrate, as examples, hybrid block and logic diagrams of the left and right memory banks I/O control logic circuits of the memory device of FIG. 2, utilizing aspects of the present invention.
Figure 8:
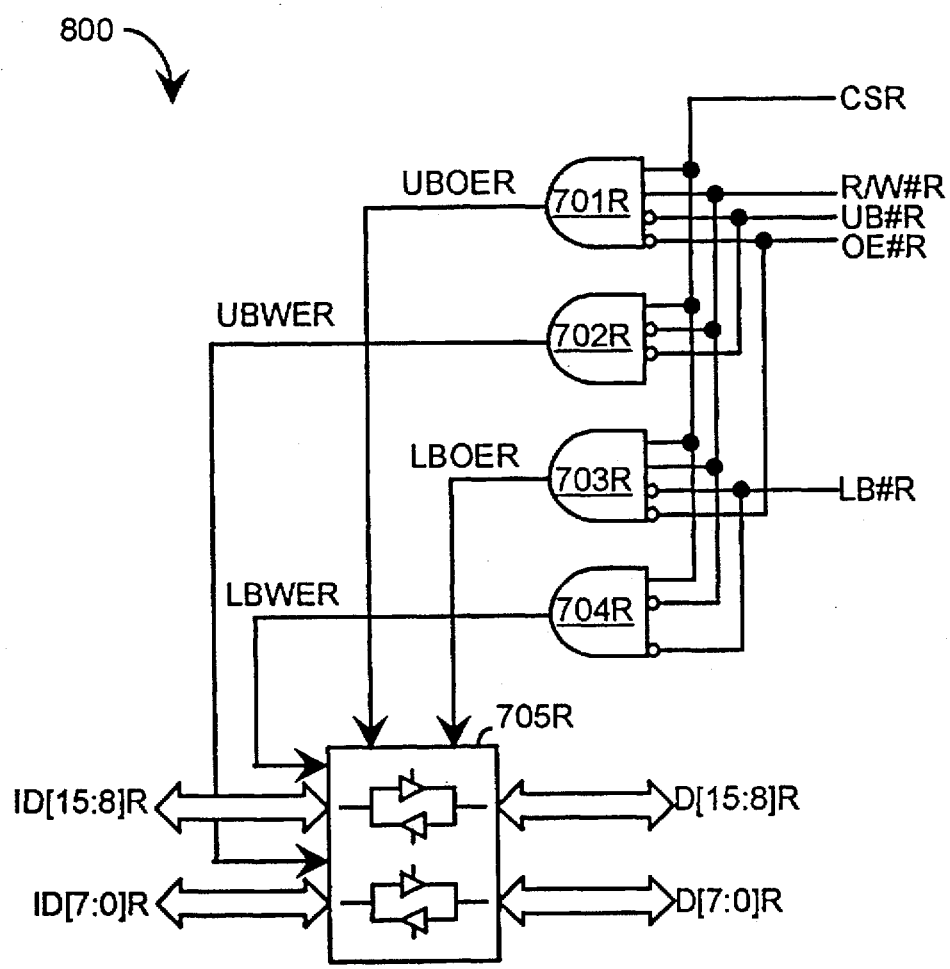
Figure 9:
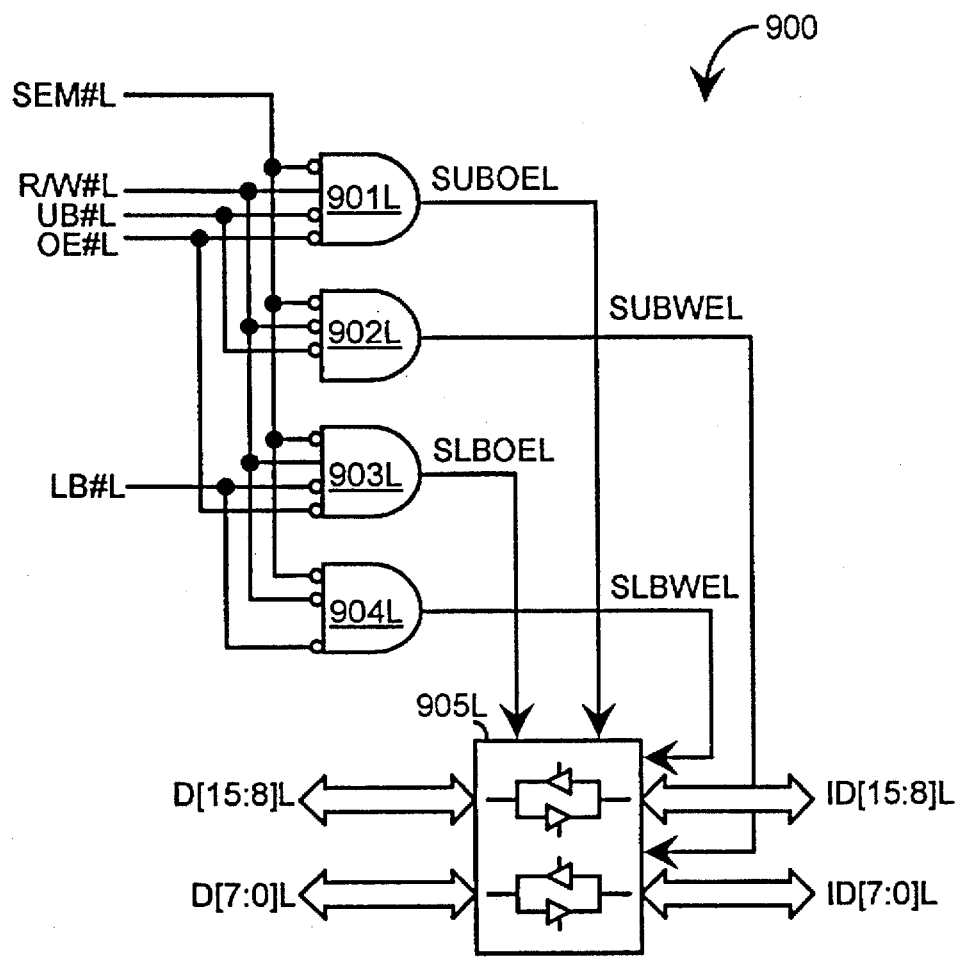
FIGS. 9 and 10 respectively illustrate, as examples, hybrid block and logic diagrams of the left and right semaphore I/O control logic circuits of the memory device of FIG. 2, utilizing aspects of the present invention.
Figure 10:
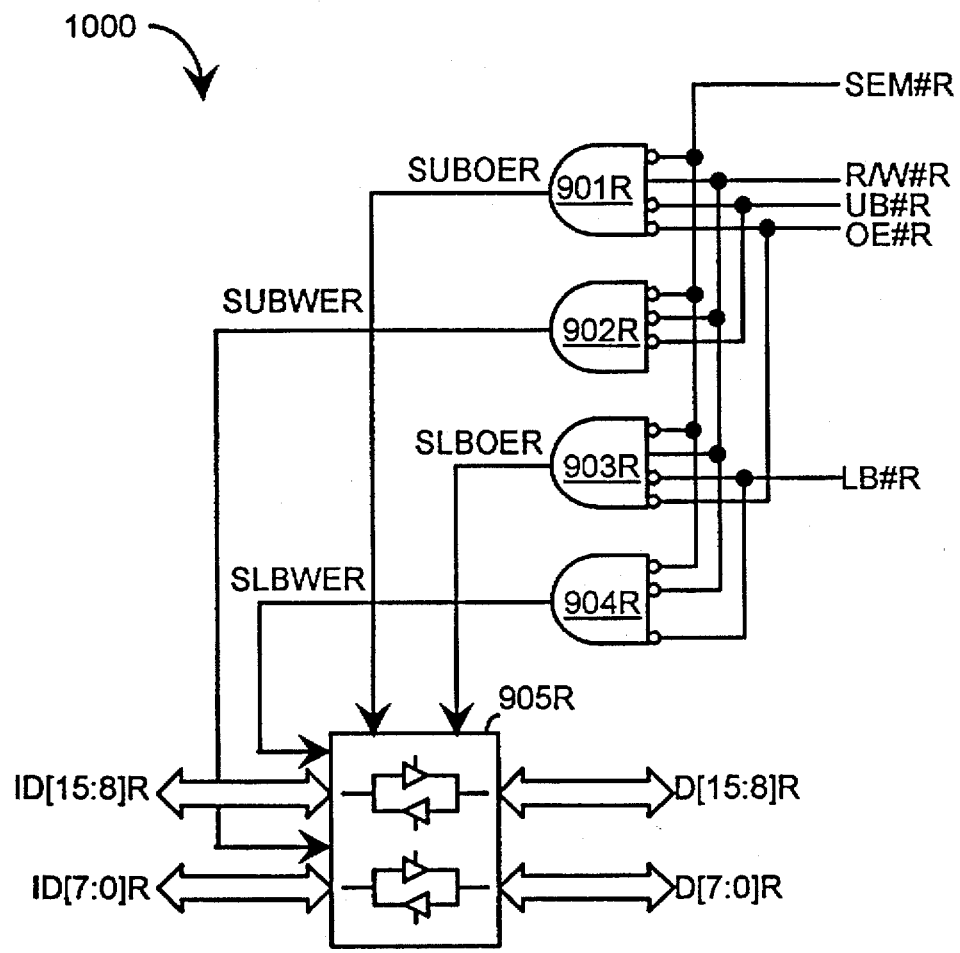

In the semaphore mode, the access requesting device generally writes to or reads from selected registers in the memory device 201, and in the memory bank accessing mode, the access requesting device writes to or reads from access requested and granted memory banks of the memory device 201. To facilitate such data communications, the left I/O control logic circuit 305 includes a left memory banks I/O control logic circuit such as depicted in FIG. 7, which is operative during the memory bank accessing mode (i.e., when the left chip select line CSL is active HIGH) to control the flow of data between the left external data bus D[15:0]L and the memory banks 301 in response to control signal lines R/W#L, OE#L, UB#L, and LB#L when one of the memory banks is addressed on the left address bus A[15:0]L; and a left semaphore I/O control logic circuit such as depicted in FIG. 9, which is operative during the semaphore mode (i.e., when the left semaphore mode enable line SEM#L is active LOW) to control the flow of data between the left external data bus D[15:0]L and the semaphore logic circuit 302 in response to control signal lines R/W#L and LB#L when one of the semaphore registers contained therein is addressed on the left address bus A[15:0]L, and between the left external data bus D[15:0]L and the left status registers 309 in response to control signal lines R/W#L, OE#L, UB#L, and LB#L when one of the left status registers is addressed on the left address bus A[15:0]L. To avoid contention between the left memory banks I/O control logic circuit and the left semaphore I/O control logic circuit, the semaphore mode enable and chip select control signal lines, SEM#L and CSL, are not both active at the same time. The right I/O control logic circuit 306 also includes a right memory banks I/O control logic circuit such as depicted in FIG. 8, and a right semaphore I/O control logic circuit such as depicted in FIG. 10 which are constructed and function similarly to their left-side counterparts.

Figure 4:
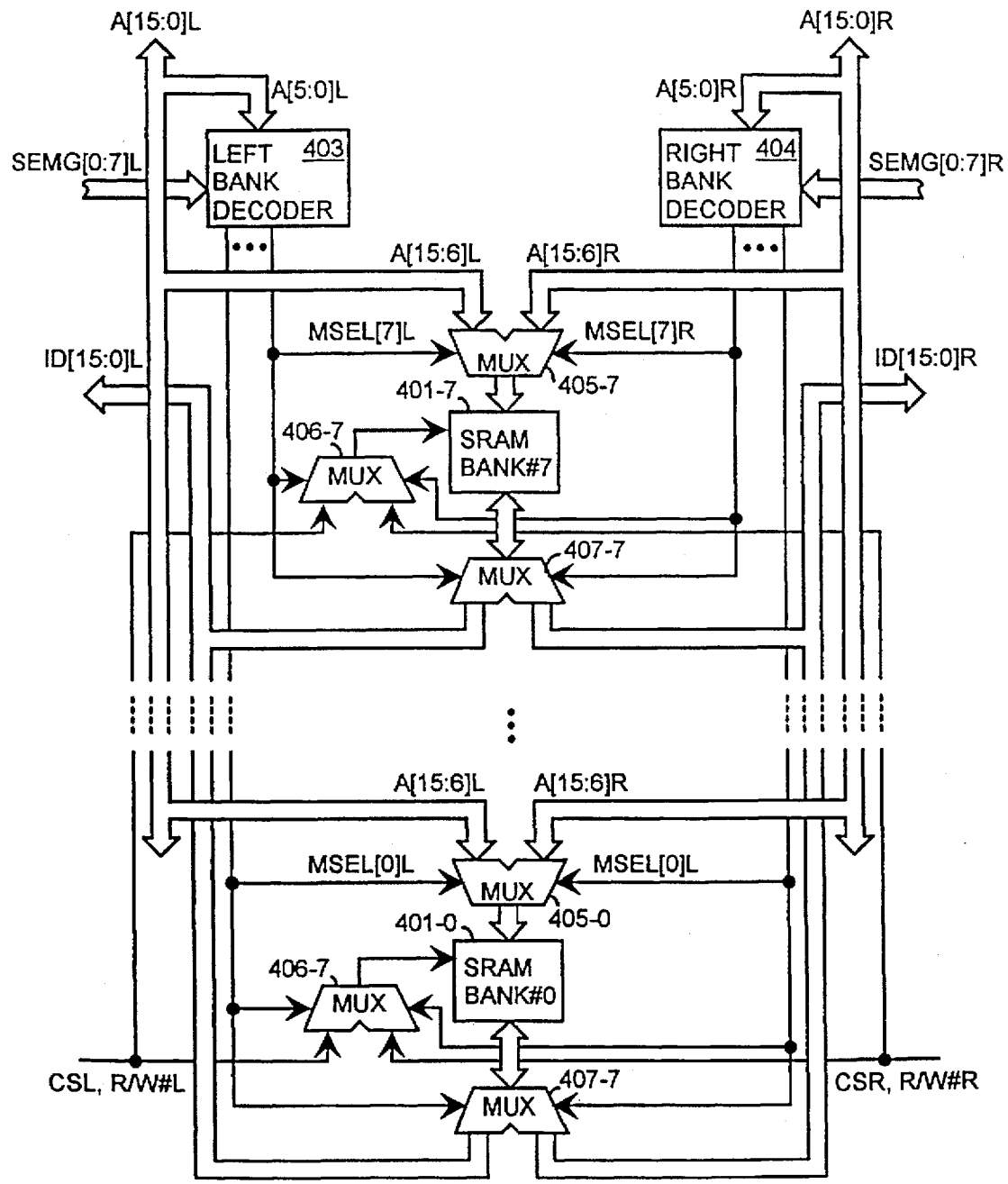
FIG. 4 illustrates, as an example, a block diagram further detailing the memory banks and port coupling circuitry of the memory device of FIG. 2, utilizing aspects of the present invention.

FIG. 4 illustrates, as an example, a block diagram further detailing the block 301 denoted as memory banks and coupling logic. In particular, the block 301 includes a static random-access-memory (SRAM) organized into eight SRAM memory banks, 401-0~401-7, and coupling circuitry for selectively coupling individual ones of the SRAM memory banks, 401-1~401-7, to the left and right ports, 203 and 204. Also included in the coupling logic are eight address multiplexer circuits, 405-0~405-7, eight control signals multiplexer circuits, 406-0~406-7, eight data multiplexer circuits, 407-0~407-7, and left and right bank decoder circuits, 403 and 404. The address multiplexer circuits, 405-0~405-7, control signals multiplexer circuits, 406-0~406-7, and data multiplexer circuits, 407-0~407-7, selectively couple individual memory banks respectively to the left and right address buses, A[15:0]L and A[15:0]R, left and right internal data buses, ID[15:0]L and ID[15:0]R, and left and right control signal lines (e.g., CSL, R/W#L and CSR, R/W#R), in response to left and right multiplexer select signals, MSEL[0:7]L and MSEL[0:7]R, generated by the left and right bank decoder circuits, 403 and 404. Data being written to or read from the coupled memory banks are then communicated between the left internal and external data buses, ID[15:0]L and D[15:0]L, by the left memory banks I/O control logic circuit 700 of FIG. 7, when the control signal lines CSL and SEM#L are respectively active and inactive, and between the right internal and external data buses, ID[15:0]R and D[15:0]L, by the right memory banks I/O control logic circuit 800 of FIG. 8, when the control signal lines CSR and SEM#R are respectively active and inactive.

A preferred addressing scheme for accessing the eight SRAM memory banks, 401-0-401-7, in the memory bank accessing mode, employs the six least-significant-bits (LSBs), i.e., A[5:0], of an address provided on the left or right address bus, A[15:0]L or A[15:0]R, to indicate a selected memory bank, and the remaining ten most-significant-bits (MSBs), i.e., A[15:6], of the address provided on the left or right address bus, A[15:0]L or A[15:0]R, to indicate a selected memory cell in the memory bank. One advantage of such an addressing scheme is that memory expansion within the memory banks can be readily accommodated by adding more address bus lines for higher MSBs, e.g., A[16], A[17] etc. Another advantage is that the six LSBs A[5:0] of the address are also employed in the semaphore mode for addressing various registers and requesting access to the SRAM memory banks, as further described herein, thereby simplifying the design of the multi-port SRAM 201 by capitalizing on such commonality.

Figure 5:
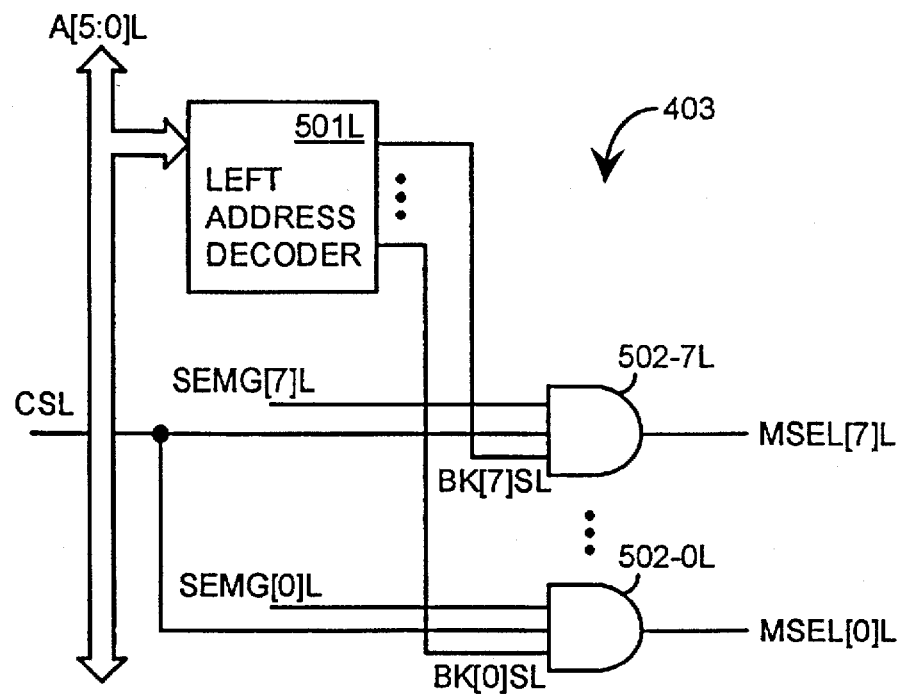
FIGS. 5 and 6 respectively illustrate, as examples, hybrid block and logic diagrams of the left and right bank decoder circuits utilized in the port coupling circuitry of the memory device of FIG. 2, utilizing aspects of the present invention.

The left bank decoder circuit 403 as depicted, for example, in FIG. 5, generates the left multiplexer select signals MSEL[0:7]L by decoding, for example, the six least-significant bits (LSBs) A[5:0] of an address received from the left address bus A[15:0]L, which is indicative of one of the eight memory banks, 401-0~401-7, as previously described, to activate a corresponding one of the left bank select signals BK[0:7]L, and then logically combining the bank select signals BK[0:7]L with the left bank access grant signals SEMG[0:7]L received from the semaphore logic circuit 302 via lines 313. In particular, the left bank decoder circuit 403 includes a left address decoder circuit 501 which conventionally includes eight AND logic circuits (not shown) with appropriate combinations of input inverters to generate the left bank select signals BK[0:7]L from example, if an address is received which corresponds to a location in memory bank 401-0, and has all zeroes for its six LSBs A[5:0], then a first one of the eight AND logic circuits (not shown) having, for example, inverters on each of its six inputs would generate a left bank select signal BK[0]L which is active HIGH, while all other AND logic circuits (not shown) having, for example, other combinations of inverters on their respective six inputs would generate left bank selects signals BK[1:7]L which are inactive LOW.

Also included in the left bank decoder circuit 403 are eight AND logic circuits, 502-0L~502-7L, which logically combine corresponding ones of the left bank select signals BK[0:7]L and the left bank access grant signals SEMG[0:7]L with the control signal CSL to generate the left multiplexer select signals MSEL[0:7]L. For example, the AND logic circuit 502-0L logically ANDs the left chip select signal CSL, the left bank select signal BK[0]L, and the left bank access grant signal SEMG[0]L to generate the left multiplexer signal MSEL[0]L such that the left multiplexer signal MSEL[0]L is only active HIGH if the control signal CSL is active HIGH (i.e., in the memory bank accessing mode), the left bank select signal BK[0]L is active HIGH (i.e., memory bank 401-0 is being addressed), and the left bank access grant signal SEMG[0]L is active HIGH (i.e., access to memory bank 401-0 has been granted to the left port 203 in response to a prior access request from the left port 203 conducted in the semaphore mode). The active HIGH multiplexer signal MSEL[0]L thereupon causes the address multiplexer circuit 405-0, the control signals multiplexer circuit 406-0, and the data multiplexer circuit 407-0 to couple the memory bank 401-0 to the left port 203.

The address multiplexer circuits, 405-0~405-7, control signals multiplexer circuits, 406-0~406-7, and data multiplexer circuits, 407-0~407-7, are conventionally constructed, for example, of three-state buffers, transmission gates, or similar components, individually having a corresponding one of the left and right multiplexer select signals, MSEL[0:7]L and MSEL[0:7]R, as an enable input. For example, the address multiplexer circuit 405-0 preferably includes twenty three-state buffers (not shown), or similarly functioning unidirectional devices, wherein a left ten of the three-state buffers have their enable inputs commonly coupled to the left multiplexer select signal MSEL[0]L and are individually coupled to corresponding lines A[15:6]L of the left address bus A[15:0]L, and a right ten of the three-state buffers have their enable inputs commonly coupled to the right multiplexer select signal MSEL[0]R and are individually coupled to corresponding lines A[15:6]R of the right address bus A[15:0]R, so as to provide addresses corresponding to selected memory cells to appropriate address decoding circuitry in the memory bank 401-0. The control signals multiplexer circuit 406-0 also preferably includes, for example, four three-state buffers (not shown), or similarly functioning unidirectional devices, wherein a left pair of three-state buffers have their enable inputs commonly coupled to the left multiplexer select signal MSEL[0]L and are coupled respectively to the control signal lines CSL and R/W#L from the left port 203, and a right pair of three-state buffers have their enable inputs commonly coupled to the right multiplexer select signal MSEL[0]R and are coupled respectively to the control signal lines CSR and R/W#R of the right port 203. The data multiplexer circuit 407-0, on the other hand, preferably includes thirty-two transmission gates (not shown), or similarly functioning bidirectional devices, wherein a left sixteen of the transmission gates have their enable inputs commonly coupled to the left multiplexer select signal MSEL[0]L and are individually coupled to corresponding lines of the left internal data bus ID[15:0]L, and a right sixteen of the transmission gates have their enable inputs commonly coupled to the right multiplexer select signal MSEL[0]R and are individually coupled to corresponding lines of the right internal data bus ID[15:0]R.

Thereupon, when the left multiplexer select signal MSEL[0]L is active HIGH and the right multiplexer select signal MSEL[0]R is inactive LOW, the left ten three-state buffers of the address multiplexer circuit 405-0 pass an address on the ten MSBs A[15:6] of the left address bus A[15:0]L to the memory bank 401-0, while the right ten three-state buffers of the address multiplexer circuit 405-0 go into a high impedance state. In addition, the left pair of three-state buffers of the control signals multiplexer circuit 406-0 respectively pass the control signals CSL and R/W#L to the memory bank 401-0, while the right pair of three-state buffers of the control signals multiplexer circuit 406-0 go into a high impedance state. Also, the left sixteen transmission gates of the data multiplexer circuit 407-0 pass data to or from the left internal data bus ID[15:0]L from or to the memory bank 401-0, while the right sixteen transmission gates of the data multiplexer circuit 407-0 do not allow data to pass through them in either direction. Conversely, when the right multiplexer select signal MSEL[0]R is active HIGH and the left multiplexer select signal MSEL[0]L is inactive LOW, the operation of the three-state buffers and transmission gates corresponding to the left and right sides of the address multiplexer circuit 405-0, the control signals multiplexer circuit 406-0, and data multiplexer circuit 407-0 are reversed so that the memory bank 401-0 is coupled to the right port 204 instead of the left port 203.

Figure 6:
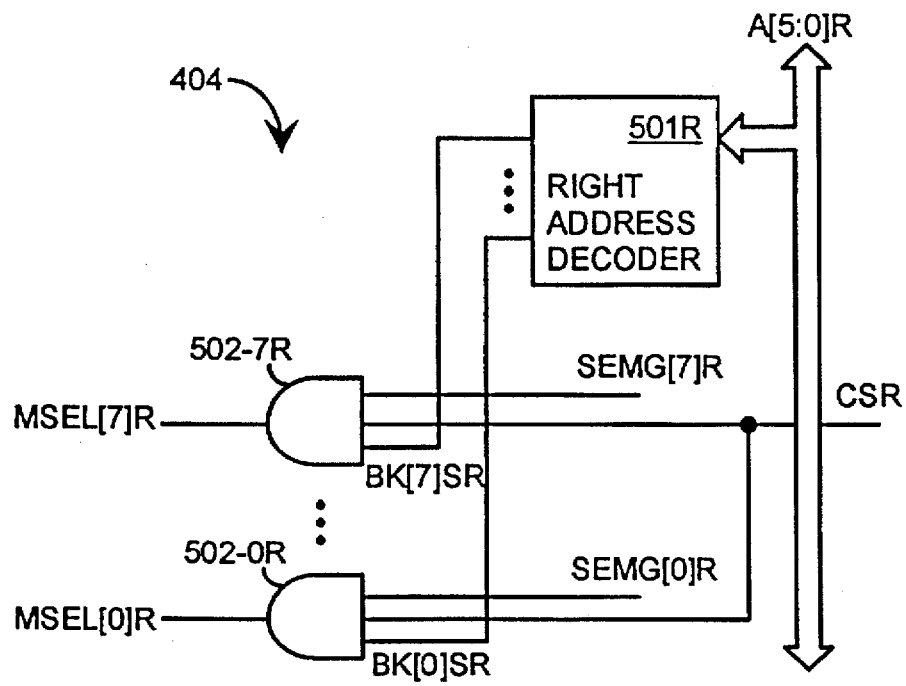

The right bank decoder circuit 404 as depicted, for example, in FIG. 6, similarly generates the right multiplexer select signals MSEL[0:7]R by decoding, for example, the five LSBs A[5:0] of an address indicative of a memory location in one of the eight memory banks, 401-0-401-7, to activate a corresponding one of the right bank select signals BK[0:7]R, and then logically combining the bank select signals BK[0:7]R with the right bank access grant signals SEMG[0:7]R received from the semaphore logic circuit 302 via lines 314.

FIGS. 7 and 9 illustrate, as examples, the left memory banks I/O control logic circuit 700 and the left semaphore control logic circuit 900 which combine to form the left I/O control logic circuit 305, and FIGS. 8 and 10 illustrate, as examples, the right memory banks I/O control logic circuit 800 and the right semaphore I/O control logic circuit 1000 which combine to form the right I/O control logic circuit 306. Referring first to FIG. 7, the left memory banks I/O control logic circuit 700 includes conventionally formed left bidirectional drivers 705L coupling lines of the left internal data bus ID[15:0]L to corresponding lines of the left external data bus D[15:0]L, and four left NAND gates, 701L, 702L, 703L, and 704L, generating read and write driver enable signals for the left bidirectional drivers 705L. The left NAND gate 701L generates a left upper byte output enable signal UBOEL from the left chip select CSL, left read/write R/W#L, inverted left upper data byte enable UB#L, and inverted left output enable OE#L signals. When active HIGH, the left upper byte output enable signal UBOEL causes the left bidirectional drivers 705L to read the upper data byte from the left internal data bus ID[15:8]L to the upper data byte of the external data bus D[15:8]L. The left NAND gate 702L generates a left upper byte write enable signal UBWEL from the left chip select CSL, inverted left read/write R/W#L, and inverted left upper data byte enable UB#L signals. When active HIGH, the left upper byte write enable signal UBWEL causes the left bidirectional drivers 705L to write the upper data byte of the left external data bus D[15:8]L to the upper data byte of the internal data bus ID[15:8]L. The NAND gate 703L generates a left lower byte output enable signal LBOEL from the left chip select CSL, left read/write R/W#L, inverted left lower data byte enable LB#L, and inverted left output enable OE#L signals. When active HIGH, the left lower byte output enable signal LBOEL causes the left bidirectional drivers 705L to read the lower data byte from the left internal data bus ID[7:0]L to the lower data byte of the external data bus D[7:0]L. The NAND gate 704L generates a left lower byte write enable signal LBWEL from the left chip select CSL, inverted left read/write R/W#L, and inverted left lower data byte enable LB#L signals. When active HIGH, the left lower byte write enable signal LBWEL causes the left bidirectional drivers 705L to write the lower data byte from the left external data bus D[7:0]L to the lower data byte of the internal data bus ID[7:0]L. Likewise, the right memory banks I/O control logic circuit 800 as depicted in FIG. 8, also includes conventionally formed right bidirectional drivers 705R coupling lines of the right internal data bus ID[15:0]R to corresponding lines of the right external data bus D[15:0]R, and four right NAND gates, 701R, 702R, 703R, and 704R, generating read and write driver enable signals for the right bidirectional drivers 705R in a similar fashion as their left-side counterparts.

By coupling together and activating the left upper and left lower data byte enable lines, UB#L and LB#L, sixteen bit data transfers can be accommodated for a left resource sharing device 205 having a sixteen-bit data bus. On the other hand, by maintaining the left upper data byte enable line UB#L inactive while activating the left lower data byte enable line LB#L, eight bit data transfers can be accommodated for a left resource sharing device 205 having an eight-bit data bus. In a similar fashion, sixteen bit or eight bit data transfers can be accommodated by the right memory banks I/O control logic circuit 800 for right resource sharing devices 206 having sixteen-bit or eight-bit data buses, so that various combinations of left and right resource sharing devices having sixteen-bit and eight-bit data buses can be readily coupled to the memory device 201 and accommodated.

Referring now to FIG. 9, the left semaphore I/O control logic circuit 900 includes conventionally formed left bidirectional drivers 905L coupling lines of the left internal data bus ID[15:0]L to corresponding lines of the left external data bus D[15:0]L, and four left NAND gates, 901L, 902L, 903L, and 904L, generating read and write driver enable signals for the left bidirectional drivers 905L. The left NAND gate 901L generates a left semaphore upper byte output enable signal SUBOEL from an inverted left semaphore mode enable SEM#L, left read/write R/W#L, inverted left upper data byte enable UB#L, and inverted left output enable OE#L signals. When active HIGH, the left semaphore upper byte output enable signal SUBOEL causes the left bidirectional drivers 905L to read the upper data byte from the left internal data bus ID[15:8]L to the upper data byte of the external data bus D[15:8]L. The left NAND gate 902L generates a left semaphore upper byte write enable signal SUBWEL from the inverted left semaphore mode enable SEM#L, inverted left read/write R/W#L, and inverted left upper data byte enable UB#L signals. When active HIGH, the left semaphore upper byte write enable signal SUBWEL causes the left bidirectional drivers 905L to write the upper data byte of the left external data bus D[15:8]L to the upper data byte of the internal data bus ID[15:8]L. The NAND gate 903L generates a left semaphore lower byte output enable signal SLBOEL from the inverted left semaphore mode enable SEM#L, left read/write R/W#L, inverted left lower data byte enable LB#L, and inverted left output enable OE#L signals. When active HIGH, the left semaphore lower byte output enable signal SLBOEL causes the left bidirectional drivers 905L to read the lower data byte from the left internal data bus ID[7:0]L to the lower data byte of the external data bus D[7:0]L. The NAND gate 904L generates a left semaphore lower byte write enable signal SLBWEL from the inverted left semaphore mode enable SEM#L, inverted left read/write R/W#L, and inverted left lower data byte enable LB#L signals. When active HIGH, the left semaphore lower byte write enable signal SLBWEL causes the left bidirectional drivers 905L to write the lower data byte from the left external data bus D[7:0]L to the lower data byte of the internal data bus ID[7:0]L. Likewise, the right semaphore I/O control logic circuit 1000 as depicted in FIG. 10, also includes conventionally formed right bidirectional drivers 905R coupling lines of the right internal data bus ID[15:0]R to corresponding lines of the right external data bus D[15:0]R, and four right NAND gates, 901R, 902R, 903R, and 904R, generating read and write driver enable signals for the right bidirectional drivers 905R in a similar fashion as their left-side counterparts.

Figure 11:
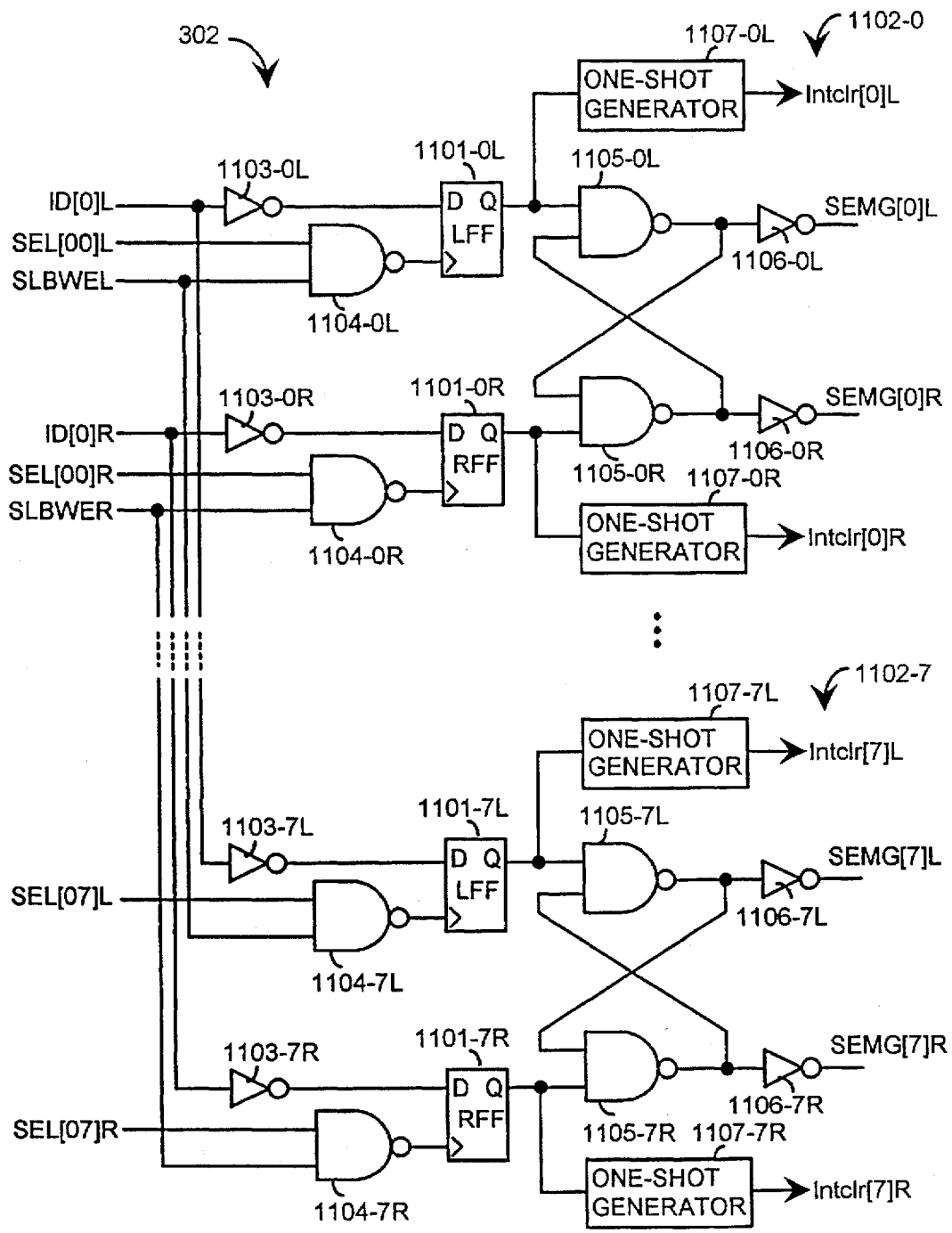
FIG. 11 illustrates, as an example, a logic diagram of the semaphore logic circuitry of the memory device of FIG. 2, utilizing aspects of the present invention.

FIG. 11 illustrates, as an example, a logic diagram of the semaphore logic circuit 302. Included in the semaphore logic circuit 302 are eight semaphore circuits, 1102-0~1102-7, corresponding to the eight memory banks, 401-0~401-7, of the memory device 201. As examples, the semaphore circuit 1102-0 receives access requests from the left and right resource sharing devices, 205 and 206, for its corresponding memory bank 401-0, and generates the left and right bank access grant signals, SEMG[0]L and SEMG[0]R, based upon a first received basis for its corresponding memory bank 401-0; and the semaphore circuit 1102-7 receives access requests from the left and right resource sharing devices, 205 and 206, for its corresponding memory bank 401-7, and generates the left and right bank access grant signals, SEMG[7]L and SEMG[7]R, based upon a first received basis for its corresponding memory bank 401-7.

Each of the semaphore circuits has left and right data paths for receiving access requests for its corresponding memory bank respectively from the left and right resource sharing devices, 205 and 206. For example, the left data path of the semaphore circuit 1102-0 includes a left front end inverter 1103-0L having an input coupled to a least-significant bit (LSB) ID[0]L of the left internal data bus ID[15:0]L, a left NAND gate 1104-0L having first and second inputs respectively coupled to a bank select signal SEL[0]L generated by the left register decoder circuit 303 and a left semaphore lower byte write enable signal SLBWEL generated by the left semaphore I/O control logic circuit 900, and a left semaphore register (or flip-flop) 1101-0L having a D-input coupled to the left front end inverter 1103-0L output and a clock input coupled to the left NAND gate 1104-0L output. The right data path of the semaphore circuit 1102-0 also includes a right front end inverter 1103-0R having an input coupled to a LSB ID[0]R of the right internal data bus ID[15:0]R, a right NAND gate 1104-0R having first and second inputs respectively coupled to a bank select signal SEL[0]R generated by the right register decoder circuit 304 and a right semaphore lower byte write enable signal SLBWER generated by the right semaphore I/O control logic circuit 1000, and a right semaphore register (or flip-flop) 1101-0R having a D-input coupled to the right front end inverter 1103-0R output and a clock input coupled to the right NAND gate 1104-0R output.

Each of the semaphore circuits also has a pair of cross-coupled NAND gates for latching a first received access request for its corresponding memory bank from the left and right resource sharing devices, 205 and 206, thereby acting as an arbiter latch, and a pair of back end inverters coupled to corresponding outputs of the pair of cross-coupled NAND gates for respectively generating the left and right bank access grant signals for its corresponding memory bank. For example, the semaphore circuit 1102-0 also includes left and right cross-coupled NAND gates, 1105-0L and 1105-0R, acting as an arbiter latch, wherein the left NAND gate 1105-0L has a first input coupled to the Q-output of the left semaphore register 1101-0L and a second input coupled to the right NAND gate 1105-0R output, and the right NAND gate 1105-0R has a first input coupled to the Q-output of the right semaphore register 1101-0R and a second input coupled to the left NAND gate 1105-0L output; and the semaphore circuit 1102-0 also includes left and right back end inverters, 1106-0L and 1106-0R, wherein the left back end inverter 1106-0L is coupled to the left NAND gate 1105-0L output to generate the left bank access grant signal SEMG[0]L, and the right back end inverter 1106-0R is coupled to the right NAND gate 1105-0R output to generate the right bank access grant signal SEMG[0]R.

Operation of the semaphore logic circuit 302 is as follows. When a memory bank is free (i.e., no access request for the memory bank is pending), the Q-outputs of the left and right semaphore registers of its corresponding semaphore circuit are in a logic LOW state and as a consequence, both left and right bank access grant signals generated by its corresponding semaphore circuit are logic LOW (i.e., inactive). For example, if the memory bank 401-0 is free, then the Q-outputs of the left and right semaphore registers, 1101-0L and 1101-0R, of its corresponding semaphore circuit 1102-0 are logic LOW. The Q-outputs of the left and right semaphore registers, 1101-0L and 1101-0R, may have been initially set to logic LOW, or they may have been forced to a logic LOW value by their corresponding left and right resource sharing electronic devices, 205 and 206, providing logic HIGH values into the LSBs, ID[0]L and ID[0]R, of their left and right internal data buses, ID[15:0]L and ID[15:0]R, providing addresses indicative of the left and right semaphore registers, 1101-0L and 1101-0R, on their left and right address buses, A[15:0]L and A[15:0]R, activating their lower data byte enable signals, LB#L and LB#R, activating their semaphore mode enable signals, SEM#L and SEM#R, and activating the write mode of their read/write enable signals, R/W#L and R/W#R.

When the left resource sharing device 205 subsequently requests access to the memory bank 401-0, it provides a logic LOW value into the LSB ID[0]L of its left internal data bus ID[15:0]L, provides an address indicative of the left semaphore register 1101-0L on the left address bus A[15:0]L, activates its lower data byte enable signal LB#L, activates its semaphore mode enable signal SEM#L, and activates the write mode of its read/write enable signal R/W#L. As a consequence, the left register decoder circuit 302 activates the bank select signal SEL[0]L, the left semaphore I/O control logic circuit 900 activates the left semaphore lower byte write enable signal SLBWEL, and the left NAND gate 1104-0L generates a falling edge signal clocking a logic HIGH value (the output of the left front end inverter 1103-0L) into the Q-output of the left semaphore register 1101-0L. The output of the left cross-coupled NAND gate 1105-0L then switches to a logic LOW value, thereby activating the left bank access grant signal SEMG[0]L to a logic HIGH value.

If the right resource sharing device 206 subsequently requests access to the memory bank 401-0, it provides a logic LOW value into the LSB ID[0]R of its right internal data bus ID[15:0]R, provides an address indicative of the right semaphore register 1101-0R on the right address bus A[15:0]R, activates its lower data byte enable signal LB#R, activates its semaphore mode enable signal SEM#R, and activates the write mode of its read/write enable signal R/W#R. As a consequence, the right register decoder circuit 303 activates the bank select signal SEL[0]R, the right semaphore I/O control logic circuit 1000 activates the right semaphore lower byte write enable signal SLBWER, and the right NAND gate 1104-0R generates a falling edge signal clocking a logic HIGH value (the output of the right front end inverter 1103-0R) into the Q-output of the right semaphore register 1101-0R. The output of the right cross-coupled NAND gate 1105-0L does not switch to a logic LOW value, however, since the output of the left cross-coupled NAND gate 1105-0L is a logic LOW value, thereby keeping the output of the right cross-coupled NAND gate 1105-0R to a logic HIGH value and preventing the activation of the right bank access grant signal SEMG[0]L to a logic HIGH value.

When the left resource sharing device 205 subsequently releases the memory bank 401-0, it provides a logic HIGH value into the LSB ID[0]L of its left internal data bus ID[15:0]L, provides an address indicative of the left semaphore register 1101-0L on the left address bus A[15:0]L, activates its lower data byte enable signal LB#L, activates its semaphore mode enable signal SEM#L, and activates the write mode of its read/write enable signal R/W#L. As a consequence, the left register decoder circuit 302 activates the bank select signal SEL[0]L, the left semaphore I/O control logic circuit 900 activates the left semaphore lower byte write enable signal SLBWEL, and the left NAND gate 1104-0L generates a falling edge signal clocking a logic LOW value (the output of the left front end inverter 1103-0L) into the Q-output of the left semaphore register 1101-0L. The output of the left cross-coupled NAND gate 1105-0L then switches to a logic HIGH value, thereby deactivating the left bank access grant signal SEMG[0]L back to a logic LOW value, and allowing the output of the right cross-coupled NAND gate to switch to a logic LOW value and activate the right bank access grant signal SEMG[0]R to a logic HIGH value to service the pending access request of the right resource sharing electronic device 206.

One-shot signal generator circuits 1107-0L~1107-7L generate delayed one-shot pulses Intclr[0]L~Intclr[7]L from the Q-outputs of flip-flops 1101-0L~1101-7L for the left interrupt logic circuit 307, and one-shot signal generator circuits 1107-0R~1107-7R generate delayed one-shot pulses Intclr[0]R~Intclr[7]R from the Q-outputs of flip-flops 1101-0R~1101-7R for the right interrupt logic circuit 308. Each of the one-shot signal generator circuits, 1107-0L~1107-7L and 1107-0R~1107-7R, generate an edge triggered, delayed one-shot pulse having a width long enough to set their corresponding interrupt acknowledge flip-flops (e.g., 1203-0L~1203-7L and 1203-0R~1203-7R) in the left and right interrupt logic circuits, 307 and 308, and a delay approximately equal to the arbitration settling time of their respective semaphore circuits, 1102-0~1102-7.

Figure 12:
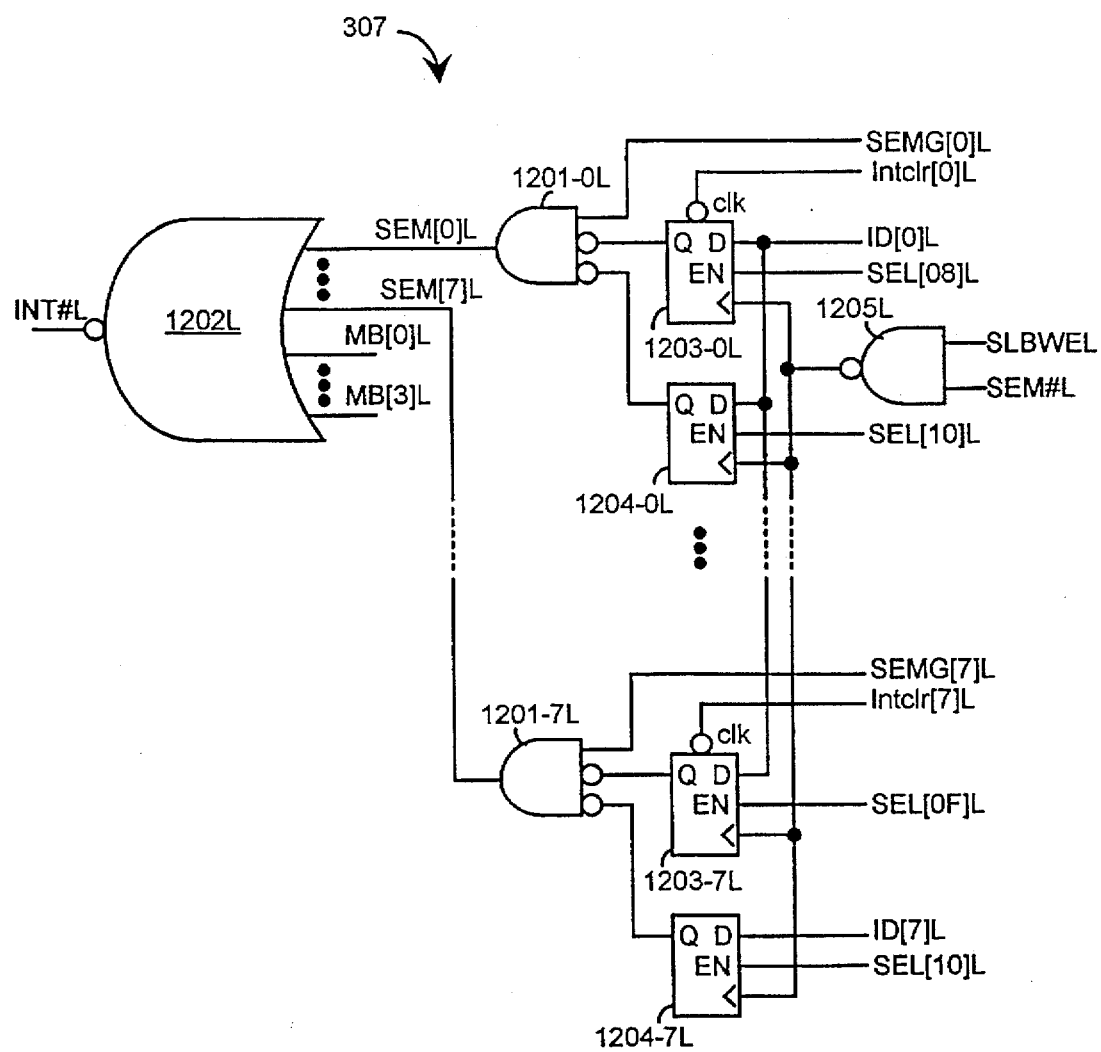
FIGS. 12 and 13 respectively illustrate, as examples, logic diagrams of the left and right interrupt logic circuits of the memory device of FIG. 2, utilizing aspects of the present invention.
Figure 13:
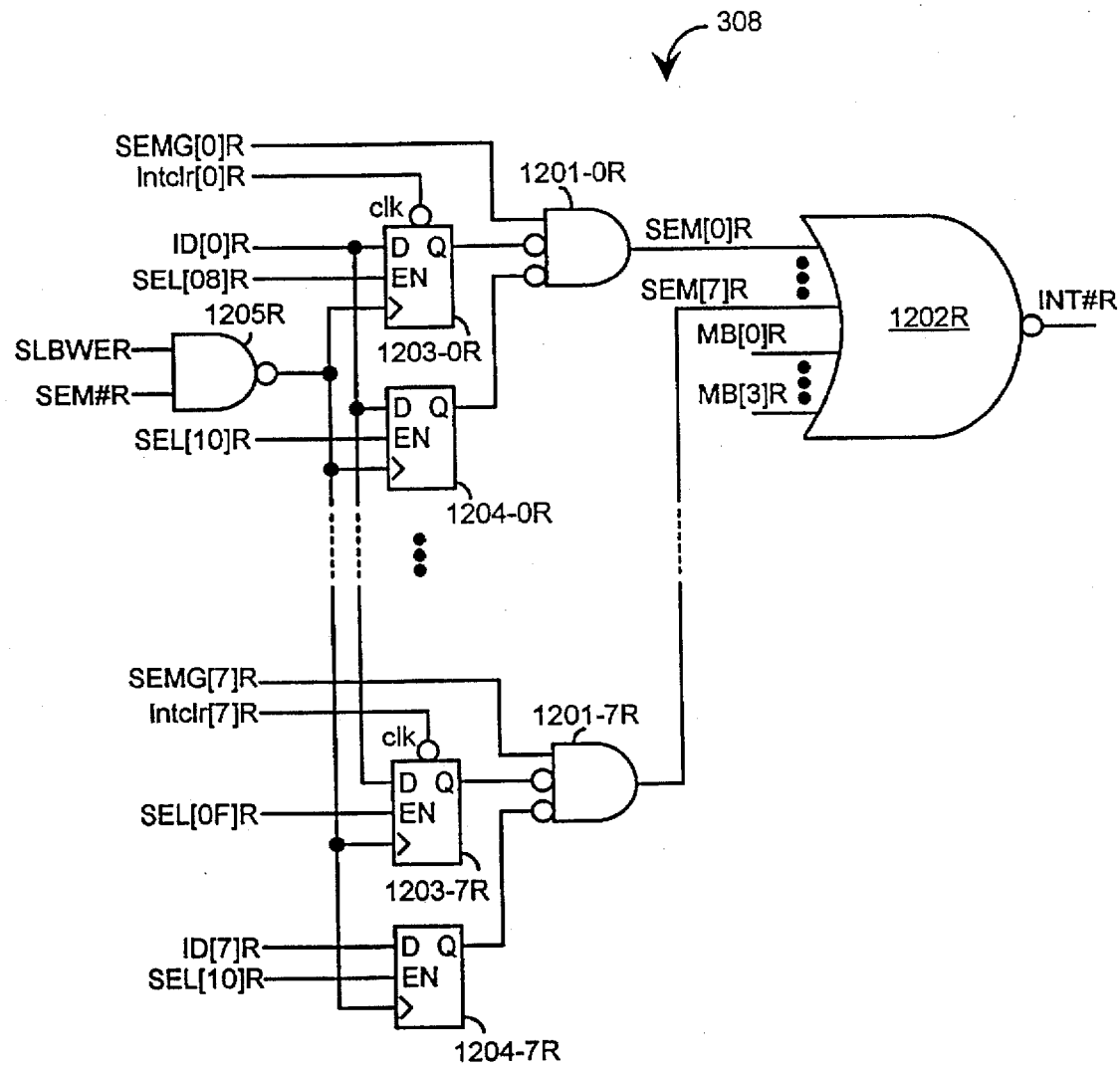

FIGS. 12 and 13 illustrate, as examples, the left and right interrupt logic circuits, 307 and 308. Referring to FIG. 12, the left interrupt logic circuit 307 includes a NOR gate 1202L having inputs coupled to eight left data paths individually including an AND gate (e.g., one of 1201-0L~1201-7L) having a first input receiving a corresponding one of the left bank access grant signals SEMG[0:7]L, a second input coupled to a first circuit generating an interrupt acknowledge/clear signal, and a third input coupled to a second circuit generating an interrupt mask signal. The first circuit includes a first flip-flop (e.g., one of 1203-0L~1203-7L) having a D-input coupled to, for example, the LSB ID[0]L of the left internal data bus ID[15:0]L, an enable input coupled to a select signal (e.g., one of SEL[08]L~SEL[0F]L) provided by the left register decoder circuit 303, a clock input coupled to an output of a NAND gate 1205L, an inverted clock input coupled to a corresponding delayed one-shot pulse (e.g., Intclr[0]L), and a Q-output coupled to an inverted input of the AND gate (e.g., one of 1201-0L~1201-7L) to provide the interrupt acknowledge/clear signal. The second circuit includes a second flip-flop (e.g., one of 1204-0L~1204-7L) having a D-input coupled to a corresponding data bit (e.g., one of ID[0]L~ID[7]L) of the left internal data bus ID[15:0]L, an enable input coupled to a select signal SEL[10]L provided by the left register decoder circuit 303, a clock input coupled to the output of the NAND gate 1205L, and a Q-output coupled to an inverted input of the AND gate (e.g., one of 1201-0L~1201-7L) to provide the interrupt mask signal.

Before the semaphore logic circuit 302 grants an access request to the left resource sharing device 205 for one of the memory banks 401-0~401-7, the left bank access grant signals SEMG[0:7]L will all be inactive LOW and as a consequence, the left interrupt signal INT#L will be inactive HIGH. Thereafter, assuming all interrupt clear and mask signals are inactive, after the semaphore logic circuit 302 grants an access request to the left resource sharing device 205 for one of the memory banks 401-0~401-7, the corresponding one of the left bank access grant signals SEMG[0:7]L will become active HIGH to indicate such granting and as a consequence, the left interrupt signal INT#L will become active LOW indicating an interrupt condition to the left resource sharing device 205. Subsequently, after the left resource sharing device 205 releases the access granted memory bank, the corresponding left bank access grant signal will be returned to inactive LOW to indicate such release and as a consequence, will no longer cause the left interrupt signal INT#L to be active LOW.

Prior to releasing the granted memory bank, however, the left resource sharing device 205 can clear the interrupt signal INT#L by clocking a logic HIGH value through the first flip-flop of the data path corresponding to the activated left bank access grant signal, so that a logic LOW is provided to the second input of the AND gate (e.g., one of 1201-0L~1201-7L) of the data path and as a consequence, the left interrupt signal INT#L is returned to an inactive HIGH state. To do this, the left resource sharing device 205 provides a logic HIGH value on the LSB ID[0]L of the left internal data bus ID[15:0]L, provides an address (e.g., one of xx10~xx0F hex) indicative of the first flip-flop (e.g., one of 1203-0L~1203-7L) of the data path to the left register decoder circuit 303, activates the left semaphore mode enable signal SEM#L, activates the left lower data byte enable control signal LB#L, and activates the write mode of the left read/write control signal R/W#L. The left register decoder 303 thereupon decodes the address to activate a corresponding one of the select signals SEL[08]L~SEL[0F]L, which in turn, enables the first flip-flop (e.g., one of 1203-0L~1203-7L) indicated by the address, and the left semaphore I/O control logic circuit 900 activates the left semaphore lower data byte write enable signal SLBWEL which in turn, causes the logic HIGH value on the LSB ID[0]L of the left internal data bus ID[15:0]L to be clocked through to the Q-output of the first flip-flip(e.g., one 1203-0L~1203-7L), thereby causing the interrupt clear signal INT#L for the data path to be activated to a logic HIGH.

The generation of an interrupt on the left interrupt signal line INT#L resulting from the granting of an access request to the left resource sharing device 205 for selected ones of the memory banks 401-0~401-7, can be overridden by the left resource sharing device 205 activating the interrupt mask signals for the data paths coupled to the left bank access grant signals corresponding to the selected memory banks. To do this, the left resource sharing device 205 provides a logic HIGH value on the corresponding data bits of the left internal data bus ID[15:0]L, provides an address (e.g., xx10 hex) indicative of the second flip-flops (e.g., 1204-0L~1204-7L) of the data paths to the left register decoder circuit 303, activates the left semaphore mode enable signal SEM#L, activates the left lower data byte enable control signal LB#L, and activates the write mode of the left read/write control signal R/W#L. The left register decoder 303 thereupon decodes the address to activate the select signal SEL[10]L, which in turn, enables each of the second flip-flops 1204-0L~1204-7L of the left interrupt control logic circuit 307, and the left semaphore I/O control logic circuit 900 activates the left semaphore lower data byte write enable signal SLBWEL which in turn, causes the logic HIGH value on the corresponding data bits of the left internal data bus ID[15:0]L to be clocked through to the Q-outputs of their corresponding second flip-flips, thereby causing the interrupt mask signal for those data paths to be activated to a logic HIGH.

As an example of such interrupt masking, if it is desired to mask interrupts normally generated when the semaphore logic circuit 302 grants access to the left resource sharing device 205 for memory banks 401-0 and 401-3, then the left resource sharing device 205 provides a logic HIGH value on the data bits ID[0]L and ID[3]L of the left internal data bus ID[15:0]L, provides an address (e.g., xx10 hex) indicative of the second flip-flops (e.g., 1204-0L~1204-7L) of the data paths to the left register decoder circuit 303, activates the left semaphore mode enable signal SEM#L, activates the left lower data byte enable control signal LB#L, and activates the write mode of the left read/write control signal R/W#L. The left register decoder 303 thereupon decodes the address to activate the select signal SEL[10]L, which in turn, enables each of the second flip-flops 1204-0L~1204-7L of the left interrupt control logic circuit 307, and the left semaphore I/O control logic circuit 900 activates the left semaphore lower data byte write enable signal SLBWEL which in turn, causes the logic HIGH value on the data bits ID[0]L and ID[3]L of the left internal data bus ID[15:0]L to be clocked through to the Q-outputs of corresponding second flip-flips, 1204-0L and 1204-3L, thereby causing the interrupt mask signal for data paths including the corresponding second flip-flips, 1204-0L and 1204-3L, to be activated to a logic HIGH and as a consequence, maintaining the outputs of their corresponding AND gates, 1201-0L and 1201-3L, at a logic LOW value regardless of the logic value on their corresponding coupled left bank access grant signals, SEMG[0]L and SEMG[3]L.

The right interrupt logic circuit 308 as depicted in FIG. 13, is generally constructed and operated like a mirror image of the left interrupt logic circuit 307. In particular, the right interrupt logic circuit 308 also includes a NOR gate 1202R having inputs coupled to eight right data paths individually including an AND gate (e.g., one of 1201-0R~1201-7R) having a first input receiving a corresponding one of the right bank access grant signals SEMG[0:7]R, a second input coupled to a first circuit generating an interrupt clear signal, and a third input coupled to a second circuit generating an interrupt mask signal, wherein the interrupt clear and mask signals are generated by the right resource sharing device 206 in the same fashion as described in reference to the left interrupt logic circuit 307 of FIG. 12.

Figure 16:
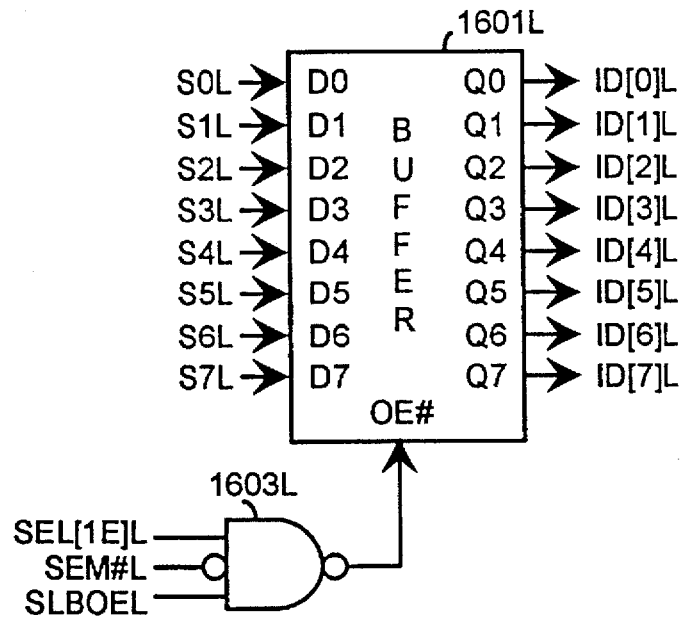
FIGS. 16 and 17 respectively illustrate, as examples, lower and upper byte registers with related output enabling circuitry for the left semaphore status register of the memory device of FIG. 2, utilizing aspects of the present invention.
Figure 17:
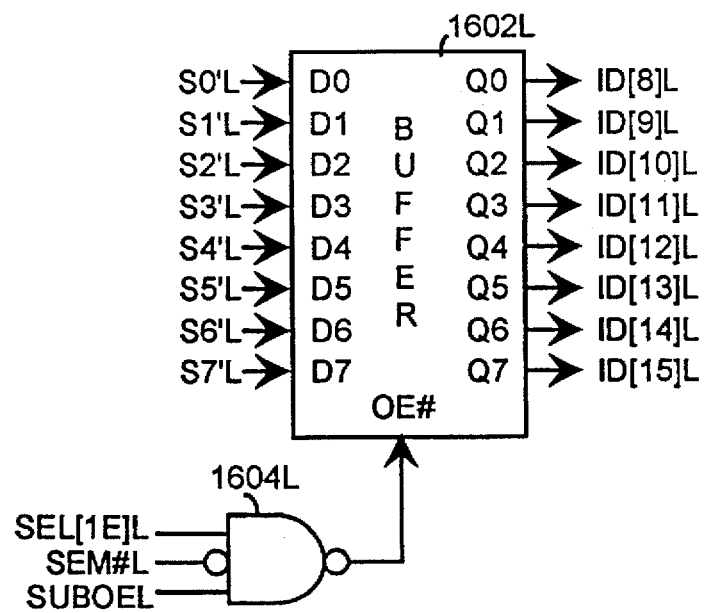
Figure 18:
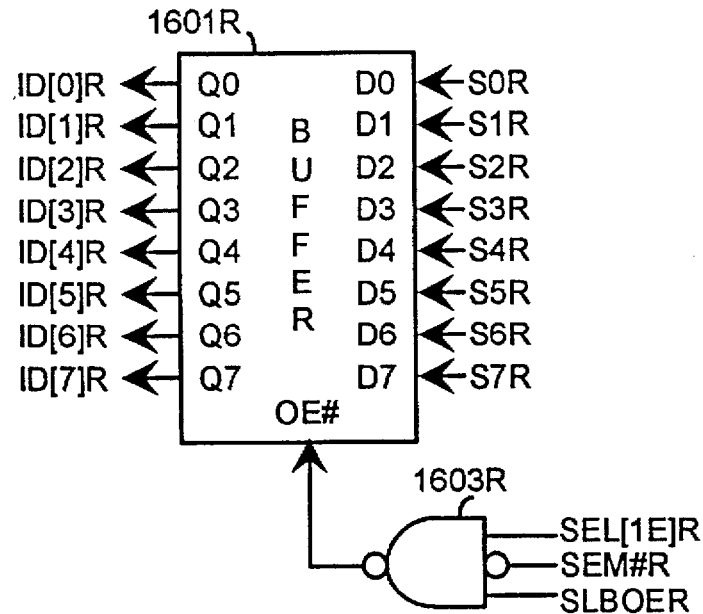
FIGS. 18 and 19 respectively illustrate, as examples, lower and upper byte registers with related output enabling circuitry for the right semaphore status register of the memory device of FIG. 2, utilizing aspects of the present invention.
Figure 19:
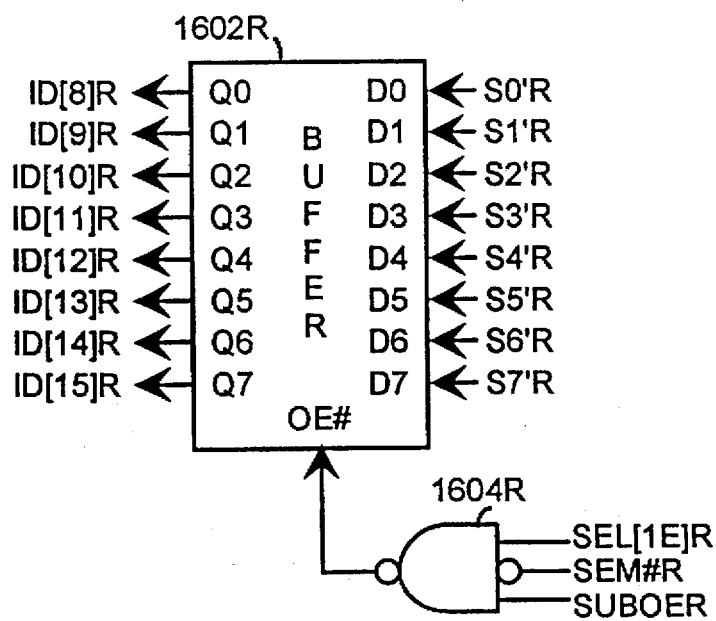
Figure 32:
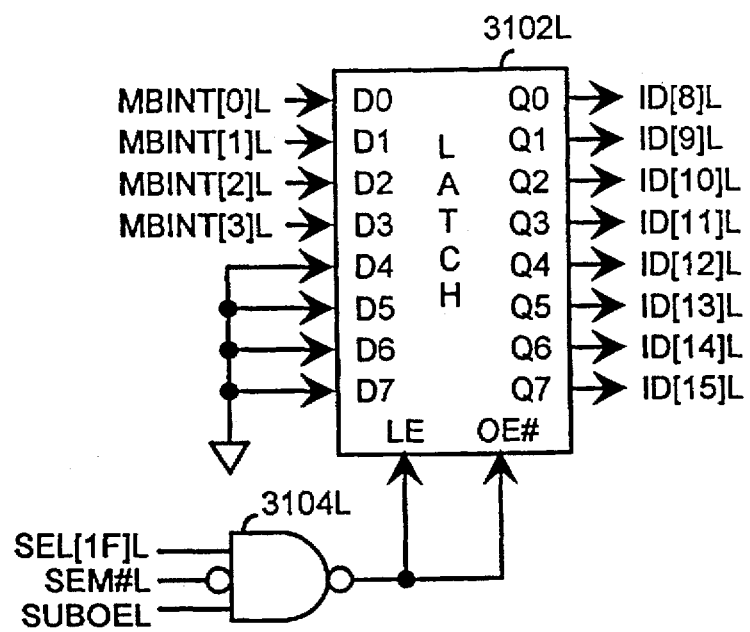
Figure 33:
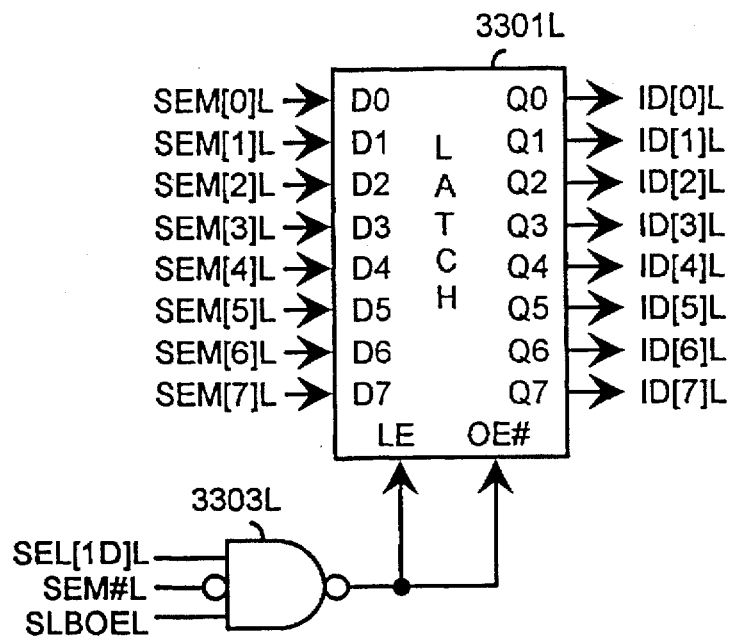
FIGS. 33 and 34 respectively illustrate, as examples, lower and upper byte registers with related output enabling circuitry for the left interrupt cause register of the memory device of FIG. 2, utilizing aspects of the present invention.
Figure 34:
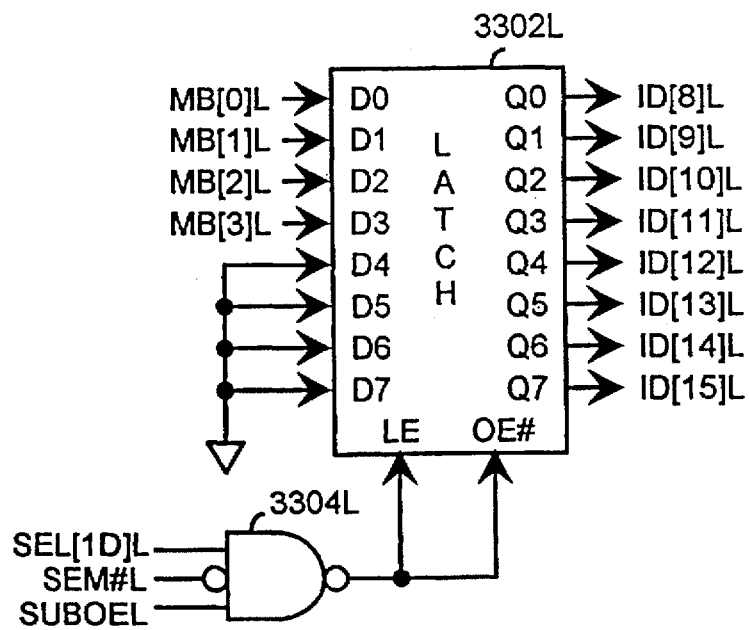
Figure 35:
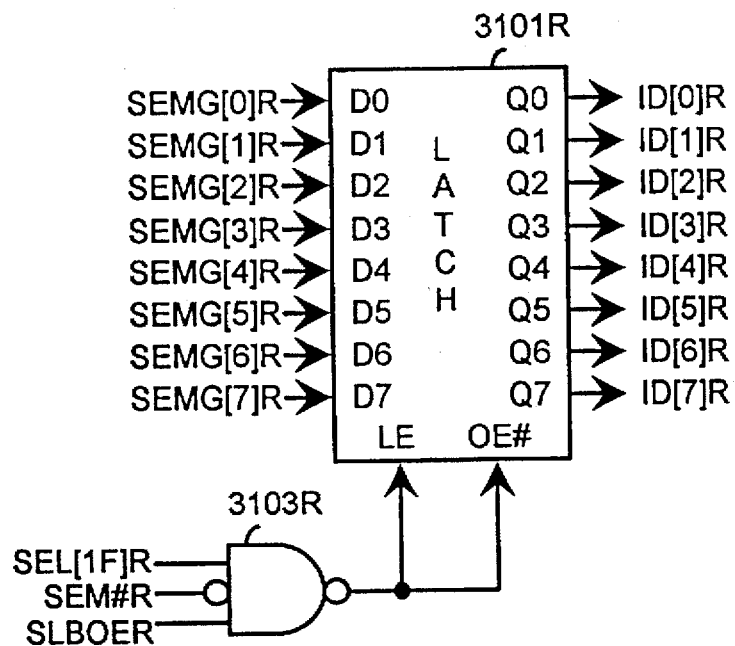
FIGS. 35 and 36 respectively illustrate, as examples, lower and upper byte registers with related output enabling circuitry for the right interrupt status register of the memory device of FIG. 2, utilizing aspects of the present invention.
Figure 36:
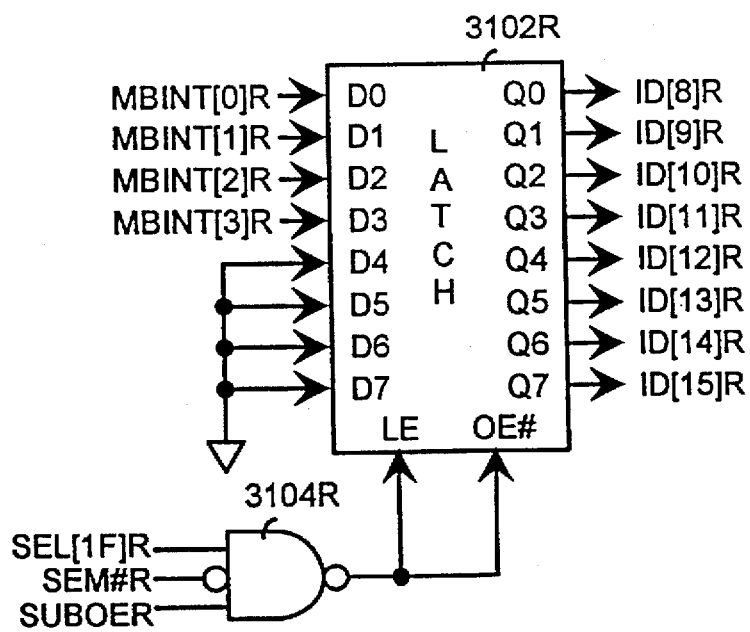
Figure 37:
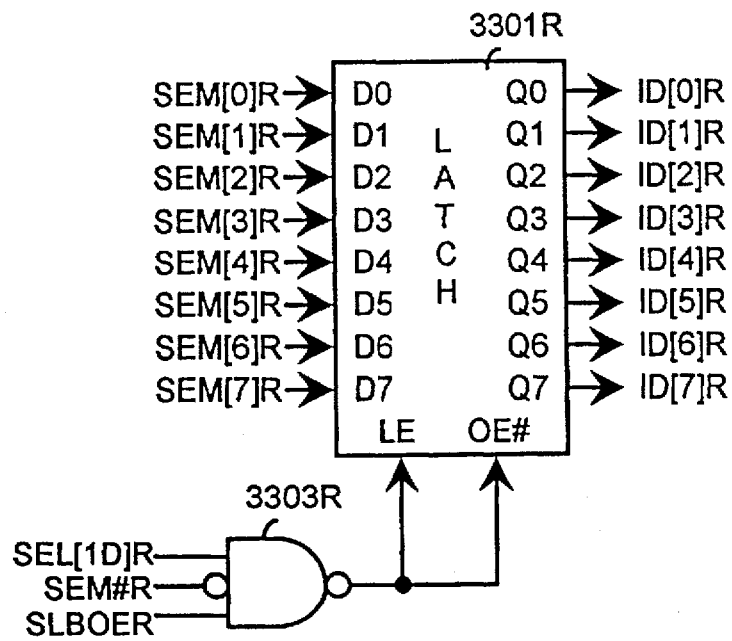
FIGS. 37 and 38 respectively illustrate, as examples, lower and upper byte registers with related output enabling circuitry for the right interrupt cause register of the memory device of FIG. 2, utilizing aspects of the present invention.
Figure 38:
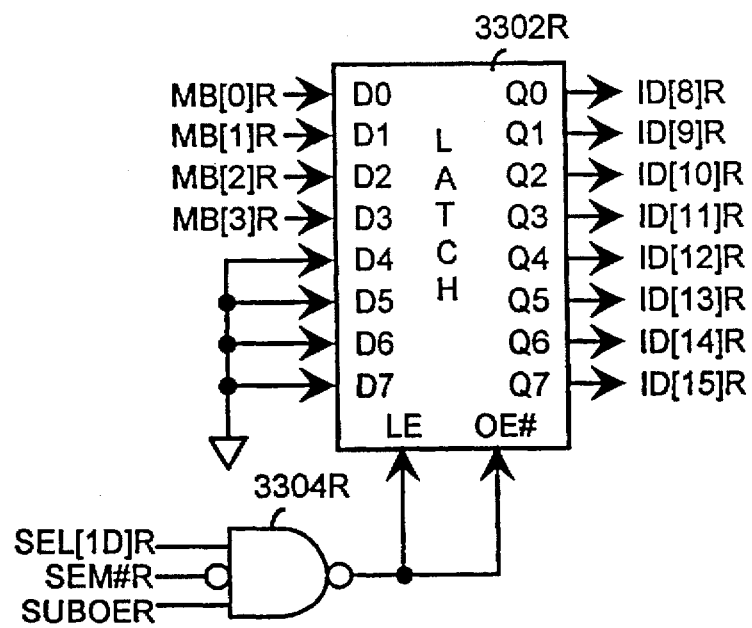
Figure 39:
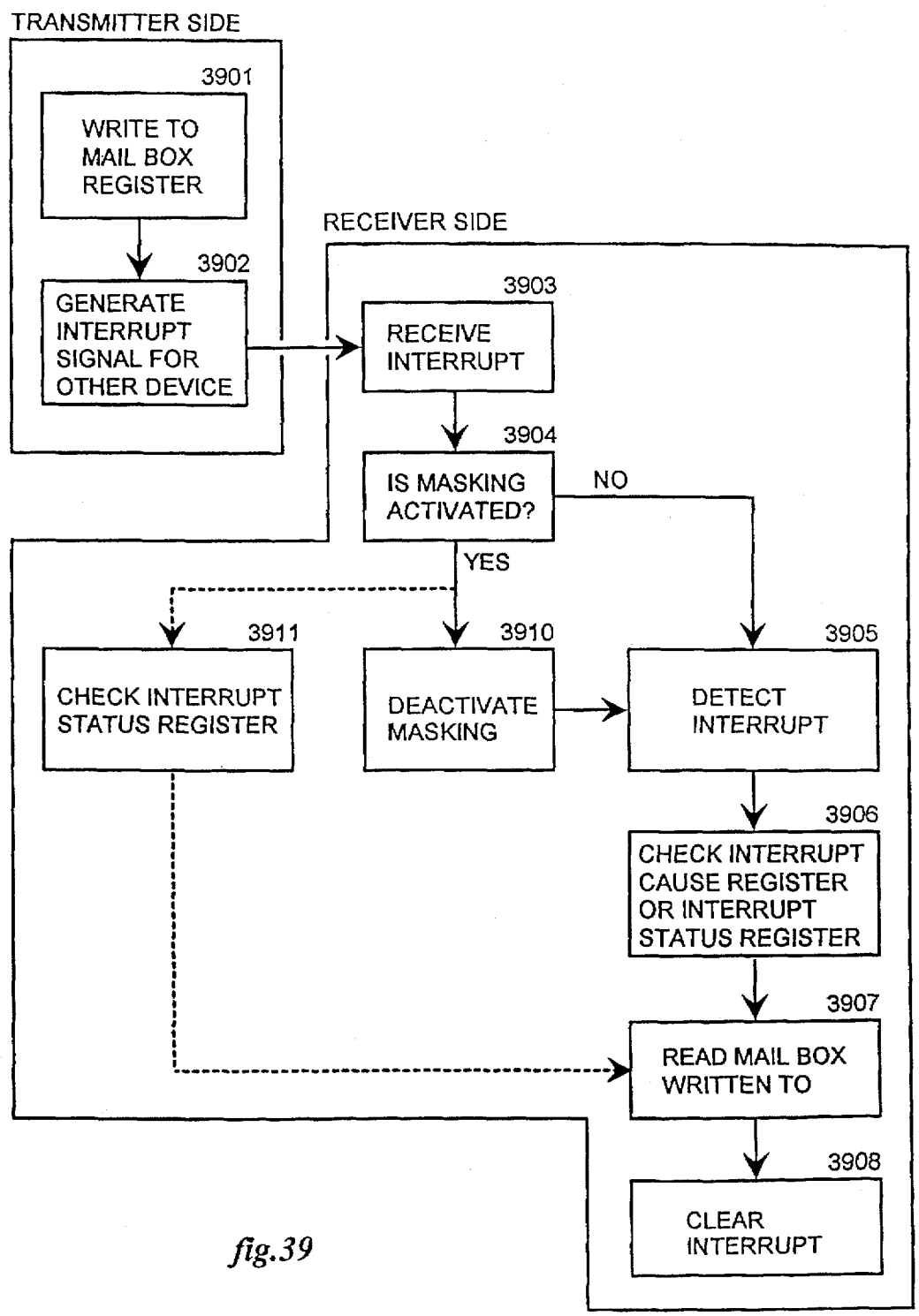
FIG. 39 illustrates, as an example, a flow diagram of the steps performed by a message transmitting one of the resource sharing devices, and the steps performed by a message receiving one of the resource sharing devices, utilizing the mail-box register aspects of the present invention.

The left status registers 309 include, as examples, a left interrupt status register addressable by address xx1F hex when the control signal line SEM#L is active LOW and including lower and upper byte buffers such as depicted in FIGS. 32 and 33, a left interrupt cause register addressable by address xx1D hex when the control signal line SEM#L is active LOW and including lower and upper byte buffers such as depicted in FIGS. 34 and 35, and a left semaphore status register addressable by address xx1E hex when the control signal line SEM#L is active LOW and including lower and upper byte buffers such as depicted in FIGS. 16 and 17. Similarly, the right status registers 310 include, as examples, a right interrupt status register addressable by address xx1F hex when the control signal line SEM#R is active LOW and including lower and upper byte buffers such as depicted in FIGS. 36 and 37, a right interrupt cause register addressable by address xx1D hex when the control signal line SEM#R is active LOW and including lower and upper byte buffers such as depicted in FIGS. 38 and 39, and a right semaphore status register addressable by address xx1E hex when the control signal line SEM#R is active LOW and including lower and upper byte buffers such as depicted in FIGS. 18 and 19. For descriptive purposes, registers referred to herein as "status" registers generally include pre-mask information, and registers referred to herein as "cause" registers generally include post-mask information. As an example, if a memory bank has been masked on the left side for interrupts, the left interrupt line INT#L will not be activated when the semaphore logic circuit 302 grants an access request from the left port 203 for that memory bank, and the bank access grant will not be indicated in the left interrupt cause register. The bank access grant will be indicated, however, in the left interrupt status register and the left semaphore status register.

Figure 14:
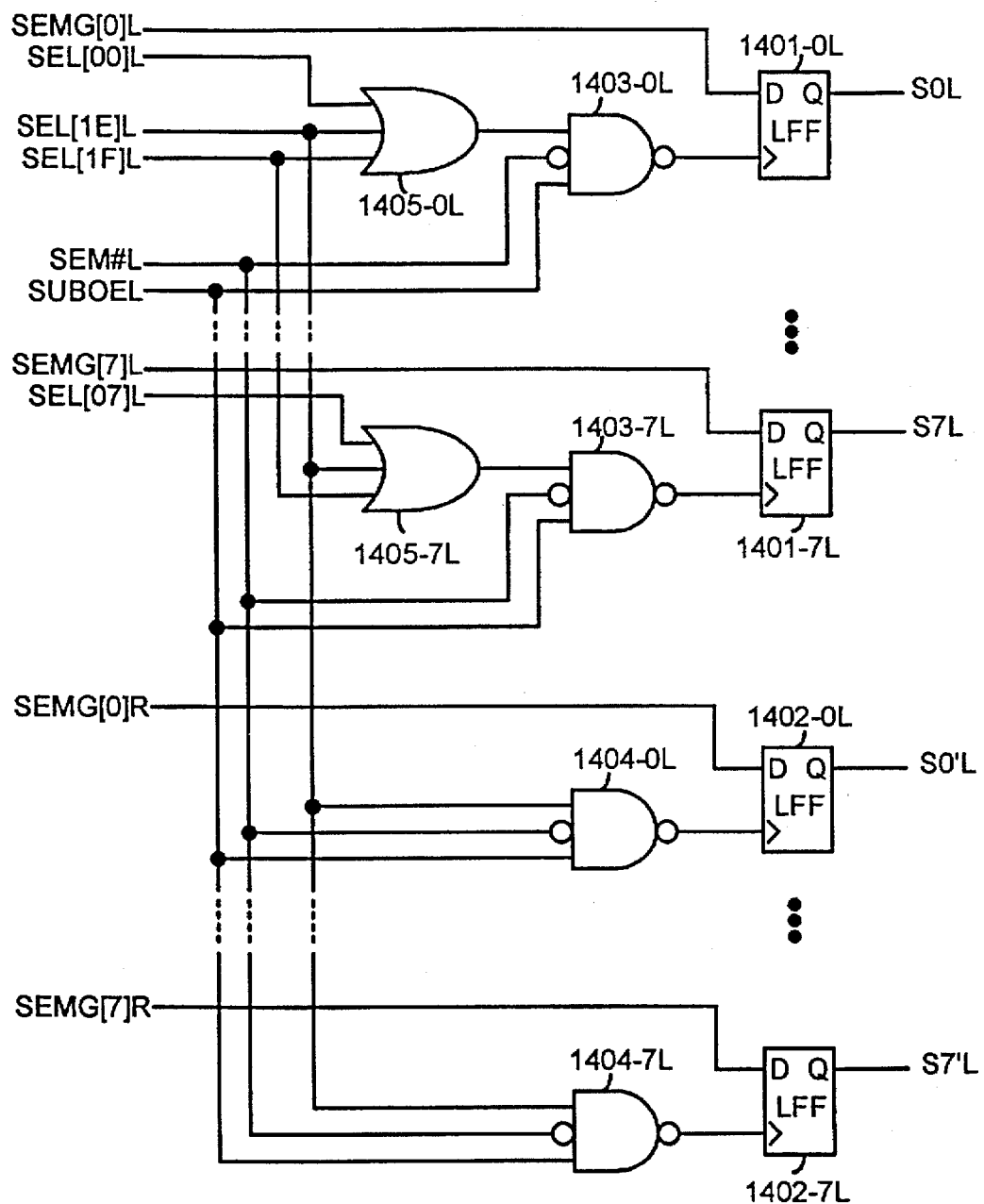
FIGS. 14 and 15 respectively illustrate, as examples, logic diagrams of the left and right status bit flip-flops of the memory device of FIG. 2, utilizing aspects of the present invention.
Figure 15:
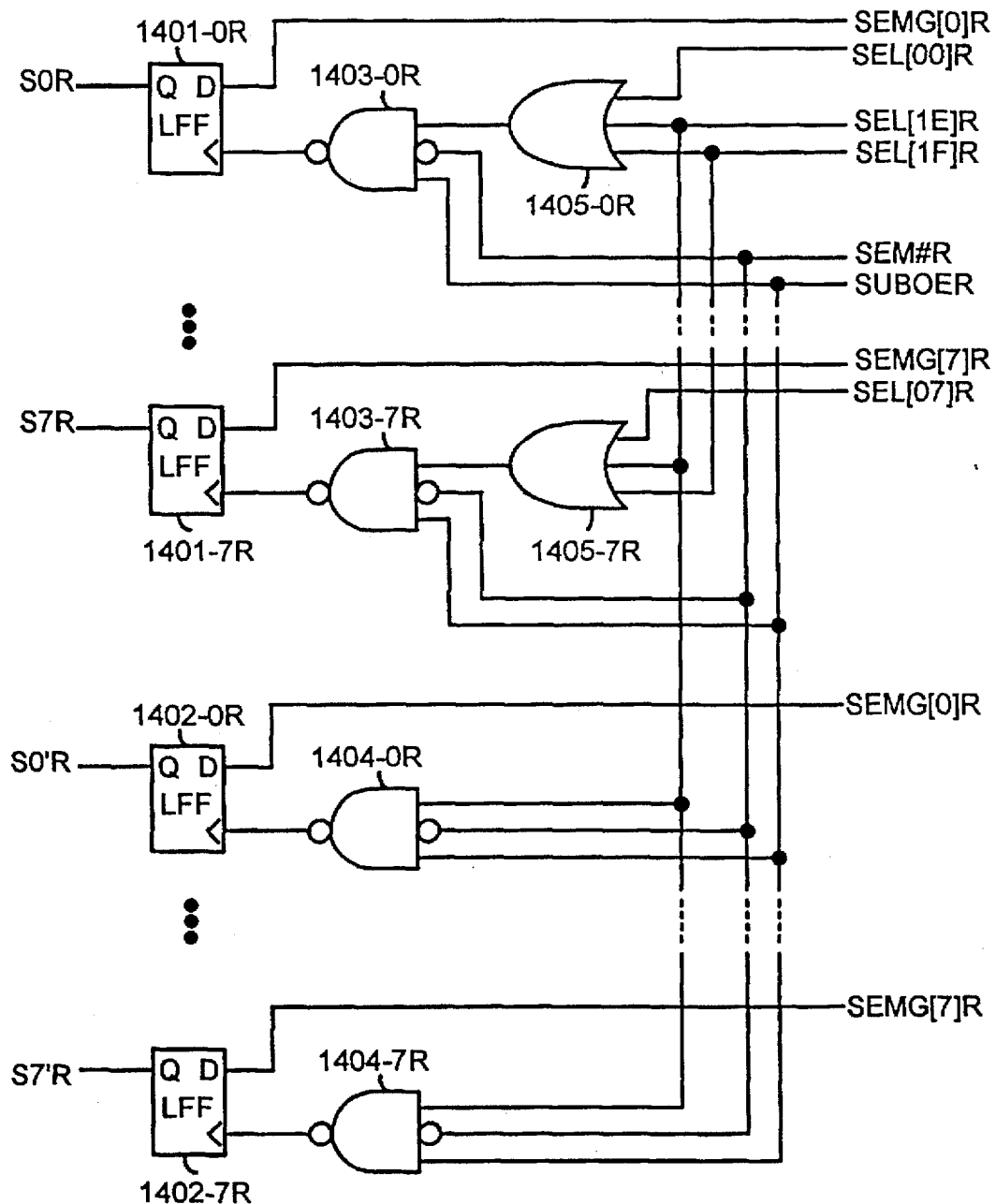

FIGS. 14 and 15 illustrate, as examples, certain left and right circuitry for generating semaphore left and right grant status bits. In particular, FIG. 14 illustrates a circuit for generating the semaphore left grant status bits, S0L~S7L and S0'L~S7'L, which are provided to the left semaphore status register depicted as the lower and upper byte buffers in FIGS. 16 and 17, wherein the status bits S0L~S7L respectively indicate the access granted status of memory banks 401-0~401-7 to the left resource sharing device 205, and the status bits S0'L~S7'L respectively indicate the access granted status of memory banks 401-0~401-7 to the right resource sharing device 206. Similarly, FIG. 15 illustrates a circuit for generating the semaphore right grant status bits, S0R~S7R and S0'R~S7'R, which are provided to the right semaphore status register depicted as the lower and upper byte buffers in FIGS. 18 and 19, wherein the status bits S0R~S7R respectively indicate the access granted status of memory banks 401-0~401-7 to the right resource sharing device 206, and the status bits S0'R~S7'R respectively indicate the access granted status of memory banks 401-0~401-7 to the left resource sharing device 205.

Individual ones of the semaphore left grant status bits S0L~S7L are generated on Q-outputs of corresponding flip-flops 1401-0L~1401-7L by clocking through the left bank access grant signals SEMG[0:7]L provided to D-inputs of the flip-flops, when the left resource sharing device 205 activates its semaphore mode enable line SEM#L, activates its output enable line OE#L, activates its upper data byte enable line UB#L, activates the read mode on its read/write line R/W#L, and provides an address on the left address bus A[15:0]L which is indicative of either the individual ones of the flip-flops 1401-0L~1401-7L (e.g., addresses xx00~xx07 hex), the left semaphore status register as depicted in FIGS. 16 and 17 (e.g., address xx1E hex), or the left interrupt status register as depicted in FIGS. 32 and 33 (e.g., address xx1F hex). On the other hand, individual ones of the semaphore left grant status bits S0'L~S7'L are generated on Q-outputs of corresponding flip-flops 1402-0L~1402-7L by clocking through the right bank access grant signals SEMG[0:7]R provided to D-inputs of the flip-flops, when the left resource sharing device 205 activates its semaphore mode enable line SEM#L, activates its output enable line OE#L, activates its upper data byte enable line UB#L, activates the read mode on its read/write line R/W#L, and provides an address on the left address bus A[15:0]L which is indicative of the left semaphore status register as depicted in FIGS. 16 and 17 (e.g., address xx1E hex).

In a similar fashion, individual ones of the semaphore right grant status bits S0L~S7R are generated on Q-outputs of corresponding flip-flops 1401-0R~1401-7R by clocking through the left bank access grant signals SEMG[0:7]R provided to D-inputs of the flip-flops, when the right resource sharing device 206 activates its semaphore mode enable line SEM#R, activates its output enable line OE#R, activates its upper data byte enable line UB#R, activates the read mode on its read/write line R/W#R, and provides an address on the right address bus A[15:0]R which is indicative of either the individual ones of the flip-flops 1401-0R~1401-7R (e.g., addresses xx00~xx07 hex), the right semaphore status register as depicted in FIGS. 18 and 19 (e.g., address xx1E hex), or the right interrupt status register as depicted in FIGS. 36 and 37 (e.g., address xx1F hex). Further, individual ones of the semaphore right grant status bits S0'R~S7'R are generated on Q-outputs of corresponding flip-flops 1402-0R~1402-7R by clocking through the left bank access grant signals SEMG[0:7]L provided to D-inputs of the flip-flops, when the right resource sharing device 206 activates its semaphore mode enable line SEM#R, activates its output enable line OE#R, activates its upper data byte enable line UB#R, activates the read mode on its read/write line R/W#R, and provides an address on the right address bus A[15:0]R which is indicative of the right semaphore status register as depicted in FIGS. 18 and 19 (e.g., address xx1E hex).

FIGS. 16 and 17 illustrate, as examples, lower and upper byte buffers, 1601L and 1602L, of the left semaphore status register. When its output enable input OE# is activated, the lower byte buffer 1601L latches the semaphore signals S0L~S7L, which are respectively indicative of the access granted status of memory banks 401-0~401-7 to the left resource sharing device 205, onto its Q-outputs Q0~Q7, which in turn, are coupled to the lower byte data lines ID[0]L~ID[7]L of the left internal data bus ID[15:0]L. Likewise, when its output enable input OE# is activated, the upper byte buffer 1602L latches the semaphore signals S0'L~S7'L, which are respectively indicative of the access granted status of memory banks 401-0~401-7 to the right resource sharing device 206, onto its Q-outputs Q0~Q7, which in turn, are coupled to the upper byte data lines ID[8]L~ID[15]L of the left internal data bus ID[15:0]L. NAND gate 1603L activates the output enable input OE# of the lower byte buffer 1601L when the left resource sharing device 205 reads from the left semaphore status register by providing the address xx1E hex on the left address bus A[15:0]L, and activating the left semaphore mode enable line SEM#L, the left lower data byte enable line LB#L, the left output enable line OE#L, and the read mode on the left read/write line R/W#L; and NAND gate 1604L activates the output enable input OE# of the upper byte buffer 1602L when the left resource sharing device 205 reads from the left semaphore status register by providing the address xx1E hex on the left address bus A[15:0]L, and activating the left semaphore mode enable line SEM#L, the left upper data byte enable line UB#L, the left output enable line OE#L, and the read mode on the left read/write line R/W#L.

FIGS. 18 and 19 illustrate, as examples, lower and upper byte buffers, 1601R and 1602R, of the right semaphore status register. When its output enable input OE# is activated, the lower byte buffer 1601R latches the semaphore signals S0R~S7R, which are respectively indicative of the access granted status of memory banks 401-0~401-7 to the right resource sharing device 206, onto its Q-outputs Q0~Q7, which in turn, are coupled to the lower byte data lines ID[0]R~ID[7]R of the right internal data bus ID[15:0]R. Likewise, when its output enable input OE# is activated, the upper byte buffer 1602R latches the semaphore signals S0'R~S7'R, which are respectively indicative of the access granted status of memory banks 401-0~401-7 to the left resource sharing device 205, onto its Q-outputs Q0~Q7, which in turn, are coupled to the upper byte data lines ID[8]R~ID[15]R of the right internal data bus ID[15:0]R. NAND gate 1603R activates the output enable input OE# of the lower byte buffer 1601R when the right resource sharing device 206 reads from the right semaphore status register by providing the address xx1E hex on the right address bus A[15:0]R, and activating the right semaphore mode enable line SEM#R, the right lower data byte enable line LB#R, the right output enable line OE#R, and the read mode on the right read/write line R/W#R; and NAND gate 1604R activates the output enable input OE# of the upper byte buffer 1602R when the right resource sharing device 206 reads from the right semaphore status register by providing the address xx1E hex on the right address bus A[15:0]R, and activating the right semaphore mode enable line SEM#R, the right upper data byte enable line UB#R, the right output enable line OE#R, and the read mode on the right read/write line R/W#R.

Figure 20:
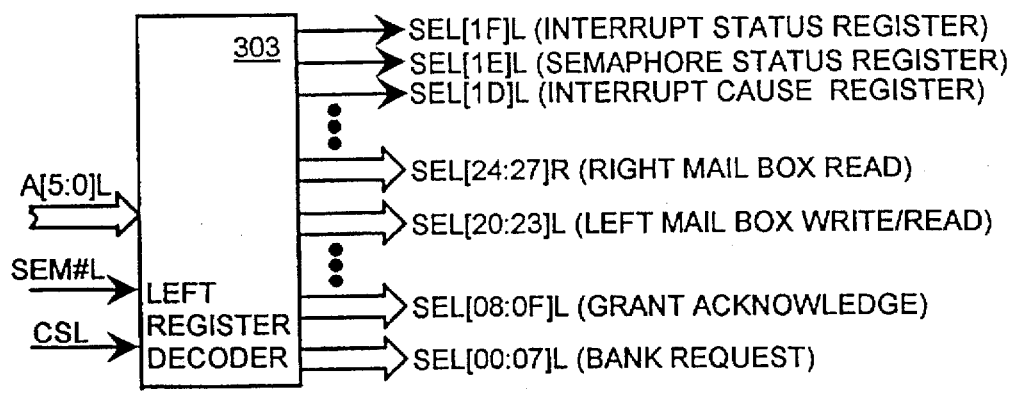
FIGS. 20 and 21 respectively illustrate, as examples, block diagrams including inputs and outputs of the left and right register decoder circuits of the memory device of FIG. 2, utilizing aspects of the present invention.
Figure 21:
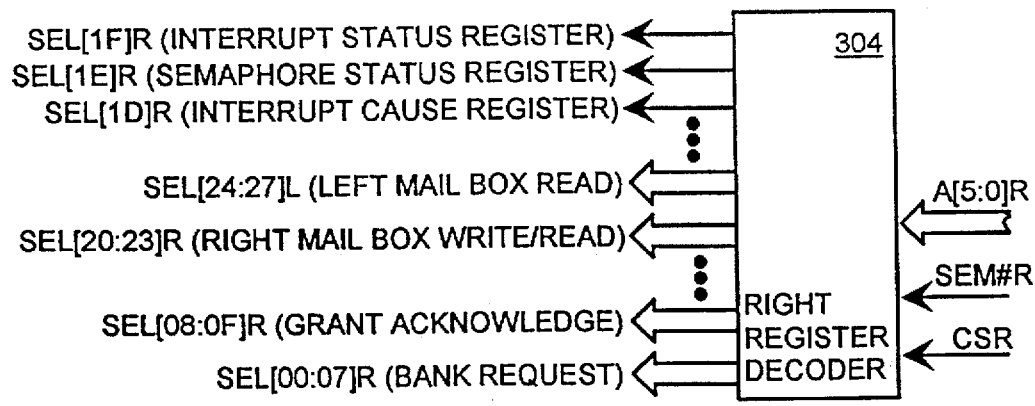

FIGS. 20 and 21 illustrate, as examples, block diagrams respectively detailing the inputs and some of the outputs of the left and right register decoder circuits, 303 and 304. The left register decoder circuit 303 is coupled to the left address bus A[15:0]L, the left semaphore mode enable line SEM#L, and preferably the left chip select line CSL, to receive addresses indicative of left-side registers from the left address bus A[15:0]L during a left-side semaphore mode. Likewise, the right register decoder circuit 304 is coupled to the right address bus A[15:0]R, the right semaphore mode enable line SEM#R, and preferably the right chip select line CSR, to receive addresses indicative of right-side registers from the right address bus A[15:0]R during a right-side semaphore mode.

In particular, the left and right decoder circuits, 303 and 304, decode the first six bits A[5:0] of an address received from respectively the left and right address buses, A[15:0]L and A[15:0]R, to generate a selected one of up to thirty-two left and right register enable signals as partially summarized in Tables I through IV below when their respective semaphore mode enable lines are active and chip select lines inactive. Other register addresses not included in the following tables, but shown in FIGS. 20 and 21 are the address xx1D for the left and right interrupt cause registers such as depicted in FIGS. 34~35 and 38~39, the address xx1E for the left and right semaphore status registers such as depicted in FIGS. 16~19, and the address xx1F for the left and right interrupt status registers such as depicted in FIGS. 32~33 and 36~37.

TABLE I

Register Addresses for Bank Access Requests.

| Address | Register | Signal | Description |
|---|---|---|---|
| xx00 | 1101-0L/R | SEL[00]L/R | Memory bank 401-0 access request. |
| xx01 | 1101-1L/R | SEL[01]L/R | Memory bank 401-1 access request. |
| xx02 | 1101-2L/R | SEL[02]L/R | Memory bank 401-2 access request. |
| xx03 | 1101-3L/R | SEL[03]L/R | Memory bank 401-3 access request. |
| xx04 | 1101-4L/R | SEL[04]L/R | Memory bank 401-4 access request. |
| xx05 | 1101-5L/R | SEL[05]L/R | Memory bank 401-5 access request. |
| xx06 | 1101-6L/R | SEL[06]L/R | Memory bank 401-6 access request. |
| xx07 | 1101-7L/R | SEL[07]L/R | Memory bank 401-7 access request. |

As an example clarifying the use of Table I, when the left resource sharing device 205 requests access to the memory bank 401-0, it provides the address xx00 hex on the left address bus A[15:0]L (where the descriptor "xx" indicates that the upper address byte has no consequence), and the left register decoder 303 decodes this address to enable the bank select signal SEL[00]L coupled to the clock input of the left semaphore register (or flip-flop) 1101-0L of the semaphore logic circuit 302, as depicted in FIG. 11. Likewise, when the right resource sharing device 206 also requests access to the memory bank 401-0, it provides the address xx00 hex on the right address bus A[15:0]R, and the right register decoder 304 decodes this address to enable the bank select signal SEL[00]R coupled to the clock input of the right semaphore register (or flip-flop) 1101-0R of the semaphore logic circuit 302. The semaphore logic circuit 302 thereupon grants the first received one of the access requests from the left and right resource sharing devices, 205 and 206, for the memory 401-0 by activating the appropriate one of the bank access grant signals, SEMG[0]L or SEMG[0]R.

TABLE II

Register Addresses for Semaphore Interrupt Acknowledge/Clear.

| Address | Register | Signal | Description |
|---|---|---|---|
| xx08 | 1203-0L/R | SEL[08]L/R | Memory bank 401-0 int. clear. |
| xx09 | 1203-1L/R | SEL[09]L/R | Memory bank 401-1 int. clear. |
| xx0A | 1203-2L/R | SEL[0A]L/R | Memory bank 401-2 int. clear. |
| xx0B | 1203-3L/R | SEL[0B]L/R | Memory bank 401-3 int. clear. |
| xx0C | 1203-4L/R | SEL[0C]L/R | Memory bank 401-4 int. clear. |
| xx0D | 1203-5L/R | SEL[0D]L/R | Memory bank 401-5 int. clear. |
| xx0E | 1203-6L/R | SEL[0E]L/R | Memory bank 401-6 int. clear. |
| xx0F | 1203-7L/R | SEL[0F]L/R | Memory bank 401-7 int. clear. |

As an example clarifying the use of Table II, when the left resource sharing device 205 detects an interrupt condition on the left interrupt line INT#L, it first determines the source of the interrupt by examining, for example, the left interrupt cause register comprising upper and lower byte latches such as depicted in FIGS. 34 and 35. If the interrupt condition is caused by the semaphore logic circuit 302 granting of an access request from the left resource sharing device 205 for the memory bank 401-0, then the left resource sharing device 205 can clear the left interrupt line INT#L by providing a logic HIGH value on the LSB D[0]L of the left external data bus D[15:0]L, providing the address xx08 hex, corresponding to the flip-flop 1203-0L, on the left address bus A[15:0]L, activating the left semaphore mode enable line SEM#L, activating the left lower data byte enable line LB#L, and activating the write mode on the left read/write line R/W#L.

TABLE III

Register Address for Masking Semaphore Interrupts.

| Address | Register | Signal | DataBit | Description |
|---|---|---|---|---|
| xx10 | 1204-0L/R | SEL[10]L/R | D[0]L/R | Mask memory bank 401-0. |
|  | 1204-1L/R | SEL[10]L/R | D[1]L/R | Mask memory bank 401-1. |
|  | 1204-2L/R | SEL[10]L/R | D[2]L/R | Mask memory bank 401-2. |
|  | 1204-3L/R | SEL[10]L/R | D[3]L/R | Mask memory bank 401-3. |
|  | 1204-4L/R | SEL[10]L/R | D[4]L/R | Mask memory bank 401-4. |
|  | 1204-5L/R | SEL[10]L/R | D[5]L/R | Mask memory bank 401-5. |
|  | 1204-6L/R | SEL[10]L/R | D[6]L/R | Mask memory bank 401-6. |
|  | 1802-7L/R | SEL[10]L/R | D[7]L/R | Mask memory bank 401-7. |

As an example clarifying the use of Table III, for the left resource sharing device 205 to mask or override interrupts on the left interrupt line INT#L resulting from the semaphore logic circuit 302 granting bank access requests from the left resource sharing device 205 for the memory banks 401-0 and 401-3, the left resource sharing device 205 provides logic HIGH values in the data bits D[0]L and D[3]L and logic LOW values on all other data bits of the left external data bus D[15:0]L, provides the address xx10 hex on the left address bus A[15:0]L, activates the left semaphore mode enable line SEM#L, activates the left lower data byte enable line LB#L, and activates the write mode on the left read/write line R/W#L.

TABLE IV

Register Addresses for checking Semaphore Status Bits.

| Address | Register | Signal | Description |
|---|---|---|---|
| xx00 | 1401-0L/R | SEL[00][L/R | Status of request for bank 401-0. |
| xx01 | 1401-1L/R | SEL[01][L/R | Status of request for bank 401-1. |
| xx02 | 1401-2L/R | SEL[02][L/R | Status of request for bank 401-2. |
| xx03 | 1401-3L/R | SEL[03][L/R | Status of request for bank 401-3. |
| xx04 | 1401-4L/R | SEL[04][L/R | Status of request for bank 401-4. |
| xx05 | 1401-5L/R | SEL[05][L/R | Status of request for bank 401-5. |
| xx06 | 1401-6L/R | SEL[06][L/R | Status of request for bank 401-6. |
| xx07 | 1401-7L/R | SEL[07][L/R | Status of request for bank 401-7. |

As an example clarifying the use of Table IV, if the left resource sharing device 205 requests access to memory bank 401-0, then it can subsequently check whether it has been granted access to that memory bank by providing the address xx00 hex on the left address data bus, activating the left semaphore mode enable line SEM#L, activating the left output enable line OE#L, activating the left upper byte enable line UB#L, and activating the read mode on the left read/write line R/W#L. If access has been granted by the semaphore logic circuit 302 to the left resource sharing device 205 for the memory bank 401-0, then preferably all of the data bits on the left external data bus D[15:0]L will read logic HIGH values. On the other hand, if access has not been granted, then preferably all of the data bits on the left external data bus D[15:0]L will read logic LOW values.

Figure 22:
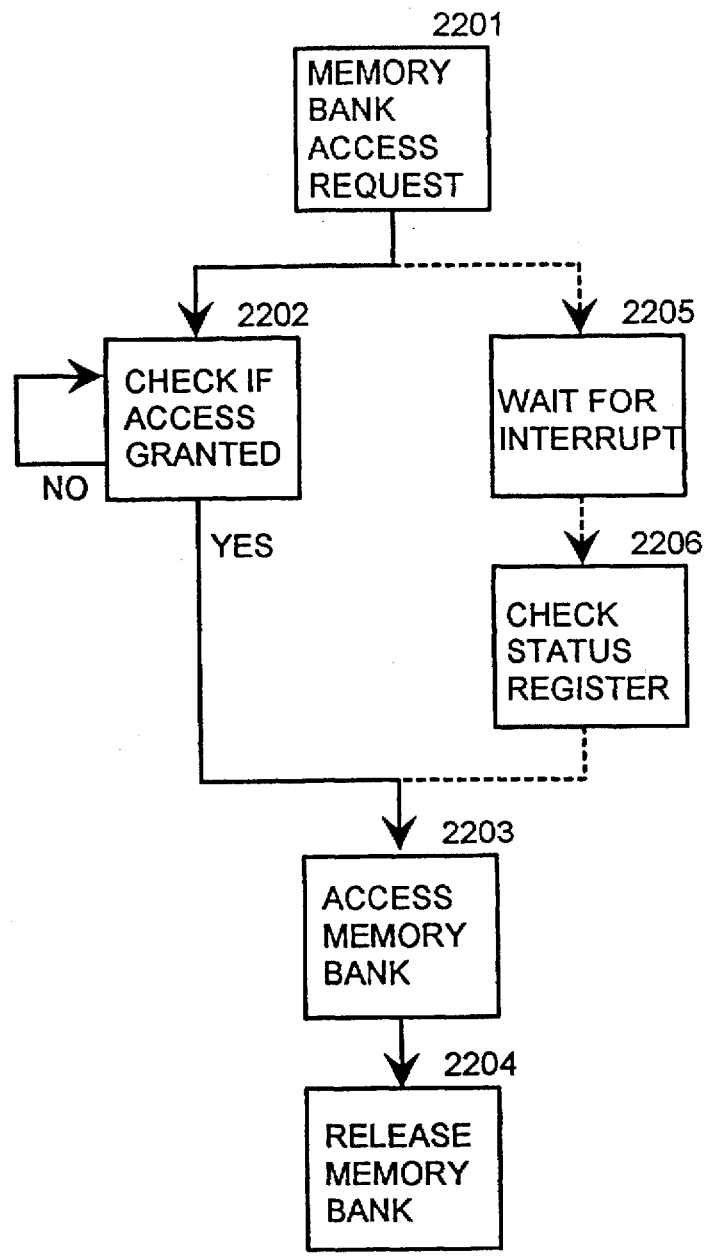
FIG. 22 illustrates, as an example, a flow diagram of steps performed by a resource sharing electronic device when accessing the memory device of FIG. 2, utilizing aspects of the present invention.

FIG. 22 illustrates, as an example, a flow diagram of the steps performed by one of the resource sharing electronic devices, 205 or 206, when accessing a memory bank of the memory device 201. In a first step 2201, the resource sharing electronic device (e.g. 205) first requests access to a particular memory bank (e.g., 401-0) by, for example, entering the semaphore mode by activating its semaphore mode enable control line (e.g., SEM#L placed active LOW) while not activating its chip select control line (e.g., CSL placed inactive LOW), and requesting access to the memory bank by providing an address (e.g., xx00 hex) corresponding to a semaphore register (e.g., 1101-0L) associated with the memory bank (e.g., 401-0) on its address bus (e.g., A[15:0]L), providing a data word having a predetermined value such as zero in a predetermined location such as the LSB location of the lower data byte on its external data bus (e.g., D[15:0]L), activating its lower data byte enable control line (e.g., LB#L placed LOW), and activating the write mode on its read/write control line (e.g., R/W#L placed LOW), in accordance with Table I.

The semaphore logic circuit 301 receives the access request from the access requesting device (e.g., 205), and grants the request by, for example, activating an appropriate one of its bank access grant signals (e.g., SEMG[0]L), if the request is received before a request for the same memory bank from another resource sharing electronic device (e.g., 206), and if the memory bank is not already being accessed by another resource sharing electronic device (e.g., 206).

After performing step 2201, the access requesting electronic device (e.g. 205) may determine whether access to the requested memory bank has been granted by performing step 2202, or alternatively, steps 2205 and 2206. In step 2202, the access requesting device (e.g., 205) can determine which requested memory banks it has been granted access to by checking, for examples, the contents of its corresponding semaphore status register (e.g., FIGS. 16-17), interrupt cause register (e.g., FIGS. 33-34), or interrupt status register (e.g., FIGS. 31-32). If upon such checking, it is determined that access has not been granted for a requested memory bank, the access requesting device (e.g., 205) may then periodically recheck the contents of the corresponding semaphore status, interrupt cause, or interrupt status register until it is determined that access for the requested memory bank has been granted. Alternatively, the access requesting device (e.g., 205) can perform steps 2205 and 2206 instead of step 2202 to determine whether it has been granted access to a requested memory bank. In steps 2205 and 2206, the access requesting device (e.g., 205) does not check the contents of its semaphore status, interrupt cause, or interrupt status register until it receives an interrupt signal on its interrupt control line (e.g., INT#L). Accordingly, the access requesting device (e.g., 205) is free to perform other important tasks until an interrupt signal is received using this alternative approach.

In step 2203, the access requesting device (e.g., 205) enters the memory banks access mode after being granted sole access to a requested memory bank, by activating its chip select control signal line (e.g., CSL placed HIGH) while deactivating its semaphore mode enable control signal line (e.g., SEM#L placed HIGH), and accesses the access granted memory bank in a conventional fashion by, for example, providing appropriate memory addresses on its address bus (e.g., A[15:0]L), control signals on its control signal lines (e.g., R/W#L, OE#L, UB#L and LB#L), and data on its external data bus (e.g., D[15:0]L), as appropriate.

In step 2204, the access requesting device (e.g., 205) once again enters the semaphore mode after completing its accessing of the access granted memory bank, by activating its semaphore mode enable control line (e.g., SEM#L placed LOW) while not activating its chip select control line (e.g., CSL placed LOW), and releases the accessed memory bank by providing an address corresponding to the semaphore register associated with the memory bank on its address bus (e.g., A[15:0]L), providing a data word having another predetermined value such as one in a predetermined location such as the least-significant bit location of the lower data byte on its data bus (e.g., D[15:0]L), activating its lower data byte enable control line (e.g., LB#L placed LOW), and activating the write mode on its read/write control line (e.g., R/W#L placed LOW), again, in accordance with Table I.

Mail-box Registers

Figure 23:
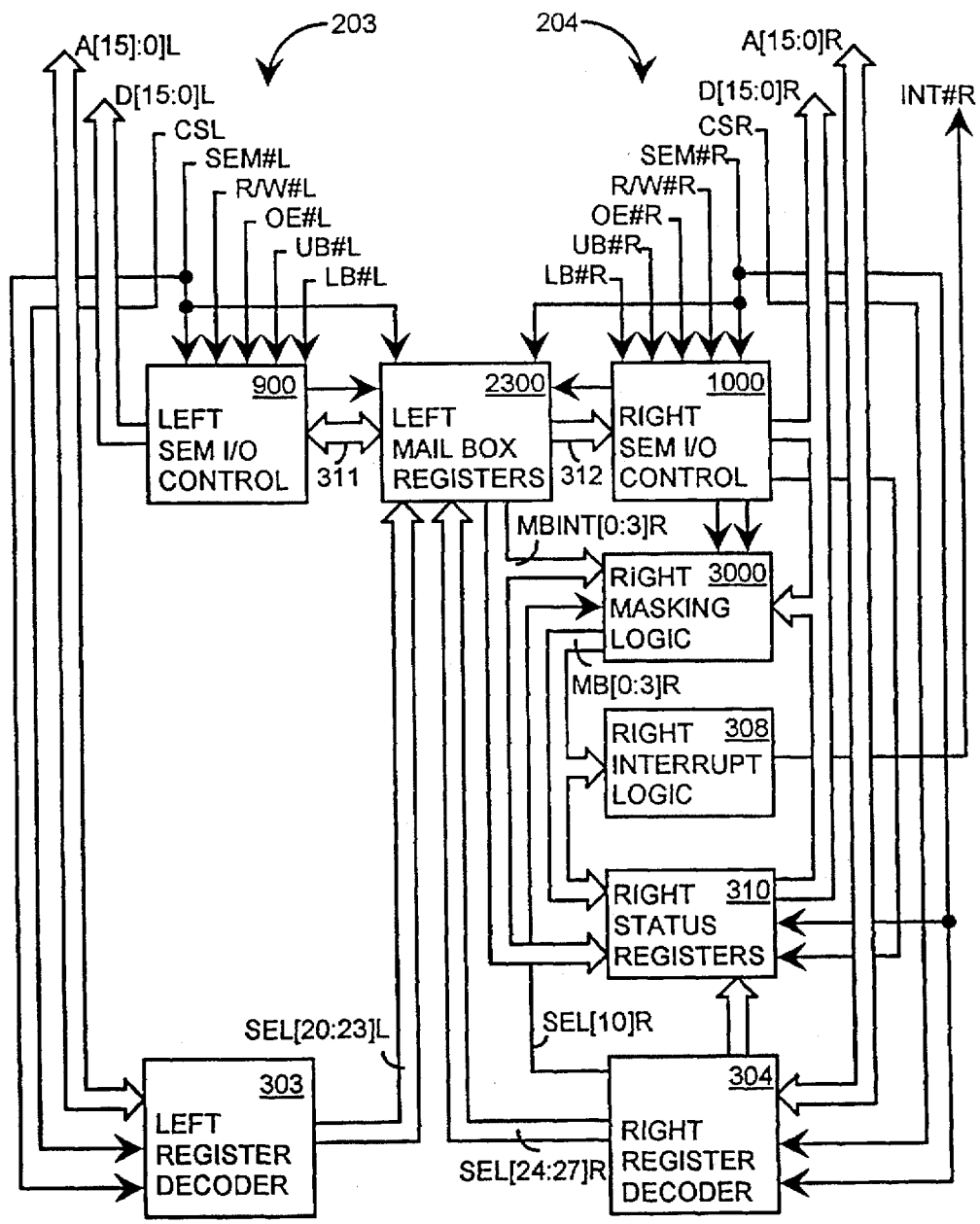
FIGS. 23 and 24 respectively illustrate, as examples, block diagrams of portions of the memory device of FIG. 2, respectively including left and right mail-box registers with related I/O enabling and interrupt generating circuitry, utilizing aspects of the present invention.
Figure 24:
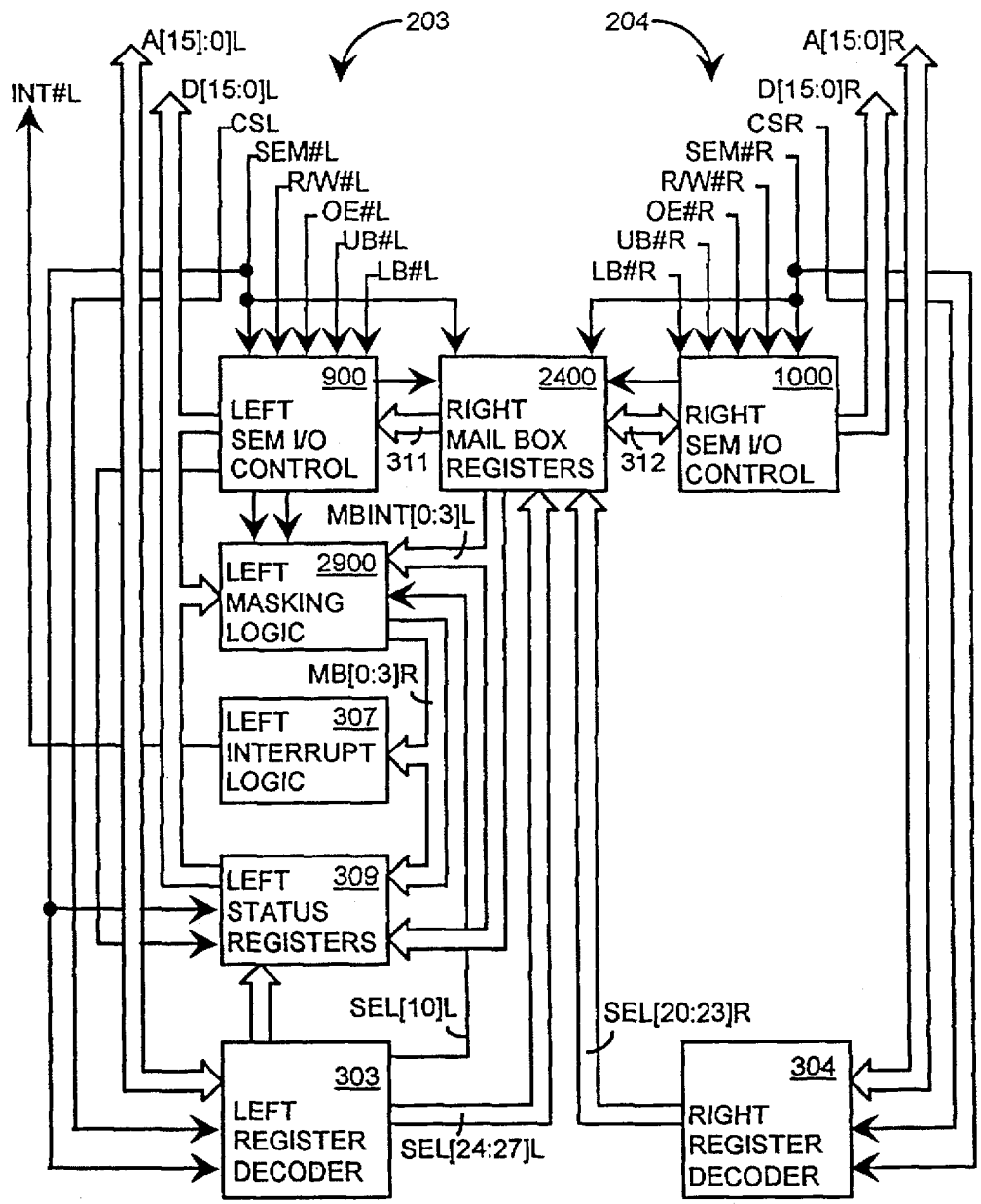

FIG. 23 and 24 illustrate, as examples, block diagrams of portions of the memory device 201 respectively including left mail-box registers with related I/O enabling and interrupt generating circuitry combined as block 2300, and right mail-box registers with related I/O enabling and interrupt generating circuitry combined as block 2400. The left mail-box registers include four registers, 2500-0L~2500-3L, which function as addressable read-write registers for the left resource sharing device 205 and addressable read-only registers for the right resource sharing device 206, through which, the left resource sharing device 205 can send messages or data without waiting to the right resource sharing device 206. Likewise, the right mail registers also include four registers, 2500-0R~2500-3R, which conversely function as addressable read-only registers for the left resource sharing device 205 and addressable read-write registers for the right resource sharing device 206, through which, the right resource sharing device 206 can send messages or data without waiting to the left resource sharing device 205.

The left and right mail-box registers, 2500-0L~2500-3L and 2500-0R~2500-3R, are separate from the memory banks 401-0~401-3 and consequently, are accessed in the semaphore mode by activating the left or right semaphore mode enable signal, SEM#L or SEM#R, as appropriate, without intervention from the semaphore logic circuit 302 of the memory device 201. Since the memory banks 401-0~401-3 and the semaphore logic circuit 302 are not necessary for understanding the operation and use of the left and right mail-box registers, 2500-0L~2500-3L and 2500-0R~2500-3R, these blocks have been omitted from the portions of the memory device 201 depicted in FIGS. 23 and 24, in order not to overly burden the drawings or overly complicate the following description.

To facilitate the following descriptions of FIGS. 23-39, left and right semaphore write and read modes are defined as follows. In a left semaphore write mode, the left resource sharing device 205 writes to selected ones of the left mail-box registers 2500-0L~2500-3L by, for example, providing addresses xx20~xx23 hex respectively corresponding to the left mail-box registers on the left address bus A[15:0]L, data to be written into the left mail-box registers on the left external data bus D[15:0]L, and activating the left semaphore mode enable line SEM#L and the write mode of the left read/write line R/W#L. In a right semaphore write mode, the right resource sharing device 206 writes to selected ones of the right mail-box registers 2500-0R~2500-3R by, for example, providing addresses xx20~xx23 hex respectively corresponding to the right mail-box registers on the right address bus A[15:0]R, data to be written into the right mail-box registers on the right external data bus D[15:0]R, and activating the right semaphore mode enable line SEM#R and the write mode of the right read/write line R/W#R. In a left-left semaphore read mode, the left resource sharing device 205 reads from the left mail-box registers 2500-0L~25003L by, for example, providing addresses xx20~xx23 hex respectively corresponding to the left mail-box registers on the left address bus A[15:0]L, and activating the left semaphore mode enable line SEM#L, the left output enable line OE#L and the read mode of the left read/write line R/W#L. In a right-left semaphore read mode, the right resource sharing device 206 reads from the left mail-box registers 2500-0L~2500-3L by, for example, providing addresses xx24~xx27 hex respectively corresponding to the left mail-box registers on the right address bus A[15:0]R, and activating the right semaphore mode enable line SEM#R, the right output enable line OE#R, and the read mode of the right read/write line R/W#R. In a right-right semaphore read mode, the right resource sharing device 206 reads from the right mail-box registers 2500-0R~2500-3R by, for example, providing addresses xx20~xx23 hex respectively corresponding to the right mail-box registers on the right address bus A[15:0]R, and activating the right semaphore mode enable line SEM#R, the right output enable line OE#R, and the read mode of the right read/write line R/W#R. In a left-right semaphore read mode, the left resource sharing device 205 reads from the right mail-box registers 2500-0R~2500-3R by, for example, providing addresses xx24~xx27 hex respectively corresponding to the right mail-box registers on the left address bus A[15:0]L, and activating the left semaphore mode enable line SEM#L, the left output enable line OE#L and the read mode of the left read/write line R/W#L.

Referring now to FIG. 23, the left port 203, left semaphore I/o control logic circuit 900, and left register decoder circuit 303 are employed by the left resource sharing device 205 in writing to and reading from the left mail-box registers 2500-0L~2500-3L; and the right port 204, right semaphore I/O control logic circuit 1000, and right register decoder circuit 304 are employed by the right resource sharing device 206 in reading from the left mail-box registers 2500-0L~2500-3L. The right interrupt logic circuit 308 generates in response to the left resource sharing device 205 writing into the left mail-box registers 2500-0L~2500-3L, an interrupt condition on the right interrupt line INT#R. A right masking logic circuit 3000 selectably masks interrupt conditions otherwise generated by the right interrupt logic circuit 308 on the right interrupt line INT#R, and the right status registers 310 provide to the right resource sharing device 206, among other things, information indicative of writings into the left mail-box registers 2500-0L~2500-3L by the left resource sharing device 205.

Referring now to FIG. 24, the right port 204, right semaphore I/O control logic circuit 1000, and right register decoder circuit 304 are employed by the right resource sharing device 206 in writing to and reading from the right mail-box registers 2500-0R~2500-3R in a similar manner as their left-side counterparts. Likewise, the left port 203, left semaphore I/O control logic circuit 900, and left register decoder circuit 303 are employed by the left resource sharing device 205 in reading from the right mail-box registers 2500-0R~2500-3R in a similar manner as their left-side counterparts; and the left interrupt logic circuit 307, a left masking logic circuit 2900, and the left status registers 309 also function as their right-side counterparts.

Figure 26:
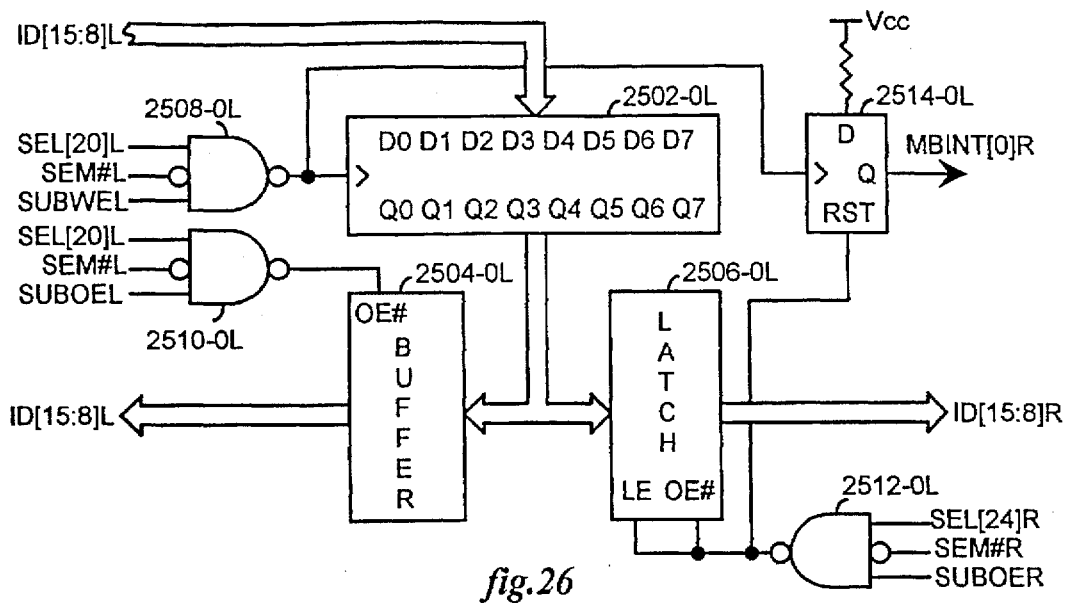
FIGS. 25 and 26 respectively illustrate, as examples, lower and upper byte registers with related I/O enabling and interrupt generating circuitry for a representative one of the left mail-box registers, utilizing aspects of the present invention.
Figure 25:
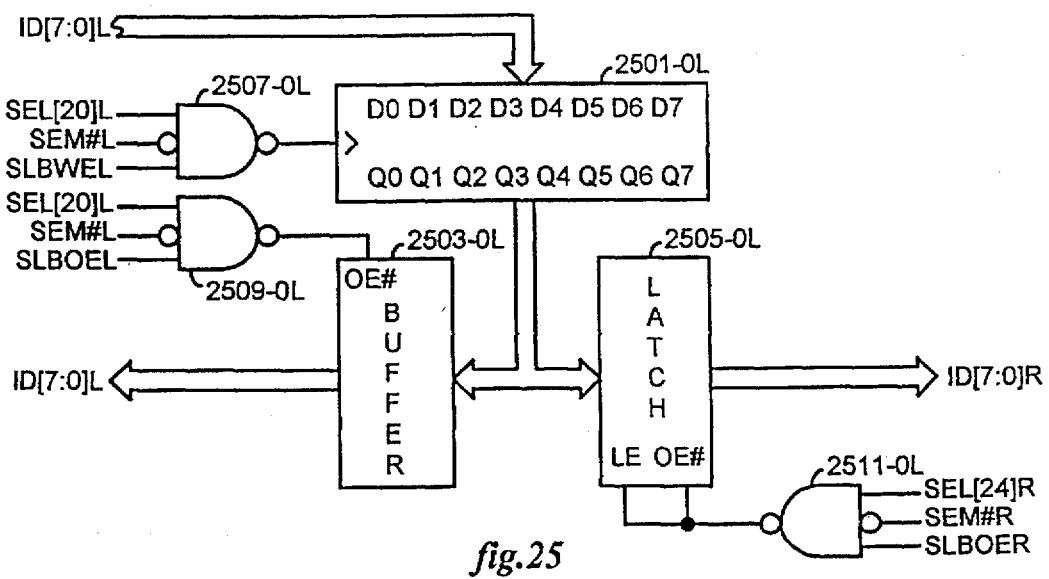
Figure 28:
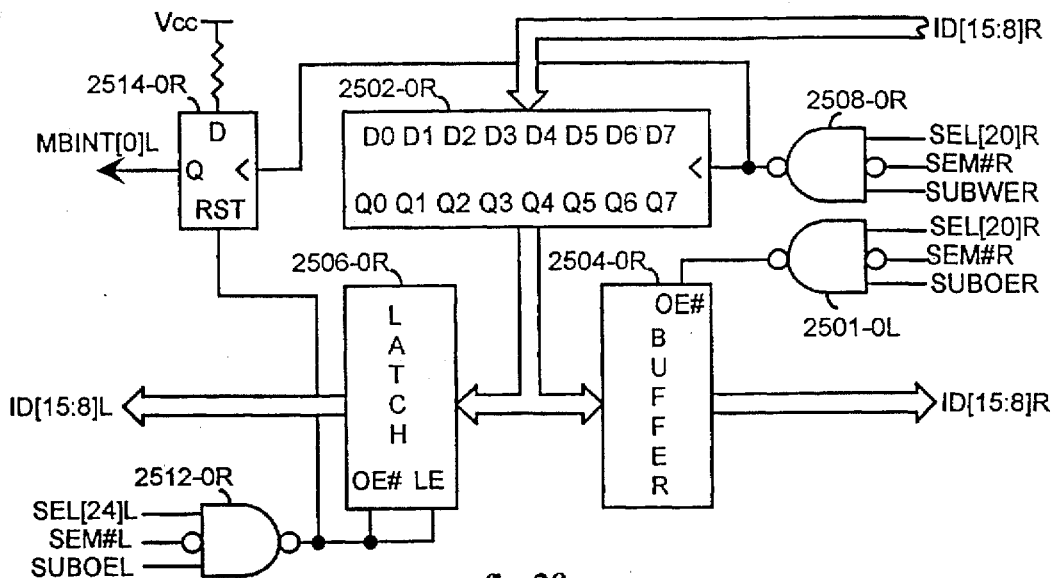
FIGS. 27 and 28 respectively illustrate, as examples, lower and upper byte registers with related I/O enabling and interrupt generating circuitry for a representative one of the right mail-box registers of the memory device of FIG. 2, utilizing aspects of the present invention.
Figure 27:
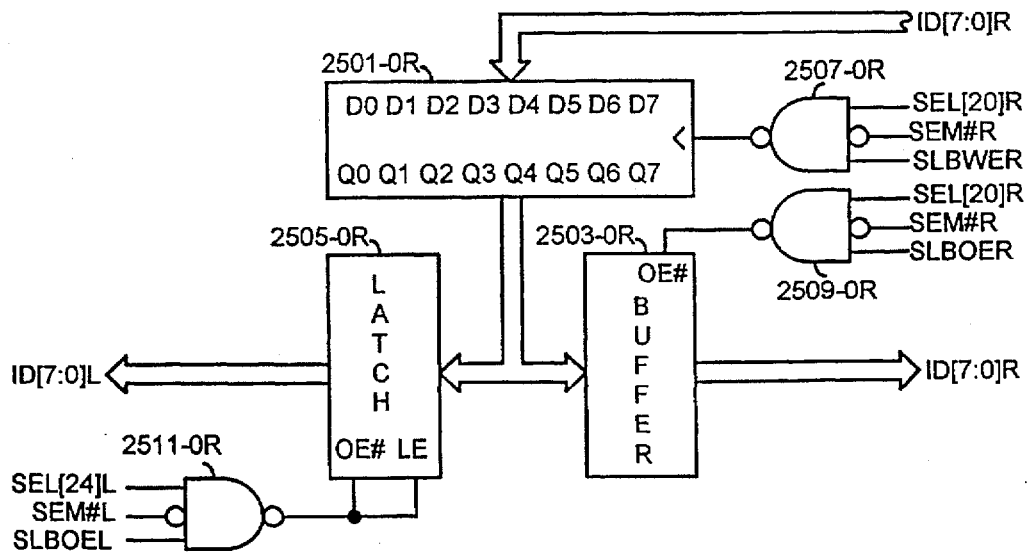

FIGS. 25 and 26 illustrate, as examples, lower and upper byte registers, 2501-0L and 2502-0L, with their related I/O enabling and interrupt generating circuitry, which combine to form the left mail-box register 2500-0L with its related I/O enabling and interrupt generating circuitry; and FIGS. 27 and 28 illustrate, as examples, lower and upper byte registers, 2501-0R and 2502-0R, with their related I/O enabling and interrupt generating circuitry, which combine to form the right mail-box register 2500-0R with its related I/O enabling and interrupt generating circuitry. Other left and right mail-box registers, 2500-1L~2500-3L and 2500-1R~2500-3R, are formed from similarly constructed pairs of lower and upper byte registers, wherein individual ones of the left and right mail-box registers are selectably accessed for writing and reading purposes by the left and right resource sharing devices, 205 and 206, employing the semaphore write and read mode addresses in Tables VI~VIII.

The left lower and upper byte registers, 2501-0L and 2502-0L, are conventional byte-wide registers having eight D-inputs D0~D7, eight Q-outputs Q0~Q7, and a clock input (<). The I/O enable circuitry for the left lower byte register 2501-0L includes a lower byte buffer 2503-0L coupling the left port 203 to the left lower byte register 2501-0L, a lower byte latch 2505-0L coupling the right port 204 to the left lower byte register 2501-0L, a first lower byte NAND gate 2507-0L providing a signal to the clock input of the left lower byte register 2501-0L, a second lower byte NAND gate 2509-0L providing a signal to an output enable input OE# of the lower byte buffer 2503-0L, and a third lower byte NAND gate 2511-0L providing a signal to latch and output enable inputs LE and OE# of the lower byte latch 2505-0L. Similarly, the I/O enable circuitry for the left upper byte register 2502-0L includes an upper byte buffer 2504 coupling the left port 203 to the left upper byte register 2502-0L, an upper byte latch 2506 coupling the right port 204 to the left upper byte register 2502-0L, a first upper byte NAND gate 2508-0L providing a signal to the clock input of the left upper byte register 2502-0L, a second upper byte NAND gate 2510-0L providing a signal to an output enable input OE# of the upper byte buffer 2504-0L, and a third upper byte NAND gate 2512-0L providing a signal to latch and output enable inputs LE and OE# of the upper byte latch 2506-0L. The interrupt generating circuitry for the left upper byte register 2502-0L serves as the interrupt generating circuitry of the left mail-box register 2500-0L, and includes a conventional flip-flop 2514-0L having a D-input coupled to a voltage supply Vcc, a clock input (<) coupled to the first upper byte NAND gate 2508-0L output, a Q-output providing a first right mail-box interrupt signal MBINT[0]R, and a reset input coupled to the third upper byte NAND gate 2512-0L output.

The left resource sharing device 205 writes to the lower and upper byte registers, 2501-0L and 2502-0L, by causing a falling edge on the outputs of the first lower and upper byte NAND gates, 2507-0L and 2508-0L, which in turn, causes respective lower and upper bytes of data on the D-inputs of the lower and upper byte registers, 2501-0L and 2502-0L, to be latched respectively onto the Q-outputs of the lower and upper byte registers, 2501-0L and 2502-0L. The latched data may then be read by the left resource sharing device 205 through the lower and upper byte buffers, 2503-0L and 2504-0L, or by the right resource sharing device 206 through the lower and upper byte latches, 2505-0L and 2506-0L. Simultaneous with the latching of the upper byte of data into the upper byte register 2502-0L, the falling edge on the output of the first upper byte NAND gate 2508-0L causes a logic HIGH value to be latched onto the Q-output of the flip-flop 2514-0L, thereby activating the right mail-box interrupt signal MBINT[0]R.

The first lower byte NAND gate 2507-0L generates a falling edge (i.e., a logic HIGH to LOW transition) on its output when the left semaphore mode enable signal SEM#L provided by the left resource sharing device 205 is active LOW, the left lower byte write enable signal SLBWEL provided by the left semaphore I/O control logic circuit 900 is active HIGH, and a left select signal SEL[20]L provided by the left register decoder circuit 303 is active HIGH. In a similar fashion, the first upper byte NAND gate 2508-0L generates a falling edge on its output when the left semaphore mode enable signal SEM#L provided by the left resource sharing device 205 is active LOW, the left upper byte write enable signal SUBWEL provided by the left semaphore I/O control logic circuit 900 is active HIGH, and the left select signal SEL[20]L provided by the left register decoder circuit 303 is active HIGH. Preferably the falling edges on the respective outputs of the first lower byte NAND gate 2507-0L and the first upper byte NAND gate 2508-0L are generated simultaneously by, for example, tying the lower and upper data byte lines, LB#L and UB#L, together.

The left resource sharing device 205 reads from the lower and upper byte registers, 2501-0L and 2502-0L, by causing a falling edge on the outputs of the second lower and upper byte NAND gates, 2509-0L and 2510-0L, which in turn, causes respective lower and upper buffers, 2503-0L and 2504-0L, to pass data latched onto the Q-outputs of the lower and upper byte registers, 2501-0L and 2502-0L, onto the left internal data bus ID[15:0]L. The left semaphore I/O logic circuit 900, thereupon passes the data from the left internal data bus ID[15:0]L to the left external data bus D[15:0]L in response to control signals from the left resource sharing device 205 as described in reference to FIG. 9.

The second lower byte NAND gate 2509-0L generates a falling edge on a signal provided to the output enable OE# input of the buffer 2503, when the left semaphore mode enable signal SEM#L provided by the left resource sharing device 205 is active LOW, the left lower byte output enable signal SLBOEL provided by the left semaphore I/O control logic circuit 900 is active HIGH, and the left select signal SEL[20]L provided by the left register decoder circuit 303 is active HIGH. In a similar fashion, the second upper byte NAND gate 2510-0L generates a falling edge on a signal provided to the output enable OE# input of the buffer 2504-0L, when the left semaphore mode enable signal SEM#L provided by the left resource sharing device 205 is active LOW, the left upper byte output enable signal SUB-OEL provided by the left semaphore I/O control logic circuit 900 is active HIGH, and the left select signal SEL[20]L provided by the left register decoder circuit 303 is active HIGH.

The right resource sharing device 206 reads from the lower and upper byte registers, 2501-0L and 2502-0L, by causing a falling edge on the outputs of the third lower and upper byte NAND gates, 2511-0L and 2512-0L, which in turn, causes respective lower and upper latches, 2505-0L and 2506-0L, to pass data latched onto the Q-outputs of the lower and upper byte registers, 2501-0L and 2502-0L, onto the right internal data bus ID[15:0]R. The right semaphore I/O logic circuit 1000, thereupon passes the data from the right internal data bus ID[15:0]R to the right external data bus D[15:0]R in response to control signals from the right resource sharing device 206 as described in reference to FIG. 10.

The third lower byte NAND gate 2511-0L generates a falling edge on a signal provided to the latch enable LE# and output enable OE# inputs of the latch 2505-0L, when the right semaphore mode enable signal SEM#R provided by the right resource sharing device 206 is active LOW, a right lower byte output enable signal SLBOER provided by the right semaphore I/O control logic circuit 1000 is active HIGH, and a right select signal SEL[24]R provided by the right register decoder circuit 304 is active HIGH. In a similar fashion, the third upper byte NAND gate 2511-0L generates a falling edge on a signal provided to the latch enable LE# and output enable OE# inputs of the latch 2506-0L and to the reset input input RST of the flip-flop 2514-0L, when the right semaphore mode enable signal SEM#R provided by the right resource sharing device 206 is active LOW, a right upper byte output enable signal SUBOER provided by the right semaphore I/O control logic circuit 1000 is active HIGH, and a right select signal SEL[24]R provided by the right register decoder circuit 304 is active HIGH.

The left and right resource sharing electronic devices, 205 and 206, write to selected ones of their respective left and right mail-box registers, 2500-0L~2500-3L and 2500-0R~2500-3R, by activating their respective semaphore mode enable lines, activating their respective upper and lower data byte enable lines, activating the write mode on their respective read/write lines, providing upper and lower bytes of data on their respective external data buses, and providing addresses corresponding to the selected mail-box registers on their respective address buses. The left and right register decoder circuits, 303 and 304, decode the addresses provided by their respective left and right resource sharing devices, 205 and 206, to activate corresponding ones of the select signals, SEL[20]L~SEL[23]L and SEL[20]R~SEL[23]R, which are respectively provided to the NAND gates 2507-0L~2507-3L and 2508-0L~2508-3L of the left mail-box registers and the NAND gates 2507-0R~2507-3R and 2508-0R~2508-3R of the right mail-box registers, as summarized in Table V.

TABLE V

Register Addresses for Mail-box Writes.

| Address | Register | Signal | Description |
| --- | --- | --- | --- |
| xx20 | 2500-0L/R | SEL[20]L/R | Mail-box 2500-0L/R write. |
| xx21 | 2500-1L/R | SEL[21]L/R | Mail-box 2500-1L/R write. |
| xx22 | 2500-2L/R | SEL[22]L/R | Mail-box 2500-2L/R write. |
| xx23 | 2500-3L/R | SEL[23]L/R | Mail-box 2500-3L/R write. |

As examples clarifying the use of Table V, when the left resource sharing device 205 selects the left mail-box register 2500-0L for sending data to the right resource sharing device 206, the left resource sharing device 205 provides the address xx20 hex on the left address bus A[15:0]L while in a left semaphore write mode. Similarly, when the left resource sharing device 205 selects the left mail-box registers 2500-1L~2500-3L, it provides their respectively corresponding addresses xx21~xx23 hex on the left address bus A[15:0]L while in a left semaphore write mode. On the other hand, when the right resource sharing device 206 selects the right mail-box register 2500-0R for sending data to the left resource sharing device 205, the right resource sharing device 206 provides the address xx20 hex on the right address bus A[15:0]R while in a right semaphore write mode; and when the right resource sharing device 206 selects the right mail-box registers 2500-1R~25003R, it provides their respectively corresponding addresses xx21~xx23 hex on the right address bus A[15:0]R while in a right semaphore write mode.

After the left and right resource sharing electronic devices, 205 and 206, have written to selected ones of their respective left and right mail-box registers, 2500-0L~2500-3L and 2500-0R~2500-3R, it may be desirable for them to check the contents of the thus written to mail-box registers. To do so, the left and right resource sharing electronic devices, 205 and 206, read from selected ones of their respective left and right mail-box registers, 2500-0L~2500-3L and 2500-0R~2500-3R, by providing addresses corresponding to the selected mail-box registers on their respective address buses, activating the read mode on their respective read/write lines, and activating their respective semaphore mode enable, output enable, and upper and lower data byte enable lines. The left and right register decoder circuits, 303 and 304, thereupon decode the addresses provided by their respective left and right resource sharing devices, 205 and 206, to activate corresponding ones of the select signals, SEL[20]L~SEL[23]L and SEL[20]R~SEL[23]R, which are respectively provided to the NAND gates 2509-0L~2509-3L and 2510-0L~2510-3L of the left mail-box registers and the NAND gates 2509-0R~2509-3R and 2510-0R~2510-3R of the right mail-box registers, as summarized in Table VI, wherein the term "transmitter" or "Tx" refers to the resource sharing device sending a message via the mail-box registers.

TABLE VI

Register Addresses for Mail-box Reads by Transmitter.

| Address | Register | Signal | Description |
| --- | --- | --- | --- |
| xx20 | 2500-0L/R | SEL[20]L/R | Mail-box 2500-0L/R read by Tx. |
| xx21 | 2500-1L/R | SEL[21]L/R | Mail-box 2500-1L/R read by Tx. |
| xx22 | 2500-2L/R | SEL[22]L/R | Mail-box 2500-2L/R read by Tx. |
| xx23 | 2500-3L/R | SEL[23]L/R | Mail-box 2500-3L/R read by Tx. |

As examples clarifying the use of Table VI, after the left resource sharing device 205 has written to the left mail-box register 2500-0L, the left resource sharing device 205 can read the contents of the left mail-box register 2500-0L by providing the address xx20 hex on the left address bus A[15:0]L while in a left semaphore read mode. Similarly, the left resource sharing device 205 can select one of the left mail-box registers 2500-1L~2500-3L by providing a corresponding one of the addresses xx21~xx23 hex on the left address bus A[15:0]L while in a left semaphore read mode. Likewise, after the right resource sharing device 206 has written to the right mail-box register 2500-0R, the right resource sharing device 206 can read the contents of the right mail-box register 2500-0R by providing the address xx20 hex on the right address bus A[15:0]R while in a right semaphore read mode; and when the right resource sharing device 206 selects one of the right mail-box registers 2500-1R~2500-3R, it provides a corresponding one of the addresses xx21~xx23 hex on the right address bus A[15:0]R while in a right semaphore read mode.

After one of the left and right resource sharing electronic devices, 205 and 206, has written messages into one or more of its mail-box registers, it is desirable for the other of the left and right resource sharing electronic devices, 205 and 206, to check the contents of the thus written to mail-box registers. To do so, the left and right resource sharing electronic devices, 205 and 206, read from selected ones of the other's respective left and right mail-box registers, 2500-0L~2500-3L and 2500-0R~2500-3R, by providing addresses corresponding to the selected mail-box registers on their respective address buses, activating the read mode on their respective read/write lines, and activating their respective semaphore mode enable, output enable, and upper and lower data byte enable lines. The left and right register decoder circuits, 303 and 304, thereupon decode the addresses provided by their respective left and right resource sharing devices, 205 and 206, to activate corresponding ones of the select signals, SEL[24]R~SEL[27]R and SEL[24]L~SEL[27]L, which are respectively provided to the NAND gates 2511-0R~2511-3R and 2512-0R~2512-3R of the right mail-box registers and the NAND gates 25110L~2511-3L and 2512-0L~2512-3L of the left mail-box registers, as summarized in Table VII, wherein the term "receiver" or "Rx" refers to the resource sharing device which is the intended recipient of a message sent via the mail-box registers.

TABLE VII

Register Addresses for Mail-box Reads by Receiver.

| Address | Register | Signal | Description |
| --- | --- | --- | --- |
| xx24 | 2500-0L/R | SEL[24]L/R | Mail-box 2500-0L/R read by Rx. |
| xx25 | 2500-1L/R | SEL[25]L/R | Mail-box 2500-1L/R read by Rx. |
| xx26 | 2500-2L/R | SEL[26]L/R | Mail-box 2500-2L/R read by Rx. |
| xx27 | 2500-3L/R | SEL[27]L/R | Mail-box 2500-3L/R read by Rx. |

As examples clarifying the use of Table VII, after the left resource sharing device 205 has written to the left mail-box register 2500-0L, the right resource sharing device 206 can read the contents of the left mail-box register 2500-0L by providing the address xx24 hex on the right address bus A[15:0]R while in a right semaphore read mode. Similarly, the right resource sharing device 206 can select one of the left mail-box registers 2500-1L~2500-3L by providing a corresponding one of the addresses xx25~xx27 hex on the right address bus A[15:0]R while in a right semaphore read mode. Likewise, after the right resource sharing device 206 has written to the right mail-box register 2500-0R, the left resource sharing device 205 can read the contents of the right mail-box register 2500-0R by providing the address xx24 hex on the left address bus A[15:0]L while in a left semaphore read mode; and when the left resource sharing device 205 selects one of the right mail-box registers 2500-1R~2500-3R, it provides a corresponding one of the addresses xx25~xx27 hex on the left address bus A[15:0]L while in a left semaphore read mode.

Figure 29:
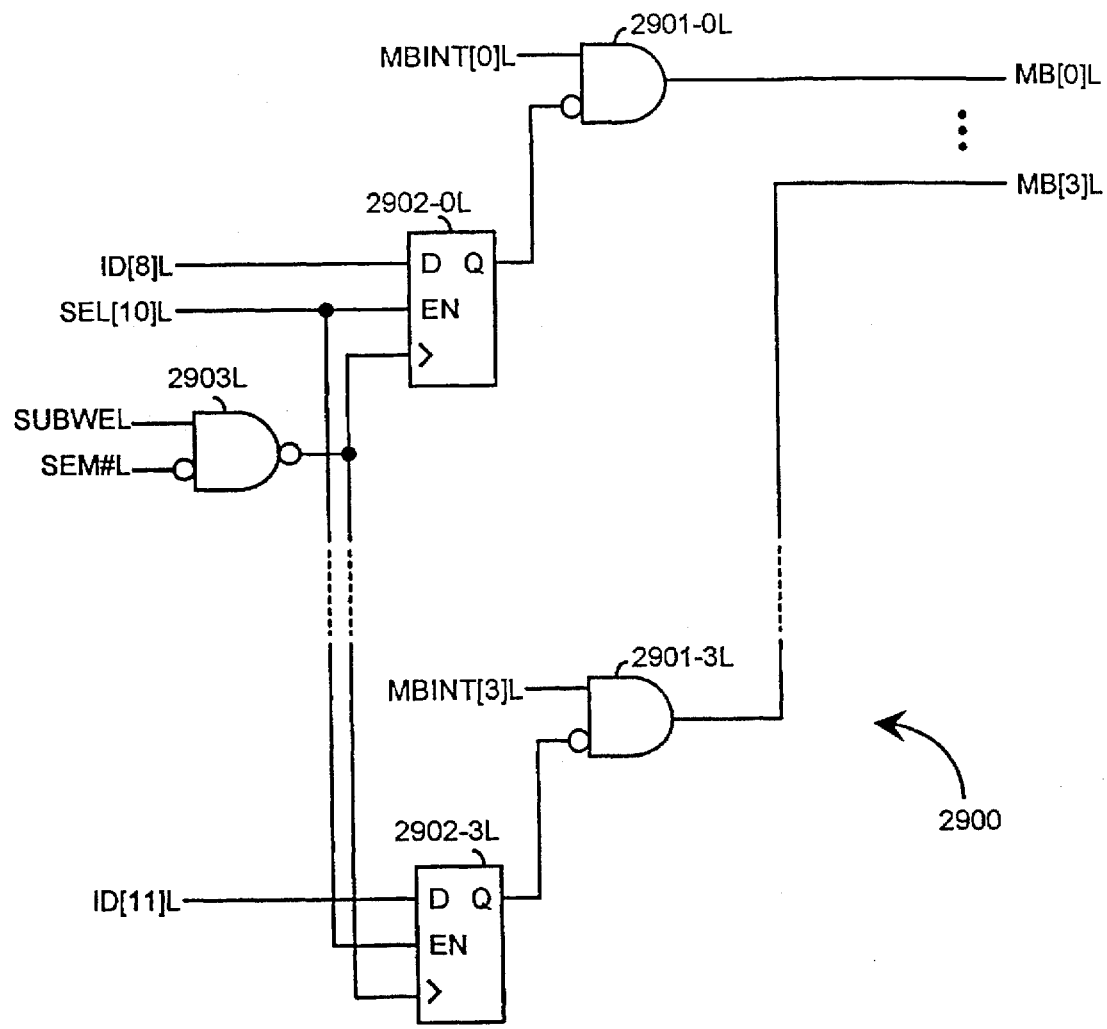
FIGS. 29 and 30 respectively illustrate, as examples, left and right masking logic circuits included in the memory device of FIG. 2, for masking left and right mail-box interrupts, utilizing aspects of the present invention.
Figure 30:
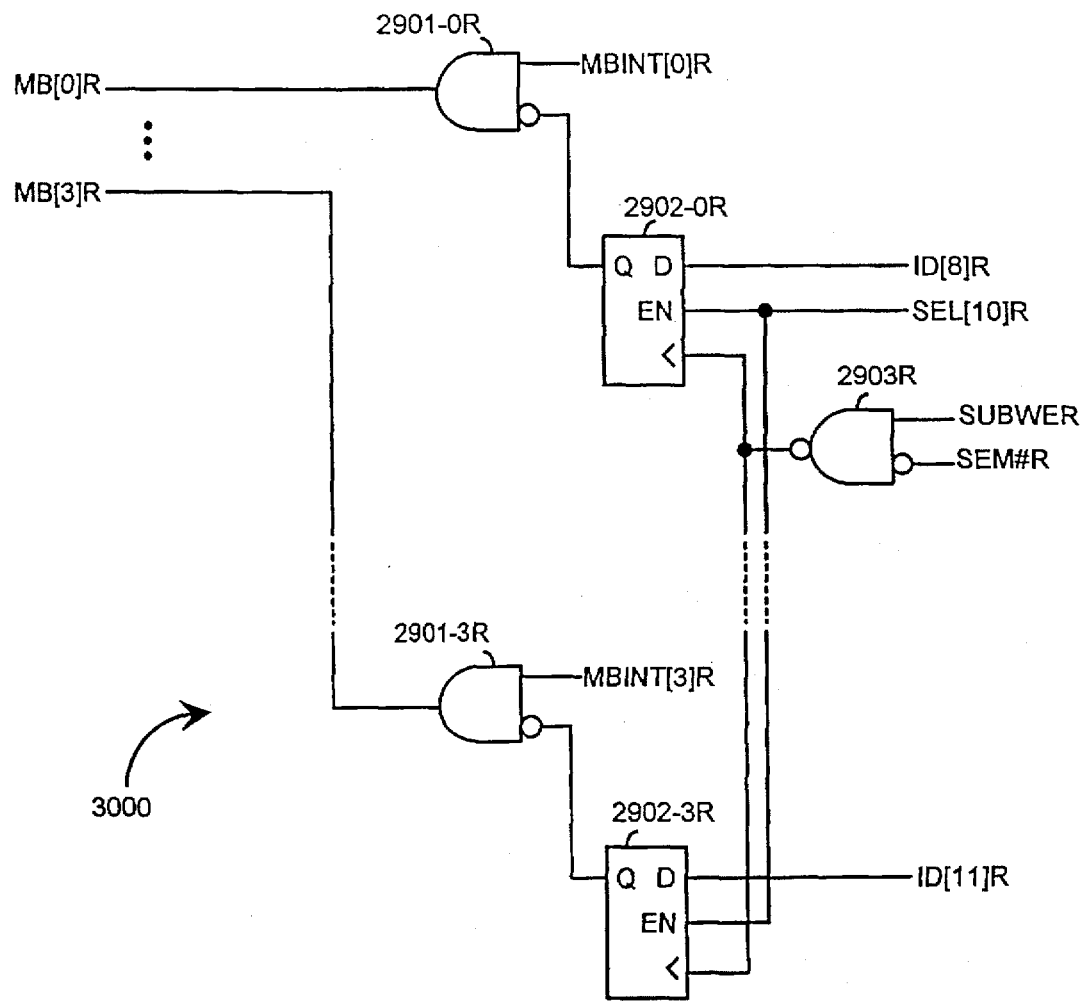

FIGS. 29 and 30 respectively illustrate, as examples, the left and right masking logic circuits, 2900 and 3000, which respectively receive pre-mask left and right mail-box interrupts, MBINT[0]L~MBINT[3]L and MBINT[0]R~MBINT[3]R, from the interrupt generating circuitry of the right and left mail-box registers of blocks, 2400 and 2300, and generate in response to masking signals from the left and right resource sharing devices, 205 and 206, post-mask left and right mail-box interrupts, MB[0]L~MB[3]L and MB[0]R~MB[3]R, which are respectively provided to the left and right interrupt logic circuits, 307 and 308, and the left and right interrupt cause registers of the left and right status registers, 309 and 310.

Referring to FIG. 29, the left masking logic circuit 2900 includes four AND gates, 2901-0L~2901-3L, four flip-flops 2902-0L~2902-3L, and a NAND gate 2903L. Each of the four AND gates, 2901-0L~2901-3L, has two inputs, and an output. The first input receives a corresponding one of the pre-mask mail-box interrupts, MBINT[0]L~MBINT[3]L, generated by the interrupt generating circuitry of the four upper byte registers, 2502-0L~2502-3L, of the four mail-box registers, 2500-0L~2500-3L; the second input is coupled to the Q-output of a corresponding one of the four flip-flops 2902-0L~2902-3L; and the output provides a corresponding one of the post-mask mail-box interrupts, MB[0]L~MB[3]L. Each of the four flip-flops 2902-0L~2902-3L, has a D-input receiving a corresponding data bit from the left internal data bus ID[15:0]L, an enable input EN commonly coupled to the select line SEL[10]L activated by the left register decoder circuit 302, and a clock input commonly coupled to an output of the NAND gate 2903L. The NAND gate 2903L also has two inputs. The first input receives the left semaphore upper byte write enable signal SUBWEL generated by the left semaphore I/O control logic 900; and the second input is an inverted input receiving the left semaphore mode enable signal SEM#L.

In the preferred embodiment, the left resource sharing device 205 masks selected ones of the left mail-box interrupts at the same time that it masks selected ones of the left semaphore or memory bank interrupts, and the right resource sharing device 206 masks selected ones of the right mail-box interrupts at the same time that it masks selected ones of the right semaphore or memory bank interrupts. Masking of the left and right semaphore or memory bank interrupts was described in reference to FIGS. 12 and 13, and masking of the left and right mail-box interrupts described in reference to FIGS. 29 and 30. Table III summarized the masking of the semaphore or memory bank interrupts, and Table VIII below expands upon Table III to include the masking of the left and right mail-box interrupts.

TABLE VIII

Masking of Memory Bank & Mail-box Interrupts.

| Address | Register | Signal | DataBit | Description |
|---|---|---|---|---|
| xx10 | 1204-0L/R | SEL[10]L/R | D[0]L/R | Mask memory bank 401-0. |
| | 1204-1L/R | SEL[10]L/R | D[1]L/R | Mask memory bank 401-1. |
| | 1204-2L/R | SEL[10]L/R | D[2]L/R | Mask memory bank 401-2. |
| | 1204-3L/R | SEL[10]L/R | D[3]L/R | Mask memory bank 401-3. |
| | 1204-4L/R | SEL[10]L/R | D[4]L/R | Mask memory bank 401-4. |
| | 1204-5L/R | SEL[10]L/R | D[5]L/R | Mask memory bank 401-5. |
| | 1204-6L/R | SEL[10]L/R | D[6]L/R | Mask memory bank 401-6. |
| | 1204-7L/R | SEL[10]L/R | D[7]L/R | Mask memory bank 401-7. |
| | 2500-0L/R | SEL[10]L/R | D[8]L/R | Mask mailbox 2500-0L/R. |
| | 2500-1L/R | SEL[10]L/R | D[9]L/R | Mask mailbox 2500-1L/R. |
| | 2500-2L/R | SEL[10]L/R | D[10]L/R | Mask mailbox 2500-2L/R. |
| | 2500-3L/R | SEL[10]L/R | D[11]L/R | Mask mailbox 2500-3L/R. |

As examples clarifying the use of Table VIII, the left resource sharing device 205 masks semaphore or memory bank interrupts resulting from the semaphore logic circuit 302 granting access requests from the left resource sharing device 205 for memory banks 401-0 and 401-3, and mail-box interrupts resulting from the right resource sharing device 206 writing into right mail-box registers 2500-0R and 2500-3R by providing the address xx10 hex on the left address bus A[15:0]L (which address the left register decoder circuit 303 decodes by activating the select line SEL[10]L to logic HIGH), providing logic HIGH values in data bits D[0]L, D[3]L, D[8]L, and D[11]L, and logic LOW values in data bits D[1]L, D[2]L, D[4]L–D[7]L, D[9]L and D[10]L of the left external data bus D[15:0]L, and activating the left semaphore mode enable line SEM#L, the left lower and upper data byte enable lines, LB#L and UB#L, and the write mode on the left read/write line R/W#L; and the right resource sharing device 206 similarly masks semaphore or memory bank interrupts resulting from the semaphore logic circuit 302 granting access requests from the right resource sharing device 206 for memory banks 401-0 and 401-3, and mail-box interrupts resulting from the left resource sharing device 205 writing into left mail-box registers 2500-0L and 2500-3L by providing the address xx10 hex on the right address bus A[15:0]R (which address the right register decoder circuit 304 decodes by activating the select line SEL[10]R to logic HIGH), providing logic HIGH values in data bits D[0]R, D[3]R, D[8]R, and D[11]R, and logic LOW values in data bits D[1]R, D[2]R, D[4]R–D[7]R, D[9]R and D[10]R of the right external data bus D[15:0]R, and activating the right semaphore mode enable line SEM#R, the right lower and upper data byte enable lines, LB#R and UB#R, and the write mode on the right read/write line R/W#R.

Figure 31:
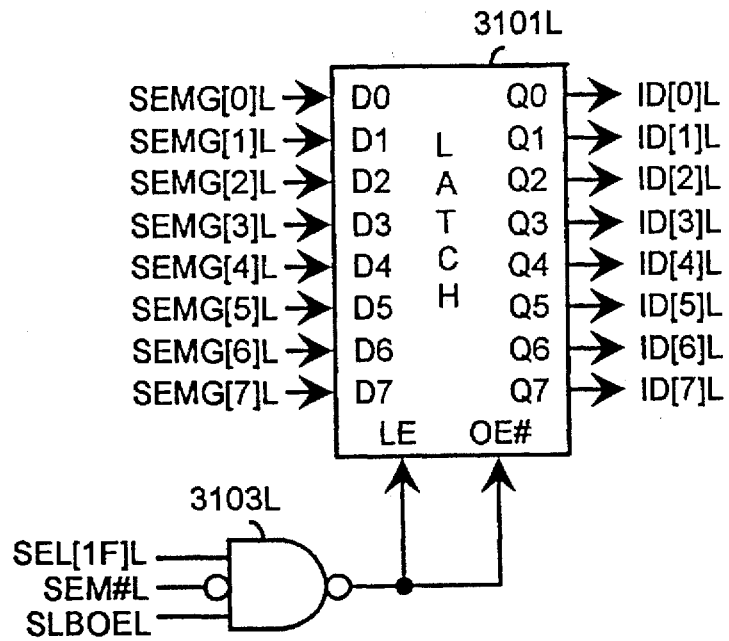
FIGS. 31 and 32 respectively illustrate, as examples, lower and upper byte registers with related output enabling circuitry for the left interrupt status register of the memory device of FIG. 2, utilizing aspects of the present invention.

FIGS. 31 and 32 illustrate, as examples, lower and upper byte latches, 3101L and 3102L, of the left interrupt status register. The lower byte latch 3101L latches the left bank access grant signals SEMG[0]L–SEMG[7]L, which are employed in the left interrupt logic circuit 307 as pre-mask left semaphore or memory bank interrupt signals, onto its Q-outputs Q0–Q7, which in turn, are coupled to the lower byte data lines ID[0]L–ID[7]L of the left internal data bus ID[15:0]L, when its latch enable input LE is not activated and its output enable input OE# is activated. On the other hand, the upper byte latch 3102L latches the pre-mask mail-box interrupt signals MBINT[0]L–MBINT[3]L, which are generated by the right-side interrupt generating circuitry of block 2400, onto its Q-outputs Q0–Q7, which in turn, are coupled to the upper byte data lines ID[8]L–ID[15]L of the left internal data bus ID[15:0]L, when latch enable input LE is not activated and its output enable input OE# is activated. NAND gate 3103L causes the latch enable input LE of the lower byte latch 3101L not to be activated and the output enable input OE# of the lower byte latch 3101L to be activated when the left resource sharing device 205 reads from the left interrupt status register by providing the address xx1F hex on the left address bus A[15:0]L, and activating the left semaphore mode enable line SEM#L, the left lower data byte enable line LB#L, the left output enable line OE#L, and the read mode on the left read/write line R/W#L; and NAND gate 3104L causes the latch enable input LE of the upper byte latch 3102L not to be activated and the output enable input OE# of the upper byte latch 3102L to be activated when the left resource sharing device 205 reads from the left interrupt status register by providing the address xx1F hex on the left address bus A[15:0]L, and activating the left semaphore mode enable line SEM#L, the left upper data byte enable line UB#L, the left output enable line OE#L, and the read mode on the left read/write line R/W#L.

FIGS. 33 and 34 illustrate, as examples, lower and upper byte latches, 3301R and 3302R, of the left interrupt cause register. The lower byte latch 3301R latches the post-mask semaphore interrupt signals SEM[0]L–SEM[7]L generated by the left interrupt logic circuit 307, onto its Q-outputs Q0–Q7, which in turn, are coupled to the lower byte data lines ID[0]L–ID[7]L of the left internal data bus ID[15:0]L, when its latch enable input LE is not activated and its output enable input OE# is activated. On the other hand, the upper byte latch 3302R latches the post-mask mail-box interrupt signals MB[0]R–MB[3]R generated by the left masking logic circuit 2900, onto its Q-outputs Q0–Q7, which in turn, are coupled to the upper byte data lines ID[8]L–ID[15]L of the left internal data bus ID[15:0]L, when its latch enable input LE is not activated and its output enable input OE# is activated. NAND gate 3303R causes the latch enable input LE of the lower byte latch 3301R not to be activated and the output enable input OE# of the lower byte latch 3301R to be activated when the left resource sharing device 205 reads from the left interrupt cause register by providing the address xx1D hex on the left address bus A[15:0]L, and activating the left semaphore mode enable line SEM#L, the left lower data byte enable line LB#L, the left output enable line OE#L, and the read mode on the left read/write line R/W#L; and NAND gate 3304R causes the latch enable input of the upper byte latch 3302R not to be activated and the output enable input OE# of the upper byte latch 3302R to be activated when the left resource sharing device 205 reads from the left interrupt cause register by providing the address xx1D hex on the left address bus A[15:0]L, and activating the left semaphore mode enable line SEM#L, the left upper data byte enable line UB#L, the left output enable line OE#L, and the read mode on the left read/write line R/W#L.

FIGS. 35 and 36 illustrate, as examples, lower and upper byte latches, 3101R and 3102R, of the right interrupt status register, which are constructed and function in a similar, but mirror-imaged manner as the lower and upper byte latches, 3101L and 3102L, of the left interrupt status register; and FIGS. 37 and 38 illustrate, as examples, lower and upper byte latches, 3301R and 3302R, of the right interrupt cause register, which are constructed and function in a similar, but mirror-imaged manner as the lower and upper byte latches, 3301L and 3302L, of the left interrupt cause register.

FIG. 39 illustrates, as an example, a flow diagram of the steps performed by the left resource sharing device 205 and left-side mail-box related circuitry (e.g., steps 3901-3902 of transmitter side) when the left resource sharing device 205 sends a message to the right resource sharing device 206 through the left mail-box 2500-0L, and the steps performed by the right resource sharing device 206 and right-side mail-box related circuitry (e.g., steps 3903-3911 of receiver side) when the right resource sharing device 206 reads the message sent by the left resource sharing device 205 from the left mail-box 2500-0L.

In step 3901, the left resource sharing device 205 writes to the left mail-box register 2500-0L by providing the address xx20 hex, according to Table V, on the left address bus A[15:0]L, providing two bytes of data on the left external data bus D[15:0]L, activating the left semaphore mode enable line SEM#L, activating the left lower data byte enable line LB#L, activating the left upper data byte enable line UB#L, and activating the write mode on the left read/write line R/W#L. The left semaphore I/O logic circuit 900 responds to the activated SEM#L line, LB#L line and write mode on the R/W#L line by activating the left semaphore lower byte write enable line SLBWEL, and the activated SEM#L line, UB#L line and write mode on the R/W#L line by activating the left semaphore upper byte write enable line SUBWEL, which respectively cause the lower and upper bytes of data on the left external data bus D[15:0]L to be passed to the left internal data bus ID[15:0]L. The left register decoder circuit 303 responds to the activated SEM#L line to decode the address xx20 hex provided on the left address bus A[15:0]L by activating the select line SEL[20]L. The NAND gate 2507-0L, included in the I/O enabling circuitry of the left mail-box register 2500-0L, responds to the activated SEM#L, SLBWEL and SEL[20]L lines by activating a signal provided to the clock input of the lower byte register 2501-0L, which causes the lower byte register 2501-0L to latch the lower byte of data ID[7:0]L on the left internal data bus ID[15:0]L onto its Q-outputs Q0~Q7. The NAND gate 2508-0L, included in the I/O enabling circuitry of the left mail-box register 2500-0L, responds to the activated SEM#L, SUBWEL and SEL[20]L lines by activating a signal provided to the clock input of the upper byte register 2502-0L, which causes the upper byte register 2502-0L to latch the upper byte of data ID[15:8]L on the left internal data bus ID[15:0]L onto its Q-outputs Q0~Q7.

In step 3902, the activated NAND gate 2508-0L signal provided to the clock input of the upper byte register 2502-0L, is also provided to the flip-flop 2514-0L, included in the interrupt generating circuitry of the left mail-box register 2500-0L. The flip-flop 2514-0L responds to the activated NAND gate 2508-0L signal by activating an pre-mask mail-box interrupt signal MBINT[0]R corresponding the left mail-box register 2500-0L.

In step 3903, the activated pre-mask mail-box interrupt signal MBINT[0]R is provided to a first input of the AND gate 2901-0R of the right masking logic circuit 3000, and to a first input D0 of the lower byte register 3101R of the right interrupt status register.

In step 3904, the AND gate 2901-0R logically combines the activated pre-mask mail-box interrupt signal MBINT[0]R provided to its first input, with a mask signal provided to its inverted second input from the Q-output of the flip-flop 2902-0R of the right masking logic circuit 3000, to generate the post-mask mail-box interrupt signal MB[0]R, such that the post-mask mail-box interrupt signal MB[0]R is only active if the pre-mask mail-box interrupt signal MBINT[0]R is active and the mask signal is inactive. The active or inactive state of the mask signal is prior set by the right resource sharing device 206 providing the address xx10 hex on the right address bus A[15:0]R, providing a logic value indicative of such active or inactive state on the data bit D[8]R of the right external data bus D[15:0]R, and activating the right semaphore mode enable line SEM#R, the right upper data byte enable line UB#R, and the write mode of the right read/write line R/W#R, in accordance with Table VIII. The NOR gate 1202R of the right interrupt logic circuit 308 receives the post-mask mail-box interrupt signal MB[0]R as one of several inputs, any one of which, can cause the NOR gate 1202R to generate an interrupt condition on the right interrupt line INT#R, as depicted in FIG. 13.

In step 3905, if the mask signal generated at the Q-output of the flip-flop 2902-0R is inactive (i.e., interrupts generated by the left resource sharing device 205 writing into the left mail-box register 2500-0L are not to be overridden), then the logic state of the post-mask mail-box interrupt signal MB[0]R will be the same as that of the pre-mask mail-box interrupt signal MBINT[0]R. Under these conditions, the post-mask mail-box interrupt signal MB[0]R will be activated when the left resource sharing device 205 writes into the left mail-box register 2500-0L, and an interrupt condition will be generated on the right interrupt line INT#R as a result thereof. The interrupt condition on the right interrupt line INT#R is thereupon detected by conventional interrupt detection circuitry (not shown) in the right resource sharing device 206.

In a step 3906 following step 3905, the right resource sharing device 206 determines the cause of the detected interrupt by checking the contents of the right interrupt cause register as depicted in FIGS. 37~38, or alternatively, the contents of the right interrupt status register as depicted in FIGS. 35~36. For example, the right resource sharing device 205 checks the right interrupt cause register by providing the address xx1D hex on the right address bus A[15:0]R, and activating the right semaphore mode enable line SEM#R, the right upper and lower data byte enable lines, UB#R and LB#R, the right output enable line OE#R, and the read mode on the right read/write line R/W#R. By doing so, the right resource sharing device 205 reads a logic HIGH value in the data bit D[8]R, which corresponds to the state of the post-mask mail-box interrupt signal MB[0]R, and determines, as a consequence thereof, that the interrupt condition on the right interrupt line INT#R was caused by the left resource sharing device 205 writing into the left mail-box register 2500-0L.

In a step 3907 following step 3908, after having determined the cause of the interrupt, the right resource sharing device 206 reads the message or data sent from the left resource sharing device 205, from the left mail-box register 2500-0L by providing the address xx24 hex on the right address bus A[15:0], and activating the right semaphore mode enable line SEM#R, the right upper and lower data byte enable lines, UB#R and LB#R, the right output enable line OE#R, and the read mode on the right read/write line R/W#R, in accordance with Table VII. The right register decoder circuit 304 responds to the activated SEM#R line to decode the address xx24 hex provided on the right address bus A[15:0]R by activating the select line SEL[24]R. The NAND gate 2511-0L, included in the I/O enabling circuitry of the left mail-box register 2500-0L, responds to the activated SEM#R, SLBOER and SEL[24]R lines by activating a signal provided to the latch enable LE and output enable OE# inputs of the lower byte latch 2505-0L, which causes the lower byte latch 2505-0L to latch the data on the Q-outputs Q0~Q7 of the lower byte register 2501-0L onto the lower byte of data lines ID[7:0]R on the right internal data bus ID[15:0]R. The NAND gate 2512-0L, included in the I/O enabling circuitry of the right mail-box register 2500-0L, responds to the activated SEM#R, SUBOER and SEL[24]R lines by activating a signal provided to the latch enable LE and output enable OE# inputs of the upper byte latch 2506-0L, which causes the upper byte latch 2506-0L to latch the data on the Q-outputs Q0~Q7 of the upper byte register 2502-0L onto the upper byte of data lines ID[15:8]R on the right internal data bus ID[15:0]R. The right semaphore I/O logic circuit 1000 responds to the activated SEM#R line, OE#R line, LB#R line, and read mode on the R/W#R line by activating the right semaphore lower byte output enable line SLBOER, and the activated SEM#R line, OE#R line, UB#R line, and read mode on the R/W#R line by activating the right semaphore upper byte output enable line SUBOER, which respectively cause the lower and upper bytes of data on the right internal data bus ID[15:0]R to be passed to the right external data bus D[15:0]R, and from thence, to the right resource sharing device 206.

In step 3908, preferably performed concurrently with step 3907 following step 3906, the activated NAND gate 2512-0L output is also provided to the reset input RST of the flip-flop 2514-0L, so that the pre-mask mail-box interrupt MBINT[0]R is automatically cleared when the right resource sharing device 206 reads the upper byte of data stored in the upper byte register 2502-0L.

Either step 3910 or 3911 may be alternatively performed if the mask signal generated at the Q-output of the flip-flop 2902-0R is active (i.e., interrupts generated by the left resource sharing device 205 writing into the left mail-box register 2500-0L are to be overridden). If the mask signal is active, the post-mask interrupt signal MB[0]R will not be activated when the left resource sharing device 205 writes a message or data into the left mail-box register 2500-0L and as a consequence, an interrupt condition will not be generated on the right interrupt line INT#R. Since an interrupt condition is not generated, the right resource sharing device 206 will not be automatically notified when the left resource sharing device 205 has written a message for it in one of the left mail-box registers. Therefore, in order to detect a masked interrupt, in step 3910, the right resource sharing device 206 can deactivate the previously set masking conditions by providing the address xx10 hex on the right address bus A[15:0]R, providing a logic value indicative of such inactive state on the data bit D[8]R of the right external data bus D[15:0]R, and activating the right semaphore mode enable line SEM#R, the right upper data byte enable line UB#R, and the write mode of the right read/write line R/W#R, in accordance with Table VIII. As a consequence, the logic state of the post-mask mail-box interrupt signal MB[0]R will be the same as that of the pre-mask mail-box interrupt signal MBINT[0]R, and an interrupt condition will be generated on the right interrupt line INT#R. Processing of the interrupt may then proceed as described in reference to steps 3905~3908. The masked interrupt may be alternatively detected, in step 3911, by the right resource sharing device 206 periodically checking the Q0 output of the upper byte register 3102R of the right interrupt status register as depicted in FIGS. 35~36, to check if the pre-mask interrupt signal MBINT[0]R has been activated. If it has, then processing of the interrupt in this case, may then proceed as described in reference to steps 3907~3908.

Although the various aspects of the present invention have been described with respect to a preferred embodiment, it will be understood that the invention is entitled to full protection within the full scope of the appended claims. For example, it is to be appreciated that a multi-port memory device embodying the various aspects of the present invention is not limited to having only two input/output ports. Also, each of its input/output ports do not have to be coupled directly to a resource sharing electronic device. A port may be coupled indirectly to multiple electronic devices through a common bus.

Figure 40:
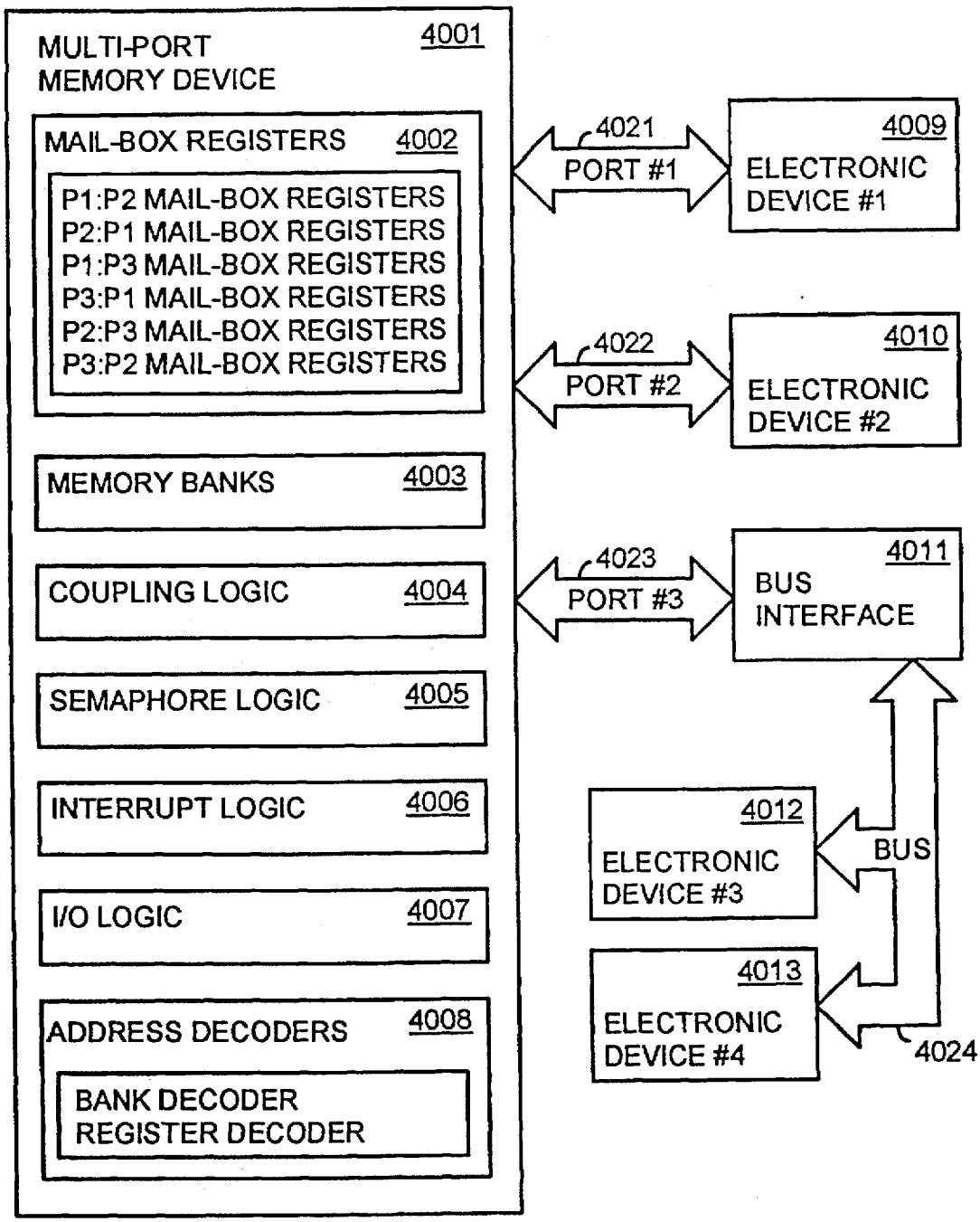
FIG. 40 illustrates, as an example, a block diagram of a system including a multi-ported memory device, utilizing aspects of the present invention, having three input/output ports for coupling with three resource sharing electronic devices.

FIG. 40 illustrates, a multi-port memory device 4001 having three input/output ports, 4021-4023. The multi-port memory device 4001 includes mail-box registers 4002, memory banks 4003, coupling logic 4004, semaphore logic 4005, interrupt logic 4006, I/O logic 4006, and address decoders 4008, which function similarly to their respective counterparts in the multi-port SRAM 201. In this example, the mail-box registers 4002 include a number of Px:Py mail-box registers dedicated to receiving data from input/output port #y for transmission through input/output port #x (e.g., P1:P2 mail-box registers dedicated to receiving data from port #2 for transmission through port #1), and the address decoders 4008 include bank decoders such as the left and right bank decoders, 403 and 404, of the multi-port SRAM 201, and register decoders such as the left and right register decoders, 303 and 304, of the multi-port SRAM 201. Also, in this example, input/output port #3 4023 is coupled indirectly to electronic devices #3 and #4, 4012 and 4013, through bus 4024 and bus interface 4011.

What is claimed is:

1. A shared resource electronic device having first and second ports for communicating respectively with first and second resource sharing electronic devices, comprising:
    at least one first mail box register which can be written to only through said first port, and read from at least through said second port; and
    at least one second mail box register which can be written to only through said second port, and read from at least through said first port.

2. The shared resource electronic device as recited in claim 1, further comprising:
- a first status register having at least one bit indicative of a written to status of said at least one second mail box register, and readable through said first port; and
- a second status register having at least one bit indicative of a written to status of said at least one first mail box register, and readable through said second port.

3. The shared resource electronic device as recited in claim 1, further comprising means for activating a first interrupt line of said first port when one of said at least one second mail box register is written to, and for activating a second interrupt line of said second port when one of said at least one first mail box register is written to.

4. The shared resource electronic device as recited in claim 3, wherein said first interrupt line activating means further comprises masking means for selectively inhibiting activation of said first interrupt line when one of said at least one second mail box register is written to.

5. The shared resource electronic device as recited in claim 3, wherein individual ones of said at least one first mail box register comprise a lower byte register and an upper byte register, and said second interrupt line activating means activates said second interrupt line when the upper byte register of one of said at least one first mail box register is written to.

6. The shared resource electronic device as recited in claim 5, wherein said second interrupt line activating means further comprises masking means for selectively inhibiting activation of said second interrupt line when the upper byte register of one of said at least one first mail box register is written to.

7. A shared resource electronic device having first and second ports for communicating respectively with first and second resource sharing electronic devices, comprising:
- at least one mail box register which can be written to only through said first port, and read from at least through said second port; and
- a status register having at least one bit indicative of a written to status of said at least one mail box register, and readable through said second port.

8. The shared resource electronic device as recited in claim 7, further comprising means for activating an interrupt line of said second port when one of said at least one mail box register is written to.

9. The shared resource electronic device as recited in claim 8, wherein said interrupt line activating means further comprises masking means for selectively inhibiting activation of said interrupt line when one of said at least one mail box register is written to.

10. The shared resource electronic device as recited in claim 9, further comprising a second status register having at least one bit indicative of a written to and masked status of said at least one mail box register, and readable through said second port.

11. The shared resource electronic device as recited in claim 7, wherein individual ones of said at least one mail box register comprise a lower byte register and an upper byte register, and said interrupt line activating means activates said interrupt line when the upper byte register of one of said at least one mail box register is written to.

12. The shared resource electronic device as recited in claim 11, wherein said interrupt line activating means further comprises masking means for selectively inhibiting activation of said interrupt line when the upper byte register of one of said at least one mail box register is written to.

13. A shared resource memory device having first and second ports for communicating respectively with first and second resource sharing electronic devices, comprising:
- a memory area accessible to said first and second ports;
- arbitration means for arbitrating access to said memory area between access requests simultaneously received through said first and second ports; and
- at least one mail box register which can be written to independent of said arbitration means through only said first port, and read from at least through said second port.

14. The shared resource memory device as recited in claim 13, further comprising a status register having at least one bit indicative of a written to status of said at least one mail box register, and readable through said second port.

15. The shared resource memory device as recited in claim 14, further comprising means for activating an interrupt line of said second port when one of said at least one mail box register is written to.

16. The shared resource memory device as recited in claim 15, wherein said interrupt line activating means further comprises masking means for selectively inhibiting activation of said interrupt line when one of said at least one mail box register is written to.

17. The shared resource memory device as recited in claim 16, wherein individual ones of said at least one mail box register comprise a lower byte register an upper byte register, and said interrupt line activating means activates said interrupt line when the upper byte register of one of said at least one mail box register is written to.

18. The shared resource memory device as recited in claim 17, wherein said interrupt line activating means further comprises masking means for selectively inhibiting activation of said interrupt line when the upper byte register of one of said at least one mail box register is written to.

19. The shared resource memory device as recited in claim 13, further comprising at least one second mail box register which can be written to independent of said arbitration means through only said second port, and read from at least through said first port.

20. The shared resource memory device as recited in claim 19, further comprising a second status register having at least one bit indicative of a written to status of said at least one second mail box register, and readable through said first port.

* * * * *